(12) United States Patent
Omura et al.

(10) Patent No.: US 6,195,213 B1
(45) Date of Patent: Feb. 27, 2001

(54) PROJECTION EXPOSURE APPARATUS AND METHOD

(75) Inventors: Yasuhiro Omura, Chuo-ku; Tetsuo Takahashi, Yokohama; Masatoshi Ikeda, Tokyo; Shiwen Li, Kawasaki; Yutaka Ichihara, Yokohama, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/328,198

(22) Filed: Jun. 8, 1999

(30) Foreign Application Priority Data

| Jun. 8, 1998 | (JP) | 10-159102 |
| Jun. 12, 1998 | (JP) | 10-181497 |
| Jun. 17, 1998 | (JP) | 10-186833 |
| Oct. 30, 1998 | (JP) | 10-309677 |
| Dec. 24, 1998 | (JP) | 10-366265 |

(51) Int. Cl.[7] .................. G02B 17/00; G03B 27/42
(52) U.S. Cl. ........................... 359/727; 355/53
(58) Field of Search .................. 355/53–56, 364, 355/663, 726–728, 738, 827

(56) References Cited

U.S. PATENT DOCUMENTS

| 4,711,567 | 12/1987 | Tanimoto | 355/53 |
| 4,747,678 | 5/1988 | Shafer et al. | 350/505 |
| 4,779,966 | 10/1988 | Friedman | 350/442 |
| 5,052,763 | 10/1991 | Singh et al. | 359/355 |
| 5,537,260 | 7/1996 | Williamson | 359/727 |
| 5,636,066 | 6/1997 | Takahashi | 359/726 |
| 5,638,223 | 6/1997 | Ikeda | 359/827 |
| 5,689,377 | 11/1997 | Takahashi | 359/727 |
| 5,691,802 | 11/1997 | Takahashi | 355/53 |
| 5,805,334 | 9/1998 | Takahashi | 359/364 |
| 5,808,805 | 9/1998 | Takahashi | 359/651 |
| 5,835,284 | 11/1998 | Takahashi et al. | 359/726 |
| 5,969,882 | * 10/1999 | Takahashi | 359/728 |

FOREIGN PATENT DOCUMENTS

| 0816892A2 | 1/1998 | (EP) | G02B/17/08 |
| 06-349698 | 12/1994 | (JP) | 21/27 |
| 09-311277 | 12/1997 | (JP) | G02B/17/08 |
| 10-010420 | 1/1998 | (JP) | G02B/17/08 |
| 10-010430 | 1/1998 | (JP) | G02B/17/08 |
| 10-010431 | 1/1998 | (JP) | G02B/17/08 |
| 10-054932 | 2/1998 | (JP) | 7/2 |
| 10-133105 | 5/1998 | (JP) | 13/24 |

* cited by examiner

Primary Examiner—Georgia Epps
Assistant Examiner—David N. Spector
(74) Attorney, Agent, or Firm—Oliff & Berridge, PLC

(57) ABSTRACT

The present invention relates to a projection exposure apparatus (10) for and method of imaging a reticle (R) having patterned surface onto a substrate (W) in photolithographic processes for manufacturing a variety of devices. The invention further relates to an optical system (C) having a folding member (M1) suited to the projection exposure apparatus, and a method for manufacturing the optical system. The projection exposure apparatus comprises an illumination optical system (IS) and a reticle stage (RS) capable of holding the reticle so the normal line to its patterned surface is in the direction of gravity. The apparatus also includes a substrate stage (WS) capable of holding the substrate with its surface normal parallel to the direction of gravity. The optical system includes a first imaging optical system (A) comprising a concave reflecting mirror and a dioptric optical member arranged along a first optical axis. The first imaging optical system (A) forms an intermediate image of the patterned surface. The optical system also includes a second imaging optical system (B) having a second optical axis, and forms a reduced image of the intermediate image on the substrate. The first folding member is arranged in the optical path from the first imaging optical system to the second imaging optical system. The first and second imaging optical systems and the first and second folding members are positioned so that a reduced image of the pattered surface is formed parallel to the pattern surface of the reticle, and the first and second optical axes are positioned so that they are substantially parallel to the direction of gravity.

42 Claims, 19 Drawing Sheets

- - - - - 193.3nm+1pm
——————— 193.3nm
———  —  — 193.3nm-1pm

PROJECTION EXPOSURE APPARATUS AND METHOD

FIELD OF THE INVENTION

The present invention relates to a projection exposure apparatus and method used when transferring a projection master plate (mask, reticle and the like) onto a substrate in photolithographic processes for manufacturing devices like semiconductor devices, image pickup devices, liquid crystal display devices and thin film magnetic heads, and further relates to an optical system having a folding member suited to the projection exposure apparatus, and a method for manufacturing the optical system.

BACKGROUND OF THE INVENTION

In photolithographic processes for manufacturing semiconductor devices and the like, a projection exposure apparatus is used that exposes the pattern image of a photomask or reticle (hereinafter, collectively referred to as "reticle") as the projection master plate onto a substrate (wafer or glass plate and the like) coated with a photosensitive material like photoresist via a projection optical system.

With the increase in the level of integration of semiconductor devices and the like in recent years, the resolving power required by projection optical systems used in projection exposure apparatuses has been rapidly increasing. To meet this requirement, it has become necessary to shorten the wavelength of the exposure light and to increase the numerical aperture (NA) of the projection optical system. However, if the wavelength of the illumination light is shortened, particularly below 300 nm, the number of types of glass materials that can be used for practical purposes is limited to a few due to the absorption of light. Accordingly, the correction of chromatic aberration becomes problematic if the projection optical system is constructed with just dioptric optical elements. In addition, a dioptric optical system requires numerous lenses to correct the Petzval sum.

In contrast, a catoptric system not only has no chromatic aberration, but can also easily correct the Petzval sum by the use of a concave reflecting mirror. Accordingly, the construction of projection optical systems with so-called catadioptric optical systems that combine a catoptric system with a dioptric system has heretofore been proposed. Such catadioptric optical systems have been proposed in, for example, U.S. Pat. No. 5,537,260, U.S. Pat. No. 4,747,678, U.S. Pat. No. 5,052,763 and U.S. Pat. No. 4,779,966.

An increase in the NA and exposure region of projection optical systems has been demanded in recent years, and the aperture diameter of the optical members that constitute catadioptric optical systems has likewise increased. In light of the resolution required by projection exposure apparatuses, the effect of deformation of large optical members due to gravity cannot be ignored. A catadioptric optical system may be constructed with optical members in which the direction of the optical axes is not identical, as is typical of the prior art. One or more such optical members having power tend to be deformed asymmetrically with respect to the optical axis. This gives rise to asymmetric aberrations, which are difficult to correct during manufacturing, making it difficult to obtain sufficient resolution.

When correcting chromatic aberration in a conventional catadioptric optical system, high-order chromatic aberrations like transverse chromatic aberration, cannot be sufficiently corrected with just a concave reflecting mirror and quartz glass, and the image size cannot be increased. Consequently, attempts are being made to realize satisfactory correction of chromatic aberration over the entire exposure region by forming a number of lenses with fluorite. Nevertheless, since the volume and refractive index of lenses made of fluorite change much more than quartz glass and other optical glasses when environmental factors, like temperature, change, the optical performance of conventional optical systems deteriorates greatly when the environmental conditions fluctuate.

Catadioptric optical systems and catoptric optical systems typically require the use of a folding member to separate the optical path of the going path toward the concave mirror from the optical path of the returning path from the concave mirror. As a result, a plurality of partial optical systems having mutually different optical axes becomes necessary, and it follows that a plurality of lens barrels having different axes becomes necessary. Consequently, there is the problem that, compared with dioptric optical systems, errors are easily generated in the adjustment between the plurality of optical axes when assembling catadioptric optical systems and catoptric optical systems. In addition, even after assembly, the stability is poor due to the complex construction, and the positional relationships between optical axes gradually deviate, creating a tendency for the image to deteriorate. In addition, the folding member has an incident optical axis and an exit optical axis, which are not formed symmetrically. For this reason, rotating the folding member about the incident optical axis or about the exit optical axis due to, for example, factors like vibration, causes rotation of the image. In addition, rotating the folding member about the axis orthogonal to both the incident optical axis and the exit optical axis causes distortion of the image, making it difficult to stably obtain an image of high resolution.

Furthermore, optical adjustment of a dioptric optical system is disclosed in U.S. Pat. No. 4,711,567 and Japanese Pat. Application Kokai No. Hei 10-54932, and optical adjustment of a catadioptric optical system is disclosed in U.S. Pat. No. 5,638,223.

SUMMARY OF THE INVENTION

The present invention relates to a projection exposure apparatus and method used when transferring a projection master plate (mask, reticle and the like) onto a substrate in photolithographic processes for manufacturing devices like semiconductor devices, image pickup devices, liquid crystal display devices and thin film magnetic heads, and further relates to an optical system having a folding member suited to the projection exposure apparatus, and a method for manufacturing the optical system.

Accordingly, the first goal of the present invention is to provide a large numerical aperture in the ultraviolet wavelength region, and to achieve high resolution without any substantial impact of gravity and the like.

The second goal of the present invention is to achieve a large numerical aperture in the ultraviolet wavelength region and a large exposure region, and to achieve an optical system of a practical size, satisfactorily corrected for chromatic aberration over the entire exposure region, having stable optical performance even during environmental fluctuations, and having a high resolution.

The third goal of the present invention is to make the optical adjustment of an optical system having a plurality of optical axes easy.

The fourth goal of the present invention is to reduce deterioration in imaging performance even after an optical system having a plurality of optical axes is assembled.

The fifth goal of the present invention is to perform with high precision optical adjustment of an optical system having a folding member.

Accordingly, a first aspect of the invention is a projection exposure apparatus for exposing a mask having a patterned surface onto a substrate having a photosensitive surface. The apparatus comprises an illumination optical system, and a reticle stage capable of holding the reticle so that the normal line of the patterned surface is substantially in the direction of gravity. The apparatus further includes a substrate stage capable of holding the substrate so that the normal line of the photosensitive surface of the substrate is substantially in the direction of gravity. The apparatus further includes, between the reticle and substrate stages, a projection optical system comprising first and second imaging optical systems. The first imaging optical system comprises a concave reflecting mirror and a dioptric optical member arranged along a first optical axis, and is designed to form an intermediate image of the patterned surface. The second imaging optical system has a second optical axis and forms a reduced image of the intermediate image onto the photosensitive surface. A first folding member is arranged in the optical path from the first imaging optical system to the second imaging optical system, and is provided with a reflecting surface having a reflective region that is substantially planar. Also, a second folding member is arranged between the first folding member and the second imaging optical system, and is provided with a reflecting surface having a reflecting region that is substantially planar. The first and second imaging optical systems and the first and second folding members are positioned so that a reduced image of the patterned surface is formed parallel to the patterned surface of the reticle, and the first and second optical axes are positioned so that they are substantially parallel to the direction of gravity.

A second aspect of the invention is a method for exposing a pattern on a reticle onto a substrate. The method comprises the steps of first illuminating the reticle, then projecting an image of the reticle with the projection exposure apparatus as described immediately above, and then exposing the pattern over an exposure region having either a slit-shape and arcuate shape, wherein the exposure region does not include the optical axis of the second imaging optical system in the image plane. In the exposure process, it is preferable to simultaneously scan the reticle stage and the substrate stage.

A third aspect of the invention is a projection exposure apparatus for forming an image of a first surface onto a second surface. The apparatus comprises a projection optical system having a lens, a concave mirror, a folding member and two or more optical axes. An optical member is arranged along each of the two or more optical axes, each optical member being held by a barrel provided along each of the two or more optical axes. Each of the barrels includes one or more lens barrel units each having one or more lens assemblies (or alternatively, lens elements) designed so as to be inclinable and translatable with respect to the optical axis. Also, at least one of the barrels is provided with at least one adjustment apparatus capable of inclining and translating the at least one barrel with respect to the optical axis passing therethrough.

BRIEF DESCRIPTION OF THE DRAWING

FIGS. 4a–4f are aberration plots of the catadioptic optical system of FIG. 2, wherein FIG. 4a is a lateral aberration plot in the meridional direction at an image height Y of 17.1 mm, FIG. 4b is a lateral aberration plot in the meridional direction at an image height Y of 11 mm, FIG. 4c is a lateral aberration plot in the meridional direction at an image height Y of 5 mm, FIG. 4d is a lateral aberration plot in the sagittal direction at an image height Y of 17.1 mm, FIG. 4e is a lateral aberration plot in the sagittal direction at an image height Y of 11 mm, and FIG. 4f is a lateral aberration plot in the sagittal direction at an image height Y of 5 mm;

FIGS. 7a–7f are aberration plots of the catadioptric optical system of FIG. 5, wherein FIG. 7a is a lateral aberration plot in the meridional direction at an image height Y of 17.1 mm, FIG. 7b is a lateral aberration plot in the meridional direction at an image height Y of 11 mm, FIG. 7c is a lateral aberration plot in the meridional direction at an image height Y of 5 mm, FIG. 7d is a lateral aberration plot in the sagittal direction at an image height Y of 17.1 mm, FIG. 7e is a lateral aberration plot in the sagittal direction at an image height Y of 11 mm, and FIG. 7f is a lateral aberration plot in the sagittal direction at an image height Y of 5 mm;

FIGS. 9a–9c show the first to third barrels, respectively, according to the third mode for carrying out the present invention, wherein FIG. 9a is an oblique view of the second barrel, FIG. 9b is an oblique view of the first barrel, and FIG. 9c is an oblique view of the third barrel;

FIGS. 12a, 12b show the projection optical system and the support structure thereof according to a fourth mode for carrying out the present invention, wherein FIG. 12a is an XY plan view, and FIG. 12b is a longitudinal cross-sectional view (YZ cross-sectional view);

FIG. 15b is a plan view (cross-sectional view taken in the direction of the arrows along the line 15b–15b in FIG. 15a) of the exposure region of the projection optical system of FIG. 15a;

FIG. 16b is a plan view (cross-sectional view taken in the direction of the arrows along the line 16b–16b in FIG. 16a) of the exposure region of the projection optical system of FIG. 16a;

FIG. 18b is a view that shows the internal construction of the interferometer 121 of FIG. 18a;

DETAILED DESCRIPTION OF THE INVENTION

The present invention relates to a projection exposure apparatus and method used when transferring a projection master plate (mask, reticle and the like) onto a substrate in photolithographic processes for manufacturing devices like semiconductor devices, image pickup devices, liquid crystal display devices and thin film magnetic heads, and further relates to an optical system having a folding member suited to the projection exposure apparatus, and a method for manufacturing optical system.

Figure 1A:
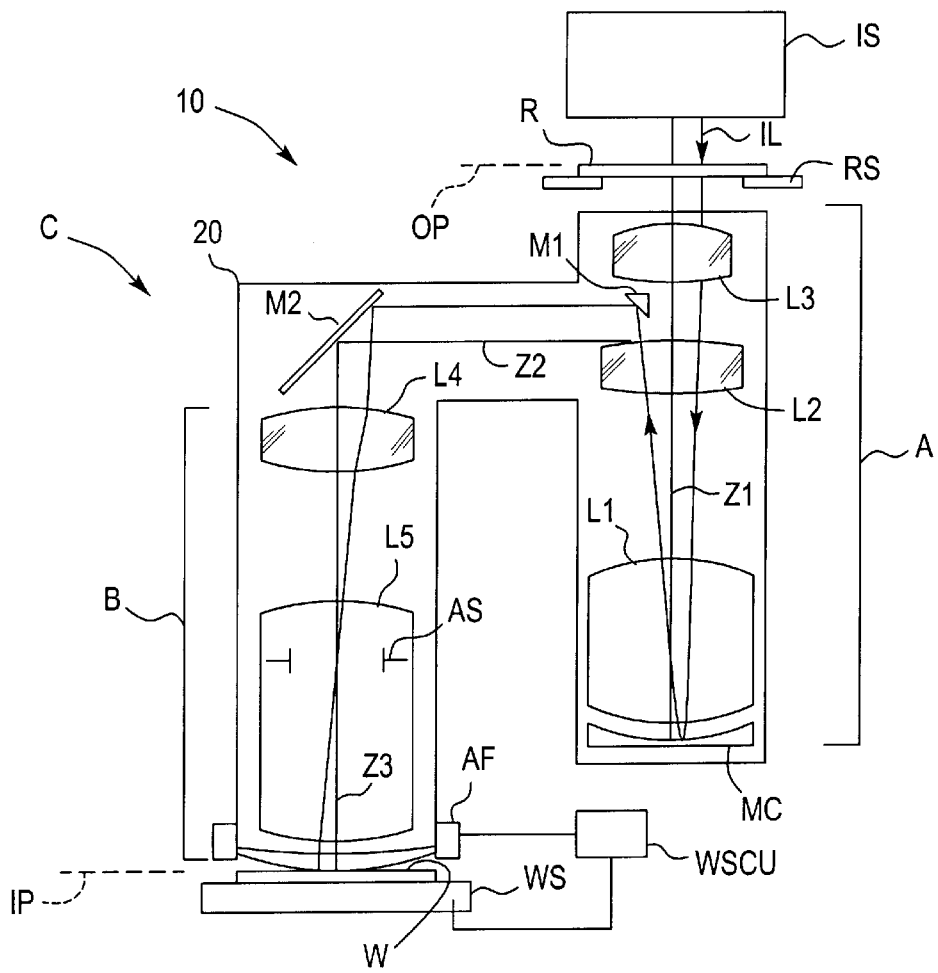
FIG. 1a is a schematic diagram of the projection exposure apparatus according to the present invention.

The following explains the projection exposure apparatus provided with a catadioptric optical system according to the present invention, based on the drawings. FIG. 1a is a schematic of the projection exposure apparatus 10 according to the first and second modes for carrying out the present invention. An XYZ coordinate system is employed, as shown.

In apparatus 10, reticle R, as the projection master plate whereon a predetermined circuit pattern is formed, is arranged in an object plane OP of a catadioptric optical system C. A wafer W (substrate), serving as a workpiece having a coating of a photosensitive material like photoresist, is arranged in an image plane IP of catadioptric optical system C. Reticle R is held by a reticle stage RS so that the normal line of the patterned surface is in the direction of gravity (the Z direction in FIG. 1a). Wafer W is held by a wafer stage WS so that the normal line of that surface is substantially parallel to the direction of gravity (Z direction). Reticle stage RS is constructed so that it is moveable along the ±Y direction for the purpose of scanning and exposure. In addition, wafer stage WS is constructed so that it is moveable in the XY plane, and so that the position in the Z direction and the tilt in the Z direction of wafer W are adjustable.

An illumination optical apparatus IS is arranged above reticle R (on the –Z direction side) to evenly illuminate a slit-shaped (rectangular or oblong) illumination region on reticle R. In the present example, the length direction of the slit-shaped illumination region is set to the X direction in the Figure. Furthermore, instead of a slit-shaped illumination region, an annular illumination region may also be used.

Catadioptric optical system C further includes first and second imaging optical systems A and B, respectively, and an aperture stop AS with a variable aperture diameter, located at the pupil position thereof. System C is substantially telecentric on the reticle R side and the wafer W side. Furthermore, a pupil filter such as disclosed in, for example, Japanese Patent Application Kokal No. Hei 6-349698 and the like, may also be arranged at the position of aperture stop AS.

Illumination optical apparatus IS comprises an exposure light source (not shown) comprising an ArF excimer laser light source, an optical integrator (not shown) to make the illumination intensity distribution of the exposure light having a wavelength of 193.3 nm from this light source uniform, an illumination system aperture stop, a variable field stop (reticle blind) (not shown) and a condenser lens system (not shown), and the like. Furthermore, a 248 nm wavelength KrF excimer laser light, a 157 nm wavelength $F_2$ laser light, the higher harmonics of a YAG laser, or a mercury lamp that supplies ultraviolet light below 300 nm may also be used as the exposure light source.

With continuing reference to FIG. 1a, illumination light IL is supplied by illumination optical apparatus IS and proceeds along the +Z direction, and illuminates reticle R. The light from reticle R enters catadioptric-type first imaging optical system A wherein a concave reflecting mirror MC and a plurality of dioptric optical members (lenses) L1–L3 are arranged along optical axis Z1. System A forms an intermediate image (not shown) of the pattern on the exposure region on reticle R on the exit side of first imaging optical system A. The light emerging from first imaging optical system A travels substantially along the –Z direction, is reflected by a plane mirror M1 as a first folding member, and proceeds to a plane mirror M2 as a second folding member substantially along the +Y direction (along optical axis Z2) after the direction of travel thereof is folded substantially by 90°. The light reflected by mirror M2 travels substantially along the +Z direction after the direction of travel thereof is folded substantially by 90°, and then enters dioptric-type second imaging optical system B comprising dioptric optical members L4 and L5 arranged along optical axis Z3 parallel to optical axis Z1. The image of the light source of illumination optical apparatus IS is formed at the pupil position (position of aperture stop AS) of catadioptric optical system C. In other words, reticle R is Köhler illuminated. Then, the image of the pattern of Köhler illuminated reticle R is reduced via catadioptric optical system C by projection magnification β (|β| is ¼ in the present example, but may be another projection magnification like ⅕, ⅙ and the like), and is formed in image plane (second surface) IP of catadioptric optical system C.

Figure 1B:
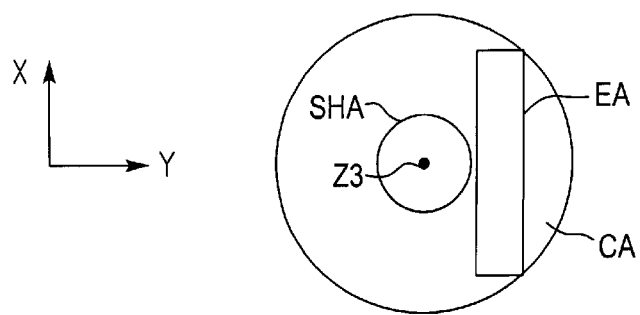
FIG. 1b is a plan view showing the exposure region EA on wafer W for the apparatus of FIG. 1.

FIG. 1b shows the exposure region EA in image plane IP. Catadioptric optical system C in the present example is aberration-corrected in circular region CA having a radius of 17.1 mm about optical axis Z3. Slit-shape exposure region EA is 25×6 mm and is set in aberration corrected region CA and outside of shaded region SHA having a radius of 5 mm about optical axis Z3. Accordingly, exposure region EA can be set substantially freely, and may be set, for example, to an arcuate exposure region having the shape of one part of a ring.

Returning to FIG. 1a, an autofocus/leveling sensor AF for detecting the position in the Z direction of exposure region EA on wafer W and the inclination with respect to the Z direction is provided in front of lens barrel 20 of catadioptric optical system C. A wafer stage control unit (WSCU) in electrical communication with sensor AF and wafer stage WS controls the drive of the wafer stage based on the output from sensor AF. This allows the exposure region EA on wafer W to substantially coincide with image plane IP of catadioptric optical system C.

Before the actual exposure operation, reticle stage RS positions reticle R in the X direction, Y direction and rotational direction, and wafer stage WS aligns the surface of wafer W with image plane IP of catadioptric optical system C and positions wafer W in the X direction and Y direction. Subsequently, the illumination region on reticle R is illuminated by illumination optical apparatus IS while reticle R and wafer W are synchronously scanned along the Y direction with a speed ratio corresponding to projection magnification β of the catadioptric optical system. After exposure of the pattern image of reticle R onto one exposure region on wafer W is finished, the next exposure region on wafer W is scanned and exposed by stepping wafer stage WS. These operations are repeated by the step-and-scan system. Since this type of step-and-scan system should obtain satisfactory imaging performance in the slit-shaped exposure region, a larger shot region on wafer W can be obtained without increasing the size of catadioptric optical system C.

In the present example, as shown in FIG. 1a, each of the optical members (lenses L1–L3 and concave reflecting mirror MC) that constitute first imaging optical system A are arrayed along optical axis Z1 parallel to the direction of gravity. Each of the optical members (lenses L4 and L5 and aperture stop AS) that constitute second imaging optical system B are arrayed long optical axis Z3 parallel to the direction of gravity. Lenses are not provided along optical axis Z2 in the direction that traverses the direction of gravity. Consequently, the generation of asymmetric aberrations due to the effect of gravity on these optical members can be controlled. Furthermore, the lens barrel of a conventional right cylinder-type catadioptric optical system, which is a field-proven support technology, can be applied as is to the optical members in first imaging optical system A and second imaging optical system B. Accordingly, there are advantages in that the manufacture of catadioptric optical system C is easy and the performance stability after installation of the apparatus can be improved. Furthermore, in the present invention, the substantial coincidence of the normal lines of the reticle R surface and wafer W surface with the direction of gravity includes the state wherein the normal lines are inclined by a minute amount to adjust the reticle surface or wafer surface.

In the above mode for carrying out the present invention, the NA of the light beam passing through first imaging optical system A, which is a catadioptric optical system, is smaller than that in second imaging optical system B, which is a dioptric optical system. Accordingly, separation of the optical paths in first imaging optical system A is easy, and the NA can be made larger than the case wherein the second imaging optical system is made a catadioptric optical system. In addition, a light beam of a small NA passes through first imaging optical system A. Accordingly, the aperture diameter of concave reflecting mirror MC can be reduced.

In projection exposure apparatus 10 of the present mode for carrying out the present invention, one intermediate image is formed in the optical system, and first folding member M1 is arranged in the vicinity of this intermediate image. Since the diameter of the light beam is reduced in the vicinity of the intermediate image, separation of the optical paths by first folding member M1 can be realized easily. Only one intermediate image is formed in the optical system of the present mode for carrying out the present invention. Thus, the total length of the optical system can be shortened, as compared to the case wherein a plurality of intermediate images is formed.

Also, only one concave mirror, and not a plurality thereof, is used in projection exposure apparatus 10. This has the advantage that the optical paths can be separated even if exposure region EA is not very remote from the optical axis, thus not causing an increase in the size of the optical system.

Reticle R may be illuminated so that projection optical system (catadioptric optical system) C can form a slit-shaped or arcuate exposure region EA that does not include the optical axis of the second imaging optical system in the image plane. If reticle stage RS and wafer stage WS are scanned, then first folding member M1 that folds the light passing through first imaging optical system A toward the second imaging optical system B can be easily arranged at a position that does not interfere with the light beam proceeding from the reticle to the concave mirror. Thus, the use of a beam splitter having a transmitting-reflecting surface for optical path separation becomes unnecessary. Consequently, the generation of stray light caused by flare and illumination unevenness can be reduced, and the risk of causing deterioration in image quality is extremely small.

Figure 2:
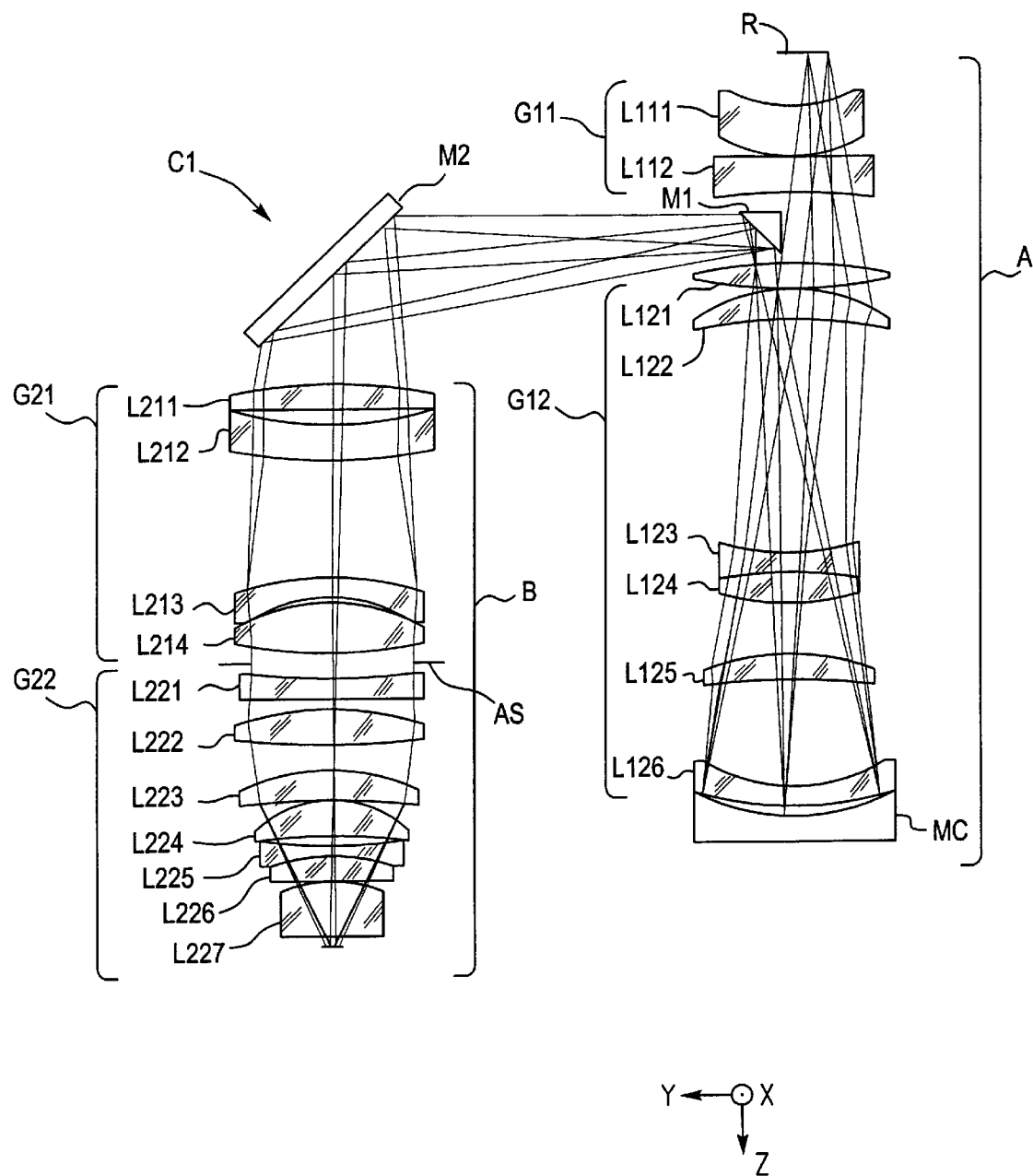
FIG. 2 is an optical path diagram of the catadioptric optical system according to a first mode for carrying out the present invention.
Figure 5:
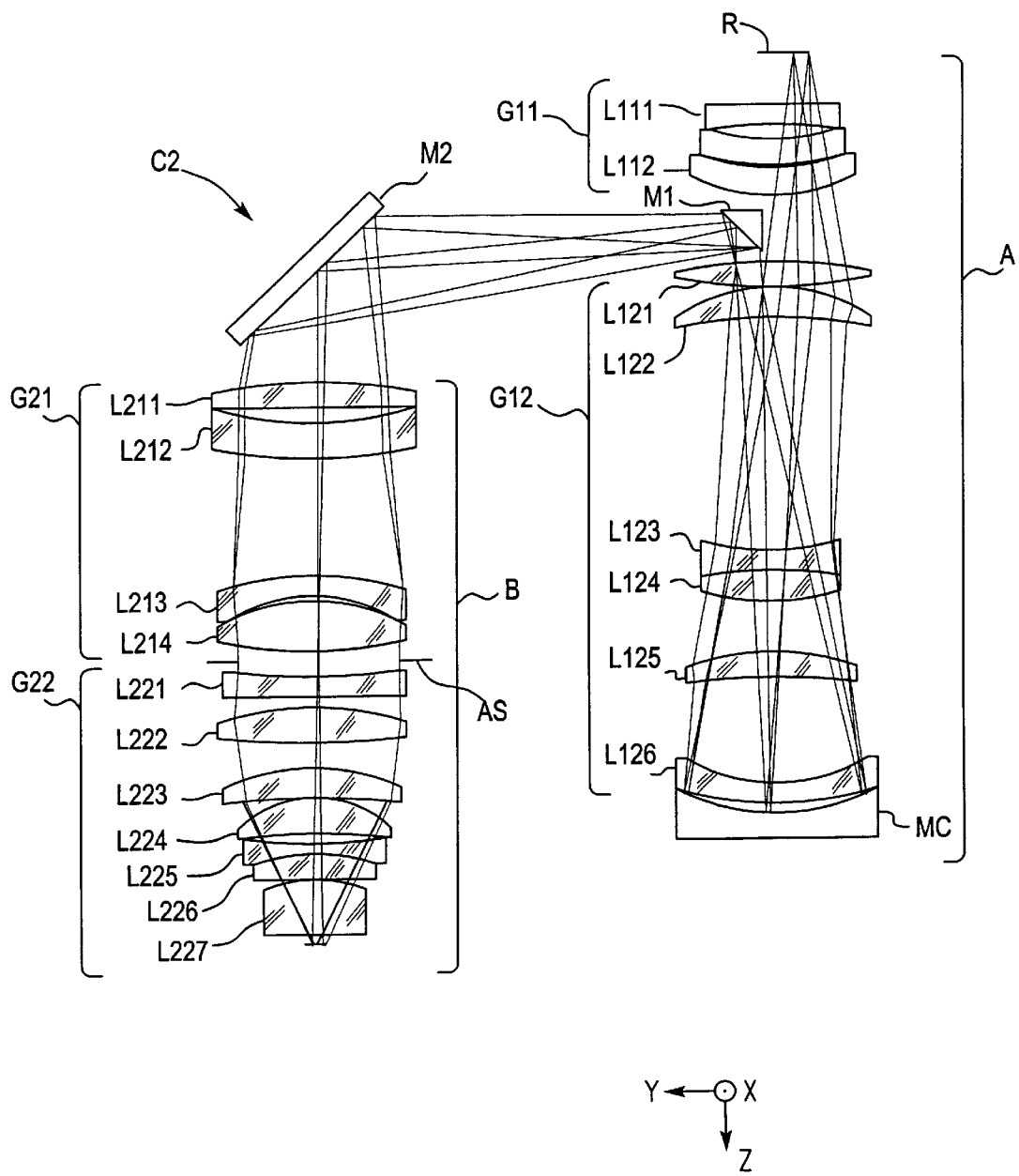
FIG. 5 is an optical path diagram of the catadioptric optical system according to a second mode for carrying out the present invention.

Next, a mode for carrying out the present invention will be explained using numerical values. FIG. 2 and FIG. 5 show optical path diagrams of the catadioptric optical system according to the first and second modes for carrying out the present invention, respectively. In FIG. 2 and FIG. 5, an XYZ coordinate system, the same as that in FIG. 1a, is employed.

With reference now to FIGS. 2 and 5, a catadioptric optical systems C1 and C2 according to first and second modes for carrying out the present invention is one now set forth. System C1 comprises catadioptric-type first imaging optical system A, dioptric-type second imaging optical system B, and plane mirror M1 as the first folding member and plane mirror M2 as the second folding member arranged between the first and second imaging optical systems.

In FIG. 2 and FIG. 5, first imaging optical system A according to the first and second modes for carrying out the present invention comprises 1-1th lens group G11, 1-2th lens group G12 and concave reflecting mirror MC. Lens groups G11, G12 and concave reflecting mirror MC are arranged coaxially so that the light from the first surface (reticle R) sequentially passes through lens group G11, lens group G12 and then reaches concave reflecting mirror MC. The light reflected by concave reflecting mirror MC emerges from lens group G12. First imaging optical system A forms an intermediate image of reticle R at a position separated from the optical axis in the optical path between lens group G11 and lens group G12. First imaging optical system A according to the first and second modes for carrying out the present invention has slight reduction magnification.

Second imaging optical system B according to the first and second modes for carrying out the present invention comprises a lens group G21 having positive refractive power, aperture stop AS and 2-2th lens group G22 having a positive refractive power. Lens groups G21, G22 and aperture stop AS are arranged coaxially so that the light from the intermediate image passing from plane mirrors M1, M2 sequentially passes through lens group G21, aperture stop AS and lens group G22.

First imaging optical system A is in the optical path between reticle R and concave reflecting mirror MC. The pupil plane thereof is at a position remote from concave reflecting mirror MC. The light source image formed by illumination optical system IS is relayed to the pupil plane of first imaging optical system A. However, if a light source having a high output like a laser light source, for example, is used, a concentration of energy will occur at the position of the light source image. If the pupil plane thereof coincides with the reflecting surface of concave reflecting mirror MC, there is a risk that the reflective film on the reflecting surface will be damaged. Nevertheless, since the light source image is formed at a position remote from the reflecting surface of concave reflecting mirror MC, it does not cause damage to the reflective film. The position of the pupil plane is positioned in the optical path between the reticle and the concave reflecting mirror. Thus, the exit pupil of first imaging optical system A can be set on the second imaging optical system B side of the intermediate image. Thereby, it becomes unnecessary to make second imaging optical system B telecentric on the intermediate image side. In this case, system C1, which has no lens equivalent to a field lens between the first and second folding members M1 and M2, has the advantage that the aperture diameter of second imaging optical system B can be reduced.

In the first mode for carrying out the present invention shown in FIG. 2, lens group G11 in first imaging optical system A comprises two negative meniscus lenses L111, L112 whose concave surfaces face the reticle R side. These two lenses L111, L112 are both formed of synthetic quartz.

Lens group G12 in first imaging optical system A comprises, in order from the reticle R side, a biconvex positive lens L121, a positive meniscus lens L122 whose convex surface faces the reticle R side, a biconcave negative lens L123, a biconvex positive lens L124, a positive meniscus lens L125 whose convex surface faces the reticle R side, and a negative meniscus lens L126 whose concave surface faces the reticle R side. Furthermore, biconvex positive lens L124 is formed of fluorite, and the other lenses L121 to L123, L125 to L126 in lens group G12 are formed of synthetic quartz.

The reflecting surface of plane mirror M1 has an oblong-shaped effective region, and is planar over the entire effective region. Furthermore, this reflecting surface is provided between lens group G11 and lens group G12 so that the lengthwise direction of the effective region is in the X direction and the widthwise direction is inclined by 45° with respect to the Z direction.

The reflecting surface of plane mirror M2 as the second folding member has an approximately elliptical-shaped effective region, and is planar over the entire effective region. Furthermore, the reflecting surface of plane mirror M2 is provided so that the minor axis of the elliptical-shaped effective region is in the X direction, and the major axis of the elliptical-shaped effective region is inclined by 45° with respect to the Z direction. In other words, in the present example, the reflecting surface of plane mirror M1 and the reflecting surface of plane mirror M2 are arranged so that they are mutually orthogonal.

Lens group G21 in second imaging optical system B comprises, in order from the plane mirror M2 side (light entrance side), a biconvex positive lens L211, a negative meniscus lens L212 whose convex surface faces the wafer W side, a negative meniscus lens L213 whose concave surface faces the wafer W side, and a biconvex positive lens L214. Furthermore, the concave surface on the wafer W side of negative meniscus lens L213 is aspherical. Biconvex positive lens L214 is formed of fluorite, and the other lenses L211 to L213 in lens group G21 are formed of synthetic quartz.

Lens group G22 in second imaging optical system B comprises, in order from the group G21 side (light entrance side), a biconcave negative lens L221, a biconvex positive lens L222, two positive meniscus lenses L223, L224 whose concave surfaces face the wafer W side, a biconcave negative lens L225, and two biconvex positive lenses L226, L227. Furthermore, the concave surface (*) on the wafer W side of biconcave negative lens L225 is aspherical. In addition, all lenses L221 to L227 that constitute lens group G22 are formed of synthetic quartz.

In the second mode for carrying out the present invention shown in FIG. 5, system C2 includes lens group G11 in first imaging optical system A, which comprises, in order from the reticle R side, a planoconvex negative lens L111 whose planar surface faces the reticle R side, a negative meniscus lens L112 whose concave surface faces the reticle R side, and a positive meniscus lens L113 whose concave surface faces the reticle R side. All lenses L111 to L113 that constitute lens group G11 are formed of synthetic quartz.

Lens group G12 in first imaging optical system A comprises, in order from the reticle R side, a biconvex positive lens L121, a positive meniscus lens L122 whose convex surface faces the reticle R side, a biconcave negative lens L123, a biconvex positive lens L124, a positive meniscus lens L125 whose convex surface faces the reticle R side, and a negative meniscus lens L126 whose concave surface faces the reticle R side. In lens group G12, biconvex positive lens L124 is formed of fluorite, and the other lenses L121 to L123, and L125 to L126 are formed of synthetic quartz.

The reflecting surface of plane mirror M1 as the first folding member has an oblong-shaped effective region, and is planar over the entire effective region. This reflecting surface is provided between lens group G11 and lens group G12 so that the lengthwise direction of the effective region is in the X direction and the widthwise direction is inclined by 45° with respect to the Z direction.

The reflecting surface of plane mirror M2 as the second folding member has an approximately elliptical-shaped effective region, and is planar over the entire effective region. The reflecting surface of plane mirror M2 is provided so that the minor axis of the elliptical-shaped effective region is in the X direction, and the major axis of the elliptical-shaped effective region is inclined by 45° with respect to the Z direction. In other words, in the present example as well, the reflecting surface of plane mirror M1 and the reflecting surface of plane mirror M2 are arranged so that they are mutually orthogonal.

Lens group G21 in second imaging optical system B comprises, in order from the plane mirror M2 side (light entrance side), a biconvex positive lens L211, a negative meniscus lens L212 whose convex surface faces the wafer W side, a negative meniscus lens L213 whose convex surface faces the wafer W side, and a biconvex positive lens L214. In lens group (G21, biconvex positive lens L214 is formed of fluorite, and the other lenses L211 to L213 are formed of synthetic quartz. In addition, the concave surface (*) on the wafer W side of the negative meniscus lens L213 is aspherical.

Lens group G22 in second imaging optical system B comprises, in order from the lens group G21 side (light entrance side), a negative meniscus lens L221 whose convex surface faces the wafer W side, a positive meniscus lens L222 whose convex surface faces the wafer W side, a biconvex positive lens L223, a positive meniscus lens L224 whose convex surface faces the wafer W side, a biconcave negative lens L225, a positive meniscus lens L226 whose convex surface faces the wafer W side, and a biconvex positive lens L227. Furthermore, the concave surface on the wafer W side of biconcave negative lens L225 is aspherical surface. In addition, all lenses L221 to L227 that constitute lens group G22 are formed of synthetic quartz.

As described in the above first and second modes for carrying out the present invention, by providing second imaging optical system B with lens group G21 having a positive refractive power, aperture stop AS arranged between lens group G21 and the reduced image, and lens group G22 arranged between aperture stop AS and the reduced image, and by providing at least one aspherical surface each in lens group G21 and lens group G22, spherical aberration and coma can be satisfactorily corrected with good balance, and optical performance can be improved. Alternatively, for substantially the same optical performance, a large exposure region can be achieved without the attendant increase in the size of the optical system. Furthermore, by making the aperture diameter of aperture stop AS variable, it can be adjusted to the optimal resolving power and depth of focus for the particular exposure pattern.

First imaging optical system A in the first and second modes for carrying out the present invention (i.e., systems C1 and C2) forms an intermediate image in the optical path between first folding member M1 and first imaging optical system A. Thus, the optical paths can be easily separated by the first folding member.

At this point, it is preferable the present invention satisfy condition (1) below, wherein LF1 is the distance between the intermediate image plane and the effective region of the first folding member, and S1 is the area of the effective region of the first surface.

$$LF1/S1 > 0.002 \quad (1)$$

Condition (1) stipulates the appropriate position for plane mirror M1. If condition (1) is not satisfied, a deterioration in optical performance, such as illumination unevenness due to flaws in the fabrication of the reflecting surface of first folding member M1, defects in the reflective film, and dirt on the reflecting surface cannot be prevented, and a sufficient resolving power cannot be obtained over the entire exposure region. Accordingly, it is preferable to set an upper limit value to condition (1) of 4 in order to make separation of the optical paths by first folding member M1 easy. In addition, it is preferable to set the lower limit value to 0.005 in order to improve the ability to mass-produce the projection optical system.

In condition (1), distance LF1 between the intermediate image plane and first folding member M1 is the distance along a direction parallel to the optical axis between the intermediate image plane and the position closest to the intermediate image plane in the effective region of first folding member M1.

In addition, it is preferable in the first and second modes for carrying out the present invention to satisfy condition (2) below, wherein c1 is the maximum effective diameter among the effective diameters of the optical members that constitute first imaging optical system A, c2 is the maximum effective diameter among the effective diameters of the optical members that constitute second imaging optical system B, and LO2 is the distance between optical axis Z1 of the first imaging optical system and optical axis Z3 of the second imaging optical system.

$$LO2/(c1+c2) > 0.7 \quad (2)$$

Condition (2) stipulates an appropriate interaxis distance between the first and second imaging optical systems. If condition (2) is not satisfied, the spacing to stably hold the optical members that constitute these optical systems cannot be ensured, making it difficult to continuously realize sufficient optical performance of the projection optical system. To prevent increasing the size of second folding member M2, it is preferable to set an upper limit value to condition (2) of 2.5. In addition, to make adjustment of the optical system easier, it is preferable to set the lower limit value of condition (2) to 0.9.

In addition, in the catadioptric optical system according to the first and second modes for carrying out the present invention, at least one positive lens among the dioptric optical members arranged in the round-trip optical path in first imaging optical system A, namely the optical path from first surface R to concave mirror MC and the optical path from concave mirror MC to the intermediate image, is formed of fluorite. Chromatic aberration is corrected with a comparatively small number of fluorite lenses by making the chromatic aberration-correcting effect of the fluorite function in both directions of the round-trip optical path. In the first and second modes for carrying out the present invention, the pupil plane is formed at a position apart from the reflecting surface of concave reflecting mirror MC to prevent damage to the reflective film. Thus, the direction of fluctuations in optical performance of the first imaging optical system due to fluctuations in environmental factors like temperature varies with the positional relationship between the pupil plane and concave reflecting mirror MC. In other words, the state of the light beam that passes through the positive lens made of fluorite in first imaging optical system A loses symmetry between the going path (optical path from first surface R to concave reflecting mirror MC) and the returning path (optical path from concave reflecting mirror MC to the intermediate image). The direction of fluctuations in the optical performance varies depending on whether the pupil plane is positioned in the going path or returning path. Volumetric changes due to changes in the temperature of the fluorite cause expansion proportional to the change in temperature. Thus, the radius of curvature of the lens increases as the temperature rises. In addition, since changes in the refractive index due to changes in the temperature of the fluorite are inversely proportional to the change in temperature, the refractive index decreases as the temperature increases. Since both of the above cases work to lower the refractive power of the surface, the focal length of a fluorite lens increases as the temperature of the lens rises.

If the pupil plane of first imaging optical system A is positioned between first surface R and concave reflecting mirror MC, as in the first and second modes for carrying out the present invention, fluctuations in optical performance due to changes in the temperature of the positive lenses made of fluorite in first imaging optical system A have a stronger effect in the going path. Accordingly, in the first and second modes for carrying out the present invention, fluctuations in optical performance are generated in the direction the reverse of that in the first imaging optical system and the total amount of fluctuation in the optical system is reduced by arranging the positive lens made of fluorite in lens group G21 on the intermediate image side of the pupil plane of second imaging optical system B.

If the pupil plane of first imaging optical system A is arranged between concave reflecting mirror MC and the intermediate image, fluctuations in optical performance due to changes in the temperature of the positive lens made of fluorite in first imaging optical system A have a stronger effect in the returning path. In this case, by arranging the positive lens made of fluorite in lens group G22 on the secondary image side of the pupil plane of second imaging optical system B, fluctuations in optical performance in the direction the reverse of that in the first imaging optical system can be generated, and the total amount of fluctuation in the optical system can be reduced.

The abovementioned fluctuations in optical performance caused by temperature changes are fluctuations principally in the direction of the image height as represented by fluctuations in magnification, and do not include fluctuations in the direction of the optical axis as represented by fluctuations in focus. Nevertheless, since fluctuations in the direction of the optical axis can be easily corrected by autofocus mechanisms and the like, this is actually a small problem for projection exposure. Furthermore, to reduce fluctuations in both the image height direction and in the optical axis direction, we can consider the use of fluorite in the negative lens on the second surface side of the pupil plane of second imaging optical system B. However, this cannot lead to a realistic solution because the efficiency of chromatic aberration correction is poor in the initial state (i.e., the state wherein environmental optical performance fluctuations are not generated).

It is preferable in the first and second modes for carrying out the present invention that the catadioptric optical system be an optical system telecentric on the first and second surface sides.

It is also preferable that systems C1 and C2 satisfy condition (3) below, wherein LP3 is the distance between the pupil plane of first imaging optical system A and concave reflecting mirror MC, and D1 is the effective radius of concave reflecting mirror MC.

$$2.50 > LP3/D1 > 0.15 \quad (3)$$

Condition (3) stipulates an appropriate distance between the pupil plane and the concave reflecting mirror to achieve satisfactory correction of chromatic aberration while avoiding damage to the reflective film by the laser, and to make the optical axes of all optical members that constitute the catadioptric optical system mutually parallel. If LP3/D1 exceeds the upper limit in condition (3), the correction of high-order chromatic aberrations like transverse chromatic becomes difficult. In addition, if LP3/D1 falls below the lower limit in condition (3), damage to the reflective film by the laser cannot be avoided, and it is also difficult to make the optical axes of all lenses parallel.

If the pupil plane of first imaging optical system A is positioned between the first surface and the concave reflecting mirror, and at least one positive lens made of fluorite is arranged in lens group G21 on the intermediate image side of the pupil plane of second imaging optical system B, then it is preferable to satisfy condition (4) below, wherein f12 is the sum of the focal lengths of the positive lenses made of fluorite in lens group G12, and f21 is the sum of the focal lengths of the positive lenses made of fluorite in 2-1 th lens group G21.

$$2.0 > f12/f21 > 0.5 \quad (4)$$

Condition (4) stipulates an appropriate range for the focal lengths of the positive lenses made of fluorite, to reduce fluctuations in optical performance when the environment changes. If f12/f21 exceeds the upper limit or falls below the lower limit in condition (4), fluctuations in optical performance due to changes in environmental factors, particularly temperature, become excessively large, and a sufficient resolving power can no longer be continuously maintained. Furthermore, if two or more positive lenses made of fluorite are arranged in lens group G12 or lens group G21, each of the sums of the focal lengths of the positive lenses made of fluorite should be considered.

The Tables below list the values of the specifications of systems C1 and C2 of the first and second modes for carrying out the present invention. Table 1 and Table 3 include the lens data of the catadioptric optical systems according to the first and second modes for carrying out the present invention, respectively. In Table 1 and Table 3, the leftmost column (first column) S indicates the surface number of each optical surface (lens surface and reflecting surface), the next column to the right (second column) R indicates the radius of curvature of each optical surface, the next column to the right (third column) d indicates the surface spacing between each optical surface, the next column to the right (fourth column) Re indicates the effective radius of each optical surface, and the next column to the right (fifth column) "material" indicates the name of the material of which the optical member is made. In addition, in Table 1 and Table 3, d0 is the distance from the object plane (reticle surface) to the optical surface most reticle-wise, WD is the distance from the most wafer-wise optical surface to the wafer surface (image plane), β is the lateral magnification of the projection system when light enters the projection system from the reticle side, and NA is the numerical aperture on the wafer side. Furthermore, in Table 1 and Table 3, the sign of the radius of curvature and surface spacing reverses around a reflecting surface.

In addition, in Table 1 and Table 3, an asterisk (*) appended to a surface number, indicates an aspherical surface, and the radius of curvature for such aspherical surfaces indicates the vertex radius of curvature. This aspherical surface shape is represented by condition (a) below. For a tangential plane at the apex of the aspherical surface, the origin is the position that the optical axis passes through at the tangential plane, and z(y) is based on the vertex of the aspherical surface, the displacement in the direction of the optical axis of the aspherical surface at the position of height y in the tangential plane when the direction of travel of the ray is positive.

$$x(y) = \frac{\frac{y^2}{r}}{1 + \sqrt{1 - (1+\kappa)\frac{y^2}{r^2}}} + Ay^4 + By^6 + Cy^8 + Dy^{10} + Ey^{12} + Fy^{14}$$

In formula (a), r is the vertex radius of curvature, κ is the conical coefficient, and A, B, C, D, E, F are the aspherical surface coefficients. Table 2 and Table 4 list conical coefficient κ and aspherical coefficients A, B, C, D, E, F as the aspherical surface data in the first and second modes for carrying out the present invention.

Furthermore, in the first and second modes for carrying out the present invention, the dioptric optical members are formed of synthetic quartz ($SiO_2$) or fluorite ($CaF_2$). The refractive index n at the working reference wavelength (193.3 nm) and the inverse ν of the dispersion value at the reference wavelength ±1 pm thereof are as follows.

Synthetic quartz: n=1.56033 ν=1762 ×10²

Fluorite: n=1.50146 ν=2558×10²

The dispersion value 1/ν is represented by condition (b) below, wherein the refractive index at the working reference wavelength is n(o), the refractive index at the reference wavelength +1 pm is n(L), and the refractive index at the working wavelength −1 pm is n(S).

$$1/\nu = [n(o)-1]/[n(S)-n(L)] \quad (b)$$

In the fourth column that indicates the effective radius of each optical surface, the length of the long side and short side is indicated for plane mirror M1, which has an oblong effective region, and the length of the major axis and minor axis of the ellipse is indicated for plane mirror M2, which has an elliptical effective region.

TABLE 1

LENS DESIGN DATA, FIRST MODE
d0 = 66.2181
WD = 12.0000
|β| = ¼
NA = 0.75

| S | R | d | Re | Material | |
|---|---|---|---|---|---|
| 1 | −173.2198 | 59.9763 | 77.54 | Synthetic Quartz | L111 |
| 2 | −199.3558 | 2.4684 | 93.84 | | |
| 3 | −1413.5392 | 42.7237 | 97.79 | Synthetic Quartz | L112 |
| 4 | −60064.7315 | 87.0000 | 104.07 | | |
| 5 | 1092.1574 | 26.0439 | 124.31 | Synthetic Quartz | L121 |
| 6 | −832.9175 | 3.1990 | 125.18 | | |
| 7 | 245.6137 | 35.000 | 128.10 | Synthetic Quartz | L122 |
| 8 | 565.3602 | 304.9236 | 125.79 | | |
| 9 | −220.6579 | 20.4061 | 85.82 | Synthetic Quartz | L123 |
| 10 | 391.9184 | 5.7049 | 88.75 | | |
| 11 | 594.4147 | 29.9442 | 89.29 | Fluorite | L124 |
| 12 | −412.6301 | 72.7628 | 90.63 | | |
| 13 | 410.4514 | 26.1344 | 94.43 | Synthetic Quartz | L125 |
| 14 | 669.5983 | 138.8597 | 93.16 | | |
| 15 | −238.4760 | 25.0000 | 113.89 | Synthetic Quartz | L126 |
| 16 | −837.0357 | 16.6526 | 129.65 | | |
| 17 | −356.5760 | −16.6526 | 130.61 | Concave Reflecting mirror MC | |
| 18 | −837.0357 | −25.0000 | 129.99 | Synthetic Quartz | L126 |
| 19 | −238.4760 | −138.8597 | 118.38 | | |
| 20 | 669.5983 | −26.1344 | 110.10 | Synthetic Quartz | L125 |
| 21 | 410.4514 | −72.7628 | 110.23 | | |
| 22 | −412.6301 | −29.9442 | 95.29 | Fluorite | L124 |
| 23 | 594.4147 | −5.7049 | 93.24 | | |
| 24 | 391.9484 | −20.4061 | 92.49 | Synthetic Quartz | L123 |
| 25 | −220.6579 | −304.9236 | 86.06 | | |
| 26 | 565.3602 | −35.0000 | 94.14 | Synthetic Quartz | L122 |
| 27 | 245.6137 | −3.1990 | 95.98 | | |
| 28 | −832.9175 | −26.0439 | 92.73 | Synthetic Quartz | L121 |
| 29 | 1092.1574 | −1.0000 | 90.76 | | |
| 30 | ∞ | 530.0000 | 134 × 53 (oblong) | Plane Mirror M1 | |
| 31 | ∞ | −129.6727 | 260 × 220 (ellipse) | Plane Mirror M2 | |
| 32 | −416.5064 | −43.6858 | 130.51 | Synthetic Quartz | L211 |
| 33 | 1614.8553 | −19.8749 | 129.15 | | |
| 34 | 375.6187 | −40.1637 | 128.76 | Synthetic Quartz | L212 |
| 35 | 992.3735 | −154.0322 | 130.25 | | |
| 36 | −540.0532 | −30.6056 | 124.67 | Synthetic Quartz | L213 |
| 37* | −280.2053 | −4.7489 | 119.84 | | |
| 38 | −269.7063 | −59.8107 | 120.36 | Fluorite | L214 |
| 39 | 1000.1381 | −18.8527 | 118.99 | | |
| 40 | ∞ | −20.0376 | 114.42 (variable) | Aperture Stop AS | |
| 41 | 638.2931 | −25.0000 | 113.74 | Synthetic Quartz | L221 |
| 42 | −6260.2239 | −10.3928 | 116.87 | | |

TABLE 1-continued

LENS DESIGN DATA, FIRST MODE
d0 = 66.2181
WD = 12.0000
|β| = ¼
NA = 0.75

| S | R | d | Re | Material | |
|---|---|---|---|---|---|
| 43 | −337.6474 | −45.2717 | 122.52 | Synthetic Quartz | L222 |
| 44 | 2063.2498 | −33.0583 | 121.91 | | |
| 45 | −239.6600 | −45.1169 | 116.23 | Synthetic Quartz | L223 |
| 46 | −4631.0389 | −1.0027 | 112.20 | | |
| 47 | −167.6364 | −40.2179 | 99.72 | Synthetic Quartz | L224 |
| 48 | −1732.6245 | −6.1992 | 94.74 | | |
| 49 | 2730.6200 | −25.0000 | 92.94 | Synthetic Quartz | L225 |
| 50 | −306.7043 | −1.8667 | 75.85 | | |
| 51 | −254.0551 | −24.4188 | 74.92 | Synthetic Quartz | L226 |
| 52 | 4420.0238 | −1.2986 | 69.49 | | |
| 53 | −316.0614 | −65.0000 | 62.88 | Synthetic Quartz | L227 |
| 54 | 12272.4820 | (WD) | 30.79 | | |

TABLE 2

ASPHERICAL DATA OF THE FIRST MODE FOR CARRYING OUT THE PRESENT INVENTION

37th Surface

κ = 0.0000
A = −1.3249 × 10⁻⁰⁸
B = −1.2617 × 10⁻¹³
C = 1.4089 × 10⁻¹⁸
D = 6.4967 × 10⁻²³
E = 3.4235 × 10⁻²⁷
F = 1.5167 × 10⁻³¹

50th Surface

κ = 0.0000
A = −5.0678 × 10⁻⁰⁸
B = −3.8316 × 10⁻¹³
C = 5.6799 × 10⁻¹⁷
D = −6.9166 × 10⁻²²
E = 0.0000
F = 0.0000

TABLE 3

SECOND MODE FOR CARRYING OUT THE PRESENT INVENTION
d0 = 50.0980
WD = 12.3836
|β| = ¼
NA = 0.75

| S | R | d | Re | Material | |
|---|---|---|---|---|---|
| 1 | ∞ | 30.8769 | 77.96 | Synthetic Quartz | L1I1 |
| 2 | 1358.1393 | 25.6596 | 82.00 | | |
| 3 | −173.9366 | 29.5956 | 82.54 | Synthetic Quartz | L112 |
| 4 | −262.5027 | 3.9549 | 93.62 | | |
| 5 | −243.7585 | 32.1846 | 94.30 | Synthetic Quartz | L113 |
| 6 | −198.6141 | 78.6305 | 102.23 | | |
| 7 | 705.6754 | 29.6916 | 128.29 | Synthetic Quartz | L121 |
| 8 | −853.6854 | 7.1157 | 128.85 | | |
| 9 | 243.8837 | 35.0000 | 130.00 | Synthetic Quartz | L122 |
| 10 | 393.9524 | 334.9670 | 126.27 | | |
| 11 | −228.4608 | 20.5261 | 87.25 | Synthetic Quartz | L123 |
| 12 | 324.6767 | 7.3561 | 90.62 | | |
| 13 | 359.7325 | 40.5663 | 92.51 | Fluorite | L124 |
| 14 | −554.2952 | 58.0131 | 94.34 | | |
| 15 | 588.9791 | 33.3872 | 97.95 | Synthetic Quartz | L125 |
| 16 | 3573.1266 | 113.1955 | 97.48 | | |
| 17 | −249.4612 | 25.0000 | 111.74 | Synthetic Quartz | L126 |
| 18 | −1326.9703 | 25.8354 | 126.13 | | |
| 19 | −367.4917 | −25.8354 | 129.94 | Concave Reflect- | |

TABLE 3-continued

SECOND MODE FOR CARRYING OUT THE PRESENT INVENTION
d0 = 50.0980
WD = 12.3836
|β| = ¼
NA = 0.75

| S | R | d | Re | Material | |
|---|---|---|---|---|---|
| | | | | ing Mirror MC | |
| 20 | −1326.9703 | −25.0000 | 127.54 | Synthetic Quartz | L126 |
| 21 | −249.4612 | −113.1955 | 117.01 | | |
| 22 | 3573.1266 | −33.3872 | 112.48 | Synthetic Quartz | L125 |
| 23 | 588.9791 | −58.0131 | 111.89 | | |
| 24 | −554.2952 | −40.5663 | 100.25 | Fluorite | L124 |
| 25 | 359.7325 | −7.3561 | 97.36 | | |
| 26 | 324.6767 | −20.5261 | 94.44 | Synthetic Quartz | L123 |
| 27 | −228.4608 | −334.9670 | 87.51 | | |
| 28 | 393.9524 | −35.0000 | 93.84 | Synthetic Quartz | L122 |
| 29 | 243.8837 | −7.1157 | 96.50 | | |
| 30 | −853.6854 | −29.6916 | 93.81 | Synthetic Quartz | L121 |
| 31 | 705.6754 | −1.6203 | 92.09 | | |
| 32 | ∞ | 530.0000 | 135 × 53 (oblong) | Plane Mirror M1 | |
| 33 | ∞ | −100.0000 | 260 × 220 (ellipse) | Plane Mirror M2 | |
| 34 | −473.4614 | −50.8662 | 130.00 | Synthetic Quartz | L211 |
| 35 | 1218.5628 | −18.9785 | 128.42 | | |
| 36 | 357.1688 | −31.0635 | 128.11 | Synthetic Quartz | L212 |
| 37 | 818.7536 | −209.4034 | 129.93 | | |
| 38 | −571.9096 | −31.2079 | 123.89 | Synthetic Quartz | L213 |
| 39* | −295.8211 | −4.7127 | 119.48 | | |
| 40 | −291.2028 | −53.9868 | 119.84 | Fluorite | L214 |
| 41 | 858.6769 | −19.1416 | 119.00 | | |
| 42 | ∞ | −24.0577 | 115.27 | Aperture Stop AS | |
| 43 | 719.7751 | −25.0000 | 113.83 | Synthetic Quartz | L221 |
| 44 | 6715.0030 | −22.3498 | 117.19 | | |
| 45 | −314.9647 | −45.0000 | 124.79 | Synthetic Quartz | L222 |
| 46 | −5036.3103 | −16.5385 | 123.55 | | |
| 47 | −265.1907 | −45.0000 | 120.07 | Synthetic Quartz | L223 |
| 48 | 9375.9412 | −1.1109 | 116.54 | | |
| 49 | −177.9561 | −50.1531 | 103.37 | Synthetic Quartz | L224 |
| 50 | −18823.9455 | −4.9217 | 94.91 | | |
| 51 | 1624.4953 | −25.0000 | 93.03 | Synthetic Quartz | L225 |
| 52* | −247.3912 | −1.0000 | 74.54 | | |
| 53 | −210.5206 | −24.3364 | 73.99 | Synthetic Quartz | L226 |
| 54 | −35247.2125 | −1.0621 | 69.21 | | |
| 55 | −293.7588 | −65.0000 | 63.01 | Synthetic Quartz | L227 |
| 56 | 56893.1197 | (WD) | 31.15 | | |

TABLE 4

ASPHERICAL DATA OF THE SECOND MODE FOR
CARRYING OUT THE PRESENT INVENTION

39th Surface $\kappa = 0.0000$
$A = -1.3500 \times 10^{-08}$
$B = -1.2494 \times 10^{-13}$
$C = -1.3519 \times 10^{-18}$
$D = -9.1832 \times 10^{-23}$
$E = 3.6355 \times 10^{-27}$
$F = -1.6744 \times 10^{-31}$ 52nd Surface $\kappa = 0.0000$
$A = -4.8204 \times 10^{-08}$
$B = -1.1379 \times 10^{-12}$
$C = -6.8704 \times 10^{-17}$
$D = -2.8172 \times 10^{-21}$
$E = 0.0000$
$F = 0.0000$ Table 5 below lists the numerical values corresponding to the conditions of the first and second modes for carrying out the present invention.

TABLE 5

NUMERICAL VALUES CORRESPONDING TO CONDITIONS
OF THE FIRST MODE FOR CARRYING OUT THE PRESENT
INVENTION

L1 = 11.55
S1 = 2400
L2 = 530
C1 = 261.22
C2 = 259.88
L3 = 118.11
D1 = 130.61
f12 = 490.57
f22 = 430.38
(1) L12/S1 = 0.0556
(2) L2/(c1 + c2) = 1.0171
(3) L3/D1 = 0.904
(4) f12/f21 = 1.0171

NUMERICAL VALUES CORRESPONDING TO CONDITIONS
OF THE SECOND MODE FOR CARRYING OUT THE PRESENT
INVENTION

L1 = 6.07
S1 = 2400
L2 = 530
C1 = 261.02
C2 = 261.22
L3 = 100.93
D1 = 129.99
f12 = 441.59
f22 = 440.56
(1) L12/S1 = 0.0154
(2) L2/(c1 + c2) = 1.0149
(3) L3/D1 = 0.776
(4) f12/f21 = 1.002

Figure 3A:
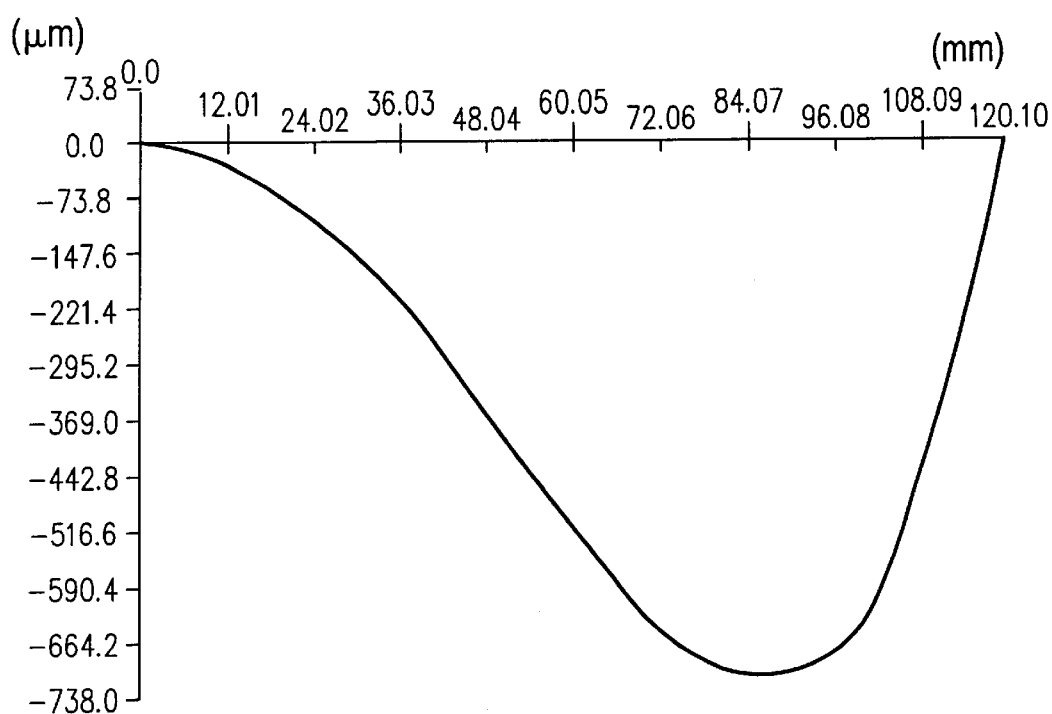
FIGS. 3a, 3b are plots of the shape of the aspherical surfaces provided in the catadioptric optical system of FIG. 2, wherein the horizontal axis is the distance from the optical axis in mm and the vertical axis is the deviation from an approximately spherical surface in mm.
Figure 3B:
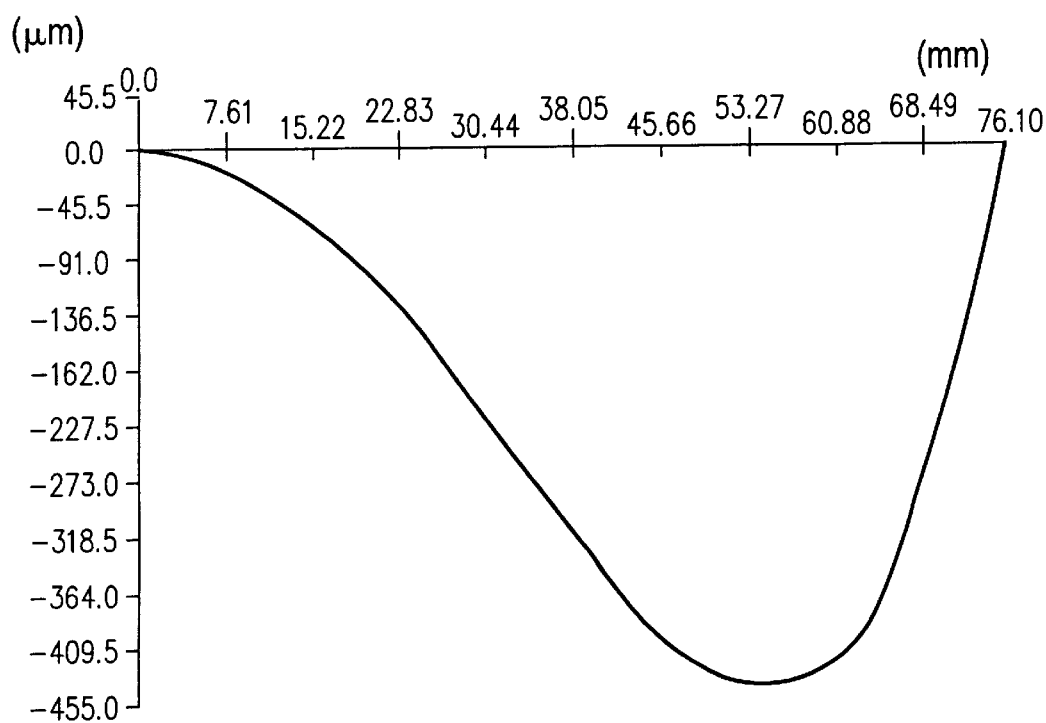
Figure 4A:
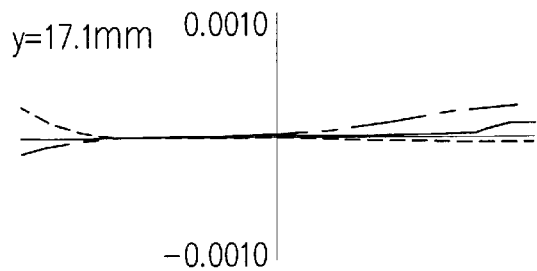
Figure 4D:
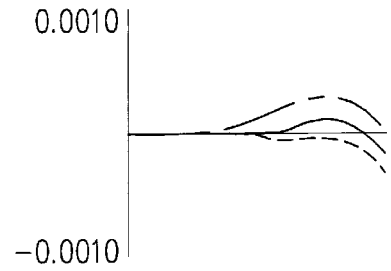
Figure 4B:
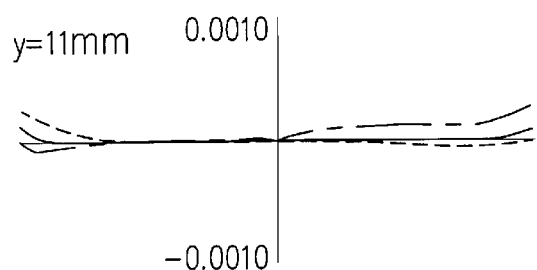
Figure 4E:
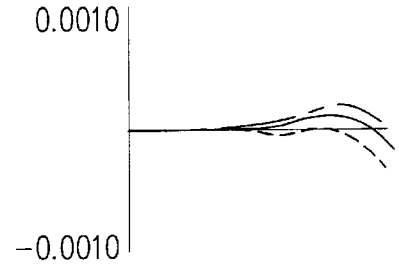
Figure 4C:
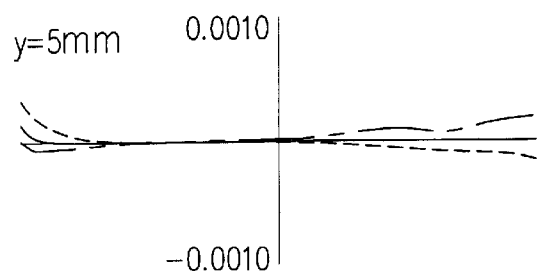
Figure 4F:
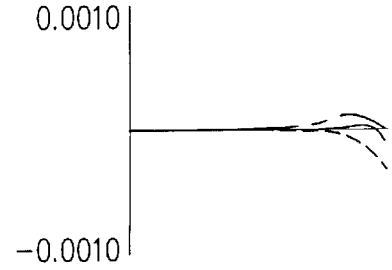
Figure 6A:
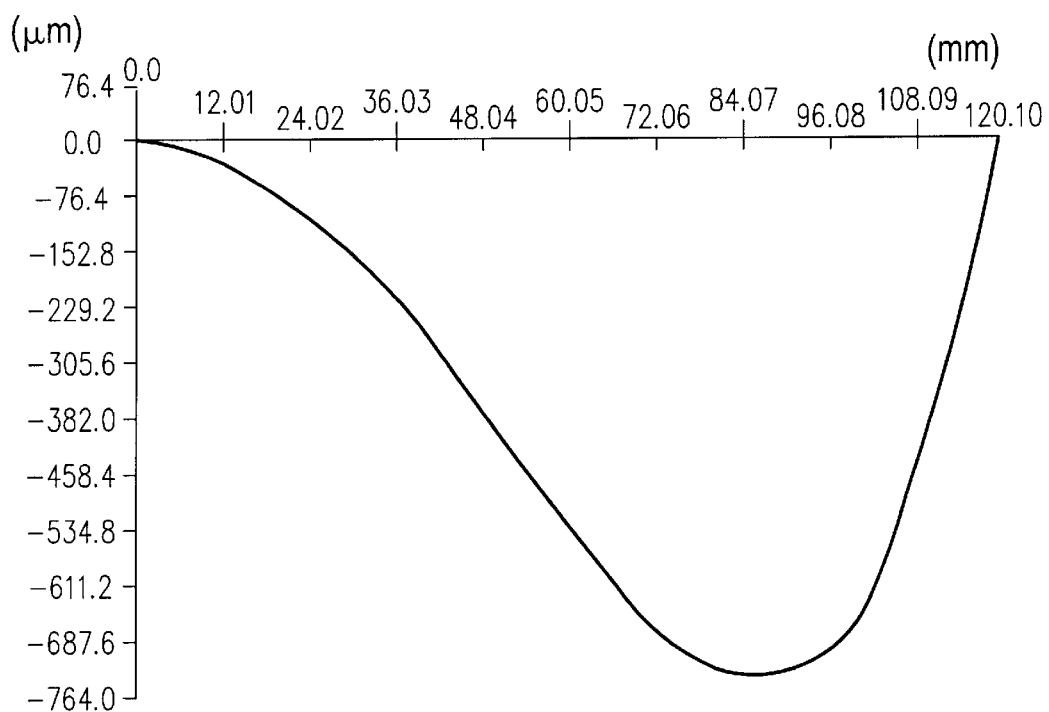
FIGS. 6a, 6b are plots of the shape of the aspherical surfaces provided in the catadioptric optical system of FIG. 5, similar to those in FIGS. 3a, 3b.
Figure 6B:
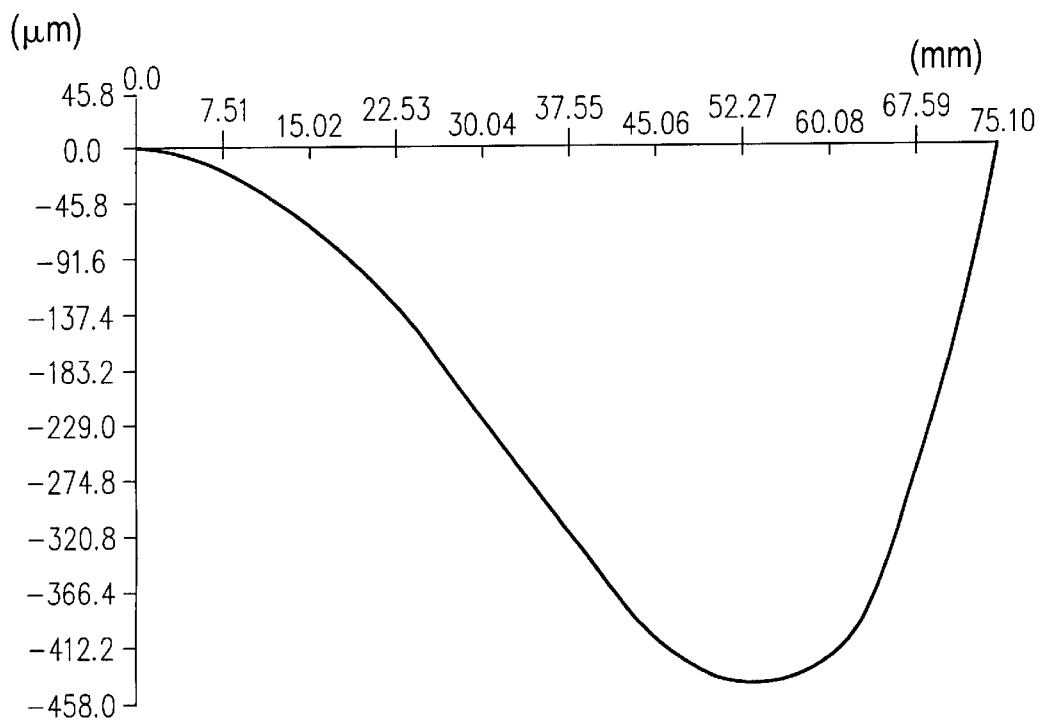
Figure 7A:
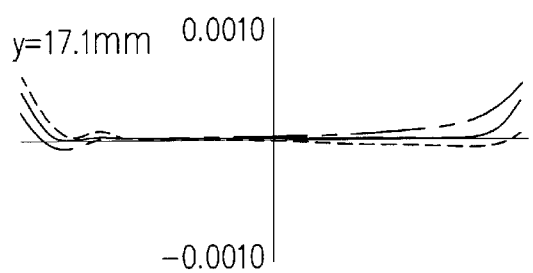
Figure 7D:
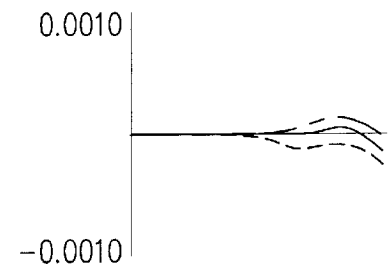
Figure 7B:
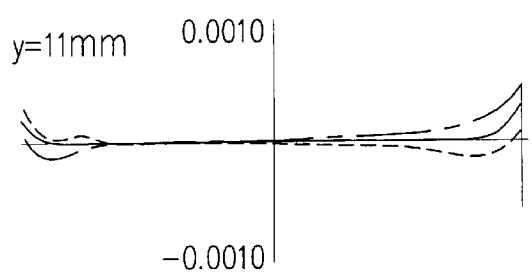
Figure 7E:
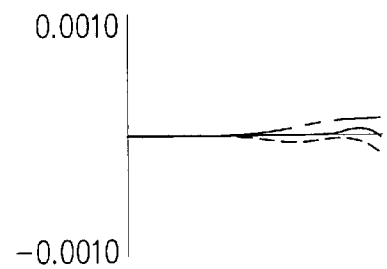
Figure 7C:
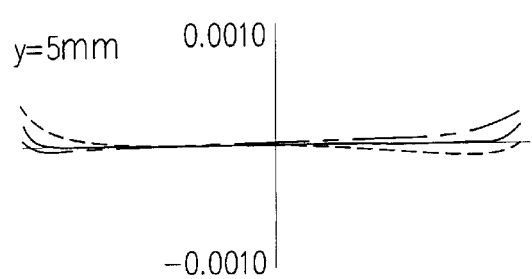
Figure 7F:
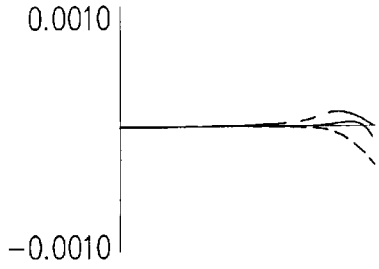

FIG. 3a shows the amount of displacement (deviation) from an approximate spherical surface of the rotationally symmetric aspherical surface formed on the concave surface on the wafer side of negative meniscus lens L213 in catadioptric optical system C of the first mode for carrying out the present invention. FIG. 3b shows the amount of displacement (deviation) from an approximate spherical surface of the rotationally symmetric aspherical surface formed on the concave surface on the wafer side of biconcave negative lens L225 in the catadioptric optical system C1 of the first mode for carrying out the present invention. In addition, FIG. 6a shows the amount of displacement (deviation) from an approximate spherical surface of the rotationally symmetric aspherical surface formed on the concave surface on the wafer side of negative meniscus lens L213 in the catadioptric optical system C2 of the second mode for carrying out the present invention. FIG. 6b shows the amount of displacement (deviation) from an approximate spherical surface of the rotationally symmetric aspherical surface formed on the concave surface on the wafer side of biconcave negative lens L225 in the catadioptric optical system C2 of the second mode for carrying out the present invention. In each graph, the abscissa is the distance of the aspherical surface from the optical axis, and the ordinate is the amount of displacement along the optical axis direction from the approximate spherical surface (spherical surface having a vertex radius of curvature).

As can be seen from FIG. 3a, FIG. 3b, FIG. 6a and FIG. 6b, among the aspherical surfaces that second imaging optical system B possesses in catadioptric optical systems C1 and C2 of the first and second modes for carrying out the present invention, the cross-sectional shape that includes the optical axis of the rotationally symmetric aspherical surface having a paraxial negative refractive power is a shape having first and second inflection points facing from the optical axis toward the lens periphery with respect to the approximate spherical surface. The first inflection point is on the optical axis, and the cross-sectional shape from the optical axis to the second inflection point has less curvature than the curvature of an approximate spherical surface. The cross-sectional shape from the second inflection point to the lens periphery has greater curvature than the curvature of an approximate spherical surface.

FIGS. 4a–4f and FIGS. 7a–7f are plots of the lateral aberration on wafer W of catadioptric optical systems C1 and C2 respectively. In each lateral aberration plot, the solid line represents the aberration curve at wavelength λ of 193.3 nm, the broken line represents the aberration curve at wavelength λ of 193.3 nm+1 pm, and the chain line represents the aberration curve at wavelength λ of 193.3 nm−1 pm.

As can be seen from each aberration plot, the catadioptric optical systems C1 and C2 according to the first and second modes for carrying out the present invention achieve satisfactory aberration correction in a large exposure region. Accordingly, by incorporating catadioptric optical systems C1 and C2 into the projection exposure apparatus shown in FIG. 1, for example, extremely fine patterns can be transferred onto the wafer.

The pupil plane of first imaging optical system A in systems C1 and C2 in the abovementioned modes for carrying out the present invention is positioned between concave reflecting mirror MC and first folding member M1. Thus, only positive lens L124 in lens group G12 and positive lens L214 in lens group G21 are formed of fluorite, and all other lenses are formed of synthetic quartz. By this construction, fluctuations in the image height direction in the optical performance in the image plane of catadioptric optical systems C1 and C2 can be ignored, for practical purposes, even if environmental factors, such as temperature, fluctuate. Furthermore, the fluorite lens in lens group G12 is not limited to positive lens L124, and other positive lenses, whose number is not limited to one, may also be formed of fluorite. In addition, the fluorite lenses in lens group G21 are also not limited to positive lens L214, and other lenses, whose number is not limited to one, may also be formed of fluorite.

The pupil plane of first imaging optical system A is preferably positioned between the first surface (reticle R) and concave reflecting mirror MC. Accordingly, all lenses that constitute lens group G21 may be formed of synthetic quartz, and at least any one positive lens among the positive lenses in lens group G22 may be formed of fluorite. By this construction, fluctuations in the image height direction in the optical performance in the image plane of catadioptric optical systems C1 and C2 can be ignored, for practical purposes, even if environmental factors, such as temperature, fluctuate.

In systems C1 and C2, the two lens surfaces having negative refractive power that interpose aperture stop AS are aspherical surfaces. However, to further improve optical performance or to realize greater compactness and a reduction in the number of lenses, two or more lens surfaces may be formed in an aspherical surface shape.

Also, in systems C1 and C2, the imaging performance can be microadjusted by adjusting, for a lens of at least any one lens group among lens group G11, lens group G12, lens group G21 and lens group G22, the position in the optical axis direction, the position in a direction orthogonal to the optical axis, the position in the rotational direction about the optical axis, or the position in the rotational direction with the direction orthogonal to the optical axis as the axis.

Also, the atmosphere in lens barrel 20 of catadioptric optical system C of FIG. I may be replaced with a gas other than air (for example, nitrogen, helium and the like).

Figure 8:
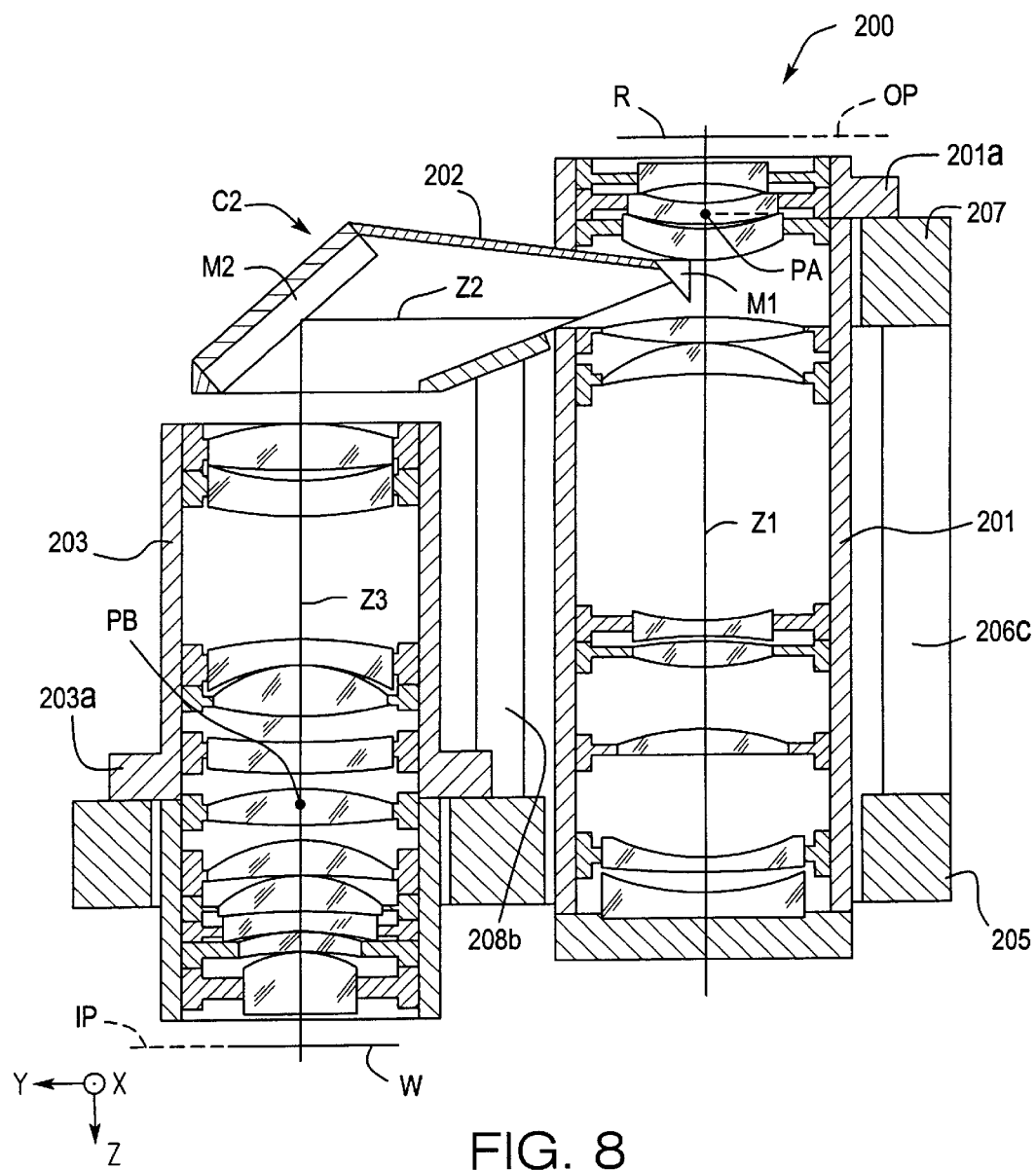
FIG. 8 is a cross-sectional view of the support structure and optical elements of the projection optical system according to a third mode for carrying out the present invention.

Next, the third mode for carrying out the present invention will be explained with reference to FIG. 8 and FIG. 11 and apparatus 200. FIG. 8 is a cross-sectional view that shows the support structure of the catadioptric-type projection optical system used in the projection exposure apparatus of the third mode for carrying out the present invention. Furthermore, since projection optical system C2 is used in the projection exposure apparatus according to the third mode for carrying out the present invention as set forth in Table 3 and Table 4 above, a detailed explanation thereof is omitted.

In apparatus 200 of FIG. 8, first imaging optical system A that forms an intermediate image of object plane R (mask surface) is housed in first lens barrel 201, and second imaging optical system B that reimages this intermediate image (secondary image) in the image plane (wafer W surface) is housed in third lens barrel 203.

First and second plane mirrors M1, M2 serving as folding members for guiding the light from first imaging optical system A to the second imaging optical system B are housed in second lens barrel 202. Therein, the optical axis (first optical axis Z1) of the first imaging optical system is arranged in the vertical Z direction. Furthermore, first plane mirror M1 arranged in the vicinity of the position at which the intermediate image is formed folds first optical axis Z1 of the first imaging optical system by 90° and transforms it to second optical axis Z2 extending horizontally in the Y direction. Second plane mirror M2 is arranged along second optical axis Z2, and second optical axis Z2 is further folded 90° by plane mirror M2 and transformed to third optical axis Z3 extending in the vertical Z direction. Plane mirrors M1, M2 are mutually orthogonal and are held by second lens barrel 202 so that they both form an angle of 45° with respect to second optical axis Z2.

Figure 9A:
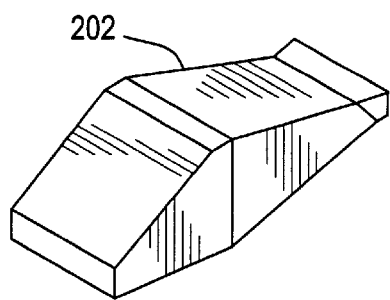
Figure 9B:
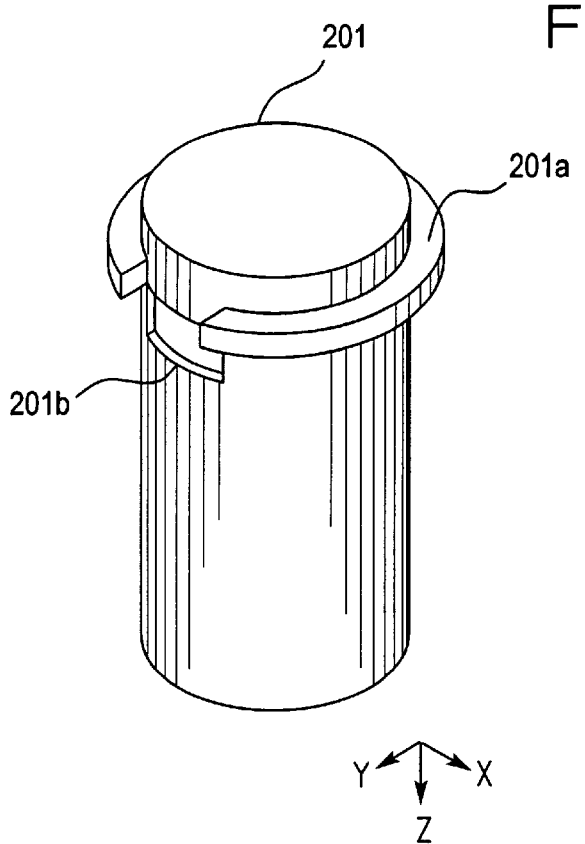
Figure 9C:
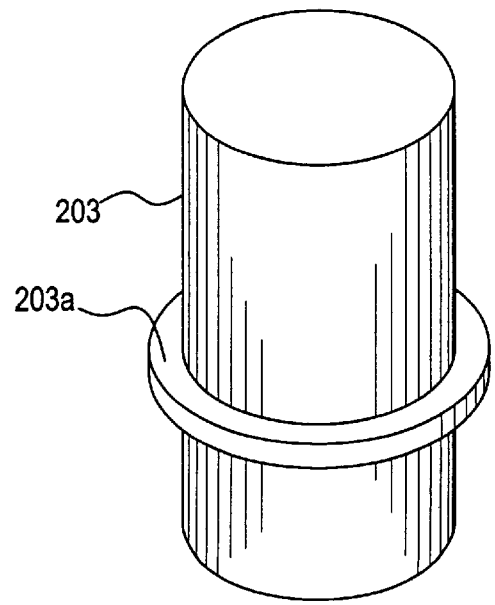

The support structure for supporting projection optical system C2 as part of apparatus 200 is now explained, referring to FIGS. 9a–9c, which are oblique views that shows lens barrels 201–203. First lens barrel 201 holds first imaging optical system A and third lens barrel 203 holds the second imaging optical system. These lens barrels are formed substantially as cylinders. Second lens barrel 202 that holds plane mirrors M1, M2 is formed substantially as a truncated pyramid. Furthermore, first lens barrel 201 is provided with opening 201b, and part of second lens barrel 202 enters into opening 201b when assembling the projection optical system.

Figure 10:
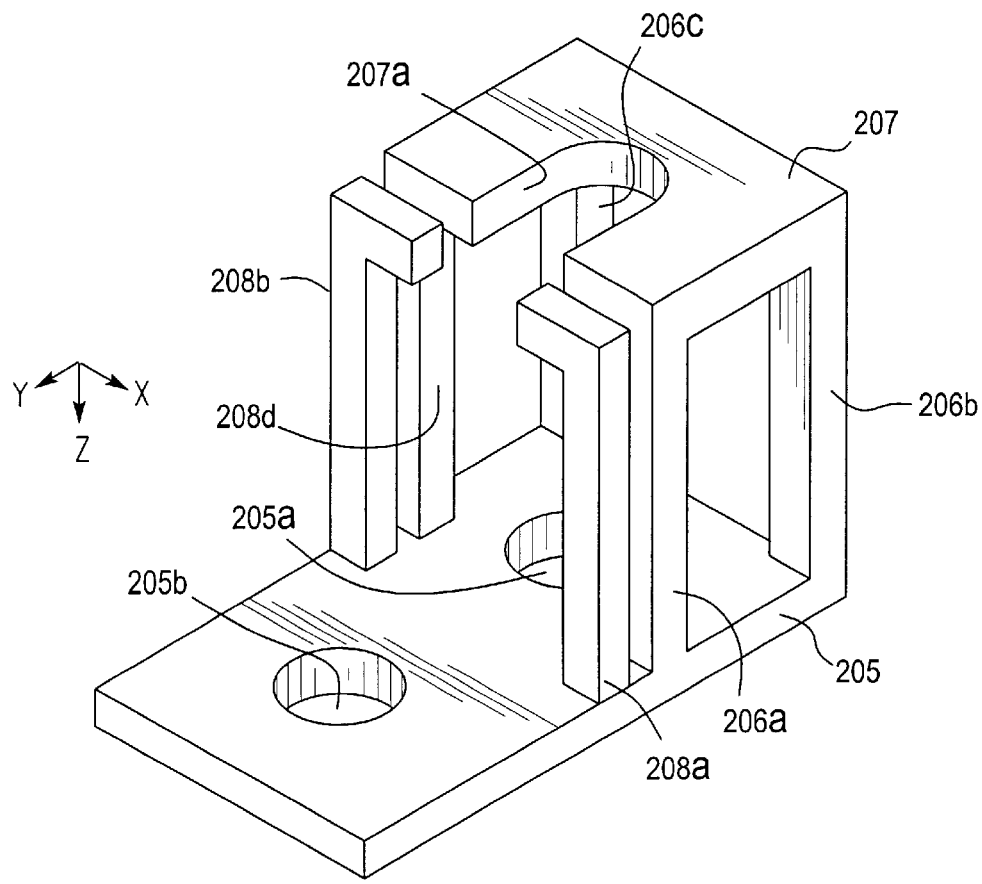
FIG. 10 is an oblique view of the upper and lower frames, and the main support for the projection optical system of FIG. 8.

FIG. 10 is an oblique view of the frame structure that supports lens barrels 201–203. In FIG. 10, lower frame 205 is formed as a plate and is provided with openings 205a, 205b through which first lens barrel 201 and third lens barrel 203 pass. Among these openings, at the perimeter of opening 205a for the first lens barrel is provided in a standing state four main supports 206a to 206d, and upper frame 207 is affixed to the top surfaces of main supports 206a to 206d. Upper frame 207 is provided with U-shaped opening 207a that supports first lens barrel 201.

The upper part of first lens barrel 201 is provided with flange 201a that protrudes sideways. First lens barrel 201 is supported by mounting the bottom surface of flange 201a onto the peripheral top surface of U-shaped opening 207a of upper frame 207. Likewise, the lower part of third lens barrel 203 is provided with flange 203a that protrudes sideways.

Third lens barrel 203 is supported by mounting the bottom surface of flange 203a onto the peripheral top surface of opening 205b, for the third lens barrel, of lower frame 205.

On the other hand, a pair of auxiliary supports 208a, 208b is formed in an inverted L shape and are affixed midway between first lens barrel opening 205a and third lens barrel opening 205b of lower frame 205. Second lens barrel 202 is supported by these auxiliary supports 208a, 208b.

The frame of the exposure apparatus of the present working example as described above comprises lower frame 205, main supports 206a to 206d, upper frame 207 and auxiliary supports 208a, 208b, and each of the lens barrels 201, 202, 203 are supported mutually independently by the flame.

Next, first lens barrel 201 is supported by the bottom surface of flange 201a provided on first lens barrel 201. The bottom surface of flange 201a is located at a position wherein the spacing between the pattern surface of the reticle (object plane R) to the intermediate image is internally divided by a ratio of 1:(−βA). Here, βA is the imaging magnification of first imaging optical system A. Imaging magnification βA of first imaging optical system A according to the present working example shown in Table 1 and Table 2 above is substantially −1.25. Accordingly, as shown in FIG. 8, the bottom surface of flange 201a of first lens barrel 201 is located substantially at the midpoint of the distance from the reticle (object plane R) to the intermediate image, namely at a position 106 mm below object plane OP (horizontal plane through which point PA shown in FIG. 8 passes).

Third lens barrel 203 is supported by the bottom surface of flange 203a provided on third lens barrel 203. The bottom surface of flange 203a is located at a position wherein the spacing from the intermediate image to the photosensitive surface of the wafer (image plane W) is internally divided by a ratio of 1:(−βB). Therein, βB is the imaging magnification of second imaging optical system B. Imaging magnification βB of second imaging optical system B according to the present working example shown in Table 1 and Table 2 above is substantially −0.20. Accordingly, as shown in FIG. 8, the bottom surface of flange 203a of third lens barrel 203 is located at the point wherein the distance from the intermediate image to image plane W is internally divided by a ratio of 1:0.20, namely at a position at a distance of 232 mm measured along the optical axis upward from image plane IP (horizontal plane through which point PB shown in FIG. 8 passes).

Figure 11:
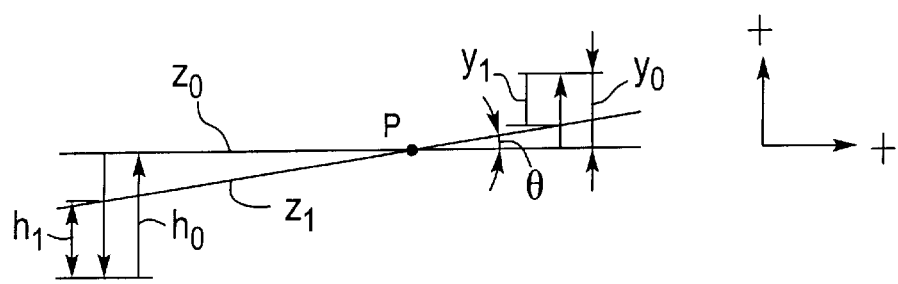
FIG. 11 is an explanatory diagram showing the relationship between the center of rotation and the image deviation of the imaging optical system.

The operation of this construction is now briefly explained, referring to FIG. 11. If h0 is the object height for an arbitrary imaging optical system, y0 is the image height and β is the lateral magnification, then:

$$\beta = y0/h0. \qquad (c)$$

Therein, the height of the object and the image are measured in the same direction. Accordingly, h0<0 and y0>0 in the example shown in FIG. 11. In addition, since the specific configuration and arrangement position of the imaging optical system does not present a problem, only optical axis z0 of the imaging optical system is shown in FIG. 11.

If the imaging optical system is rotated by just microangle θ in the counterclockwise direction about point P on optical axis z0, the optical axis after rotation changes to Z1. Even if a light beam passes through a single lens two times as in a catadioptric system, object height h1 and image height y1 after rotation are as follows, wherein the axial distance measured from the object point to the image point is positive, the axial distance from the object point to center of rotation P is a, and the axial distance from the center of rotation P to the image point is b.

$$h1 = h0 + a\theta \qquad (d)$$

$$y1 = y1 - b\theta \qquad (e)$$

If the following relationship between object height h1 and image height y1 after rotation holds, then the image point does not deviate even after rotation of the imaging optical system.

$$y1/h1 = \beta \qquad (f)$$

The following condition is obtained based on conditions (c) to (f):

$$a:b = 1:(-\beta) \qquad (g)$$

In other words, it can be seen that it is preferable to support the imaging optical system at point P, since the image point does not deviate even if the imaging optical system is rotated about a point (external dividing point when β is positive) wherein the object-image distance is internally divided by a ratio of 1:(−β).

The following explains the effect of the present working example. The degrees of freedom for a position that can be obtained in a three-dimensional object are the six degrees of freedom of the positions in the X, Y and Z directions and the angular positions about the X, Y and Z axes. Since first lens barrel 201 and third lens barrel 203 are separately supported by a frame at the bottom surfaces of flanges 201a, 203a, parallel movement in the vertical Z direction, parallel movement in the horizontal X and Y directions, and rotation about the vertical Z axis are difficult to produce. In particular, the vertical Z axis is in the direction of optical axes Z1, Z3, and both first imaging optical system A and second imaging optical system B are formed symmetrically about optical axes Z1, Z3. Thus, no aberrations whatsoever are generated even if rotation about the vertical Z axis is produced.

Based on the above, the only motion that can be produced in first lens barrel 201 and third lens barrel 203 is rotational motion about the horizontal X and Y axes. Moreover, first lens barrel 201 is supported by a plane surface, wherein the object-image distance of first imaging optical system A supported by first lens barrel 201 is internally divided by a ratio of 1:(−βA). Third lens barrel 203 is also supported by a plane surface, wherein the object-image distance of second imaging optical system B to be supported by third lens barrel 203 is internally divided by a ratio of 1:(−βB). Consequently, the amount of image deviation produced is small, even if first lens barrel 201 or third lens barrel 203 is rotated about the horizontal X and Y axes.

In addition, image deviation caused by first lens barrel 201 and third lens barrel 203 is difficult to produce. Thus, it is clear that, if image deviation is produced, the cause thereof is due to one of the wafer stage, the reticle stage or second lens barrel 202. In other words, specification of the cause of image deviation is simplified.

Next, although parallel movement of second lens barrel 202 in the vertical Z direction and parallel movement in the horizontal X and Y directions are difficult to produce, there is a risk of rotation about the X, Y and Z axes. If any one of these occurs, image deviation will be produced. However, even if first lens barrel 201 or third lens barrel 203 vibrates, that vibration is not transmitted and does not vibrate second lens barrel 202, since second lens barrel 202 is directly held by the frame. Accordingly, if the stability of the frame is increased, the vibration of second lens barrel 202 can be sufficiently prevented.

The configuration of the present working example is effective even when assembling the projection optical system. To assemble projection optical system C2, as shown in FIG. 8, lens barrels 201 to 203 are first assembled. At this point, lens barrels 201 to 203 are easy to assemble, since they have a single optical axis. Among these, first lens barrel 201 and third lens barrel 203 should be stacked so that optical axes Z1, Z3 do not deviate from the optical members below. In addition, second lens barrel 202 should be assembled so that plane mirrors M1, M2 form a right angle.

Next, to complete the assembly of projection optical system C2, first lens barrel 201 and third lens barrel 203 are first fitted on the frame shown in FIG. 10. At this point, it may be difficult to make the positional relationship of both lens barrels 201, 203 perfectly conform to the design data.

For deviations in the positional relationship between first lens barrel 201 and third lens barrel 203, a deviation in height in the vertical Z direction, and a deviation in the interaxis distance in the horizontal Y direction is considered. Among these, if there is a deviation in height in the vertical Z direction between first lens barrel 201 and third lens barrel 203, the total axial length from reticle R to the wafer W will deviate from the design data. In this case, the total length can be set in accordance with the design value by adjusting the height at which second lens barrel 202 is attached when fitting second lens barrel 202 to auxiliary supports 208a, 208b.

If there is a deviation in the interaxis distance between first lens barrel 201 and third lens barrel 203, it can be absorbed by adjusting in the horizontal Y direction the position at which second lens barrel 202 is attached. Thus, by adjusting the position between each barrel, projection optical system C2 can be assembled with ease in accordance with the design data.

In apparatus 200 of FIG. 8, a plurality of optical members arrayed along first optical axis Z1 are supported by one lens barrel 201. Also, a plurality of optical members are arrayed along third optical axis Z3 and are supported by one lens barrel 203. At least one of first lens barrel 201 and third lens barrel 203 may have a split construction, namely at least one of first lens barrel 201 and third lens barrel 203 may comprise a plurality of lens barrels.

As discussed above, the third mode for carrying out the present invention can provide a catadioptric optical system that does not invite deterioration of the image and for which the assembly adjustment is easy.

The following explains the fourth mode for carrying out the present invention, using FIGS. 12a, 12b to FIGS. 14a, 14b. The fourth mode for carrying out the present invention relates to a support structure 300 of a catadioptric-type projection optical system used in a projection exposure apparatus. Furthermore, since the projection optical system used in the projection exposure apparatus according to the fourth mode for carrying out the present invention is catadioptric optical system C2 described in Table 3 and Table 4, mentioned above, the explanation thereof is hereby omitted.

Figure 12A:
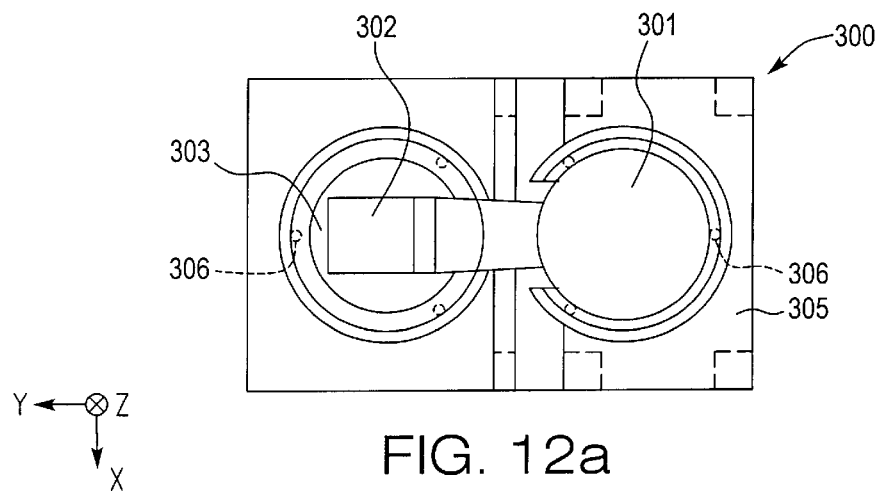
Figure 12B:
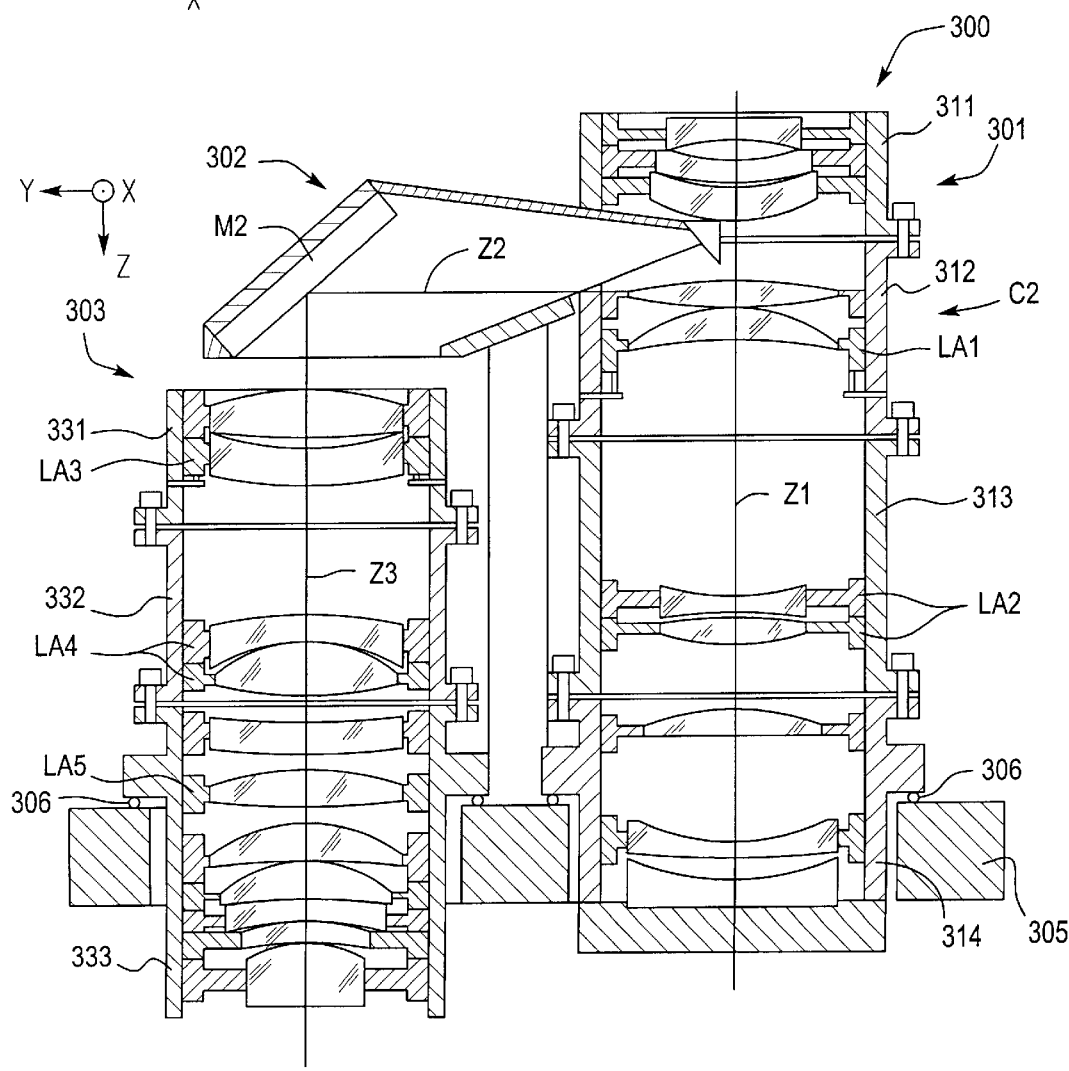

FIG. 12a is an XY plan view of support structure 300 that supports system C2, and FIG. 12b is a longitudinal cross-sectional view (YZ cross-sectional view) of the support structure.

Projection optical system C2 of the fourth mode for carrying out the present invention shown in FIG. 12 has three optical axes Z1, Z2, Z3. First optical axis Z1 is folded to second optical axis Z2 by first plane mirror M1, and second optical axis Z2 is folded back to third optical axis Z3 by second plane mirror M2. In other words, first plane mirror M1 is arranged so that it passes through the point of intersection of first optical axis Z1 and second optical axis Z2, and second plane mirror M2 is arranged so that it passes through the point of intersection of second optical axis Z2 and third optical axis Z3.

As shown in FIG. 12b, the optical members arranged on first optical axis Z1 are held by first barrel 301, and the optical members arranged on third optical axis Z3 are held by third barrel 303. In addition, first plane mirror M1 and second plane mirror M2 are held by a second barrel 302.

At the time of projection and exposure, the light that passes through first barrel 301 is relayed through second barrel 302, is conducted to third barrel 303 and reaches image plane IP. Second barrel 302 extends an arm from the vicinity of its center, and is directly affixed to a frame 305 so that second optical axis Z2 is horizontal.

The following explains the assembly adjustment method of the projection optical system according to the fourth mode for carrying out the present invention.

First, since first to third barrels 301 to 303 are independent structures, they can each be assembled independently. In other words, since first barrel 301 and third barrel 303 do not include a plane mirror, and the lenses and concave reflecting mirror MC are merely lined up with respect to one of optical axes Z1, Z3, assembly can be performed with the same technique as that of a conventional dioptric system. On the other hand, since second barrel 302 holds plane mirrors M1, M2, and the number of parts to be held is small, assembly adjustment can be performed by using, for example, a three-dimensional measuring machine.

Next, the three barrels 301 to 303 are connected. Incidentally, if adjustments between the barrels are performed, deviations from the design values may arise. This error is not produced by conventional dioptric system lenses. This deviation between barrels can also be eliminated up to a certain amount by using various adjustment mechanisms of the type used in conventional dioptric systems. However, if the deviation between barrels is, for example, on the order of a millimeter, the adjustment stroke in conventional adjustment methods becomes inadequate, or the amount of residual high-order aberration unfortunately increases even if within the adjustment stroke. Therefore, the design performance can no longer be realized. Consequently, it is necessary to perform adjustments between barrels in advance up to the millimeter order. The following describes this procedure.

First, first barrel 301 and third barrel 303 are assembled into frame 305. At this time, first barrel 301 and third barrel 303 are assembled so that they are as mutually parallel as possible. If optical axes Z1, Z3 are perpendicular to the holding surface of frame 305, it is preferable since subsequent adjustment becomes easier.

As can be seen from the design data, positional relationships in the predetermined design values exist between first barrel 301 and third barrel 303, and it is necessary that these be satisfied on the micron order. However, it is extremely difficult to install an object of large size and heavy weight, like first and third barrels 301, 303, on a micron order from the outset. In addition, the inclination of first and third barrels 301, 303 must also be on the order of a few seconds with respect to one another, and this too is difficult to realize with just the initial placement.

Accordingly, first barrel 301 or third barrel 303 may be provided with a movement and inclination adjustment mechanism. Even in this case, it is quite difficult to adjust on the order of microns large and heavy objects like first and third barrels 301, 303 with them mounted on frame 305 as is. Consequently, a realistic procedure is one wherein first barrel 301 or third barrel 303 is first removed from frame 305, frame 305 and the like are adjusted, and then first barrel 301 or third barrel 303 is reattached. Consequently, first and third barrels 301, 303, as shown in FIG. 12b, are made removable in the working example by using kinematic joint 306. It is therefore possible to remove first barrel 301 or third barrel 303, adjust the thickness of the flange position, and then reattach the barrel.

However, in the present working example, if first and third barrels 301, 303 are inclined and adjusted on the order of a few microns, then a deviation from the design value of the spacing between first and third barrels 301, 303, or a deviation from the design value of the height in the upward or downward direction can be adjusted by moving second barrel 302, if within the adjustment range of second barrel 302. In other words, a deviation in the spacing between first and third barrels 301, 303 and a deviation in height can be adjusted to an optical path length position equivalent to the design value by moving second barrel 302 vertically or horizontally.

As described above, if the optical members immediately after reticle R or immediately before wafer W are not included, and second barrel 302 having one or more folding members is provided with an adjustment mechanism, then an adjustment mechanism in the other barrels 301, 303 may become unnecessary. Accordingly, in the present mode for carrying out the present invention, adjustment is performed using only the adjustment mechanism of second barrel 302.

Next, second barrel 302 is also installed on frame 305 at a predetermined position. However, as mentioned above, the deviation in spacing and the deviation in height of first and third barrels 301, 303 are premeasured, and the amounts of those deviations are added as an offset to the design value of second barrel 302. Even if the above value is known, second barrel 302 is also quite large, and it is difficult to install with an accuracy on the order of microns and seconds from the ideal position on the first installation. Consequently, the positions between first to third barrels 301 to 303 are measured and, to correct these, second barrel 302 is provided with a translation and inclination mechanism.

Figure 13A:
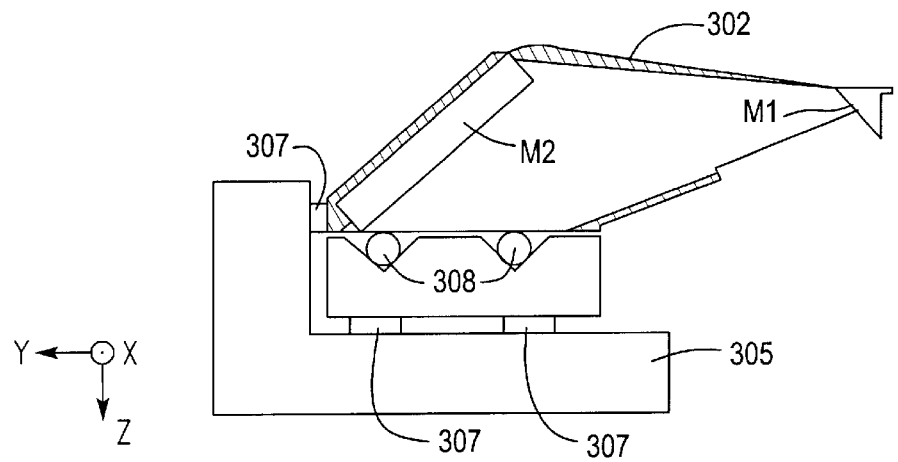
FIG. 13a is a partial cross-sectional front view (YZ partial cross-sectional view) of the attachment-removal mechanism and the adjustment mechanism of the second barrel.

In other words, as shown in the longitudinal cross-sectional view (YZ cross-sectional view) of second barrel 302 and frame 305 in FIG. 13a, second barrel 302 is installed on frame 305 via washers 307 and balls 308. Washers 307 function as an adjustment mechanism, and balls 308 function as a removal mechanism. In this case as well, it is difficult to make an adjustment on the order of microns with second barrel 302 mounted as is on frame 305, as was shown with first and third barrels 301, 303. Consequently, a practical procedure is one wherein second barrel 302 is first removed, washers 307 are adjusted, and second barrel 302 is reattached. Thus, it is effective to attach a removal mechanism to second barrel 302. In addition, second barrel 302 is the lightest barrel among the three barrels 301, 302, 303 shown in FIG. 12b. Consequently, its removal and adjustment is the easiest. Thus, adjustment is easiest if an adjustment means is provided for adjusting the inclination and translation of the lightest barrel.

Next, optical adjustment is performed. This is carried out by performing a fine adjustment of the lens spacings, and by inclining (tilting) or moving (shifting) in a direction perpendicular to the optical axis one or a plurality of lenses. In this connection, the case of a catadioptric system is disclosed in, for example, U.S. Pat. No. 5,638,223. When performing optical adjustment of a catadioptric system, as disclosed in this reference, a mechanism is preferred that optically adjusts only the required optical element unit without affecting other optical element units as much as possible.

In accordance with this requirement in the present example, the optical elements of first barrel 301 are further distributed and housed in a plurality of lens barrel units 311 to 314. Further, the optical elements of third barrel 303 are distributed and housed in a plurality of lens barrel units 331 to 333, as shown in FIG. 12b. Furthermore, each of lens barrel units 311 to 314, 331 to 333 house one or more optical elements. These lens barrel units are provided with a mechanism that moves or inclines the lens barrel unit along the optical axis or in a direction orthogonal to the optical axis by making adjustments between the lens barrel units.

The following describes the optical adjustment procedure for this case. First, the amount of aberration of the lens is measured by a print test and the like. Based thereon, the amount of movement or inclination of the lens barrel unit is indicated. Based on that, lens barrel units 311 to 314, 331 to 333 of first and third barrels 301, 303 are moved. However, as can be seen from FIG. 12b, it is nearly impossible to move lens barrel units 311 to 314, 331 to 333 of first and third barrels 301, 303 without removing second barrel 302. Accordingly, since second barrel 302 is removable, as previously explained, second barrel 302 is removed and lens barrel units 311 to 314, 331 to 333 in first and third barrels 301, 303 are moved in accordance with the indicated value. In this case, if first and third barrels 301, 303 are removable, first and third barrels 301, 303 may be removed and adjusted on a separate adjustment bench. An aspect of this is shown in FIG. 13b for the case of third barrel 303.

Figure 13B:
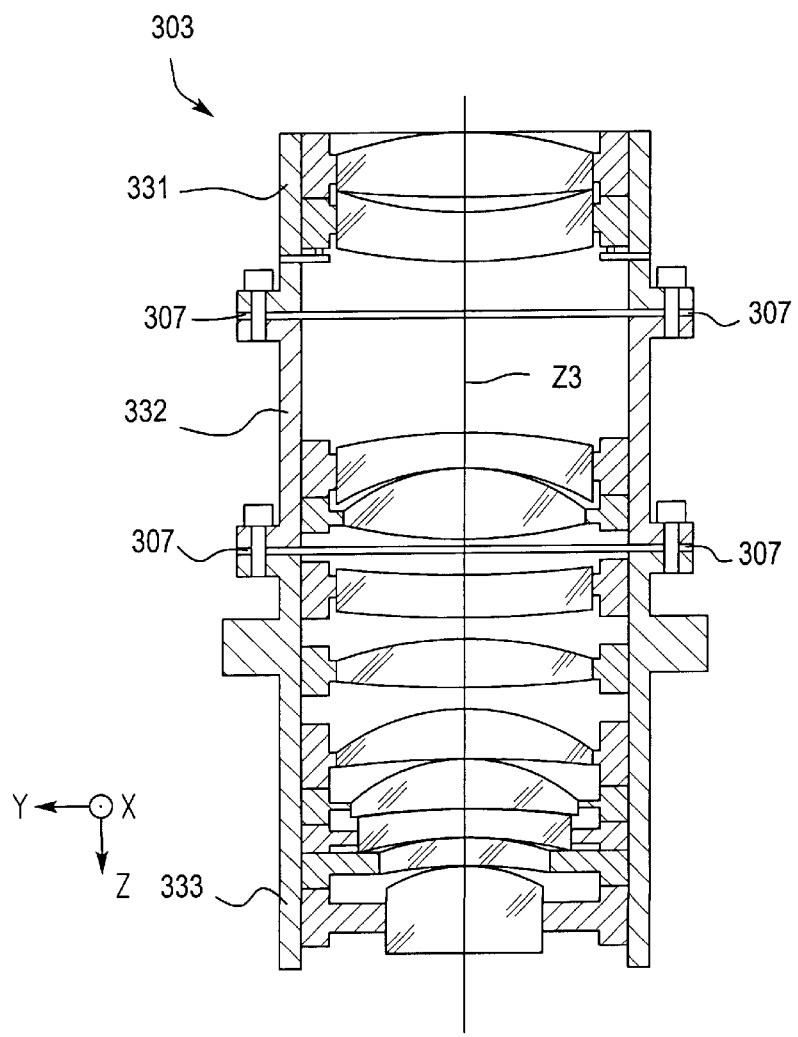
FIG. 13b is a longitudinal cross-sectional view (YZ cross-sectional view) of the third barrel.

FIG. 13b is a longitudinal cross-sectional view (YZ cross-sectional view) of third barrel 303. In FIG. 13b, third barrel 303 is further internally divided into three lens barrel units 331 to 333 that include optical elements. In FIG. 13b, uppermost part and lowermost part lens barrel units 331, 333 are affixed, and middle lens barrel unit 332 is moved in the optical axis direction by replacing washers 307, and is also moved in the direction orthogonal to the optical axis. After completing the adjustment, first and third barrels 301, 303 are assembled and, lastly, second barrel 302 is returned to its original position.

By repeating the above optical adjustment one or more times, the lens performance approaches the design value.

Nevertheless, even if the above adjustment procedure is repeated, if second barrel 302 or the adjustment indication of first and third barrels 301, 303 is reproduced, microscopic errors with respect to the indicated value inevitably arise. When adjusting aberrations due to these errors, it is inevitable with just the above adjustment procedure that second barrel 302 and first and third barrels 301, 303 must be removable, which is extremely laborious. Consequently, it is preferable that this portion of the final aberration adjustment be able to be performed without removing the barrels. Furthermore, even after a lens is completed, for example, aberrations of the lens change microscopically due to mounting on the stage, movement when used as a product, and changes in the installation environment and the like. It is necessary to perform this portion of the aberration adjustment externally without removing any barrels.

Consequently, the present working example enables the adjustment of the five Seidel aberrations by changing at least five optical path lengths, as disclosed in Japanese Patent Application Kokai No. Hei 10-54932. Furthermore, decentered aberrations are made adjustable by providing a function that inclines at least five sets of lens elements or lens assemblies LA1 to LA5, without externally affecting other optical members. A technique to tilt a lens element or lens group is disclosed in Japanese Patent Application Kokai No. Hei 10-133105. In this technique, a lens element near the reticle is tilted. However, although this mechanism is effective for a case like correcting distortion due to decentering, it is inadequate for correcting coma due to decentering. Moreover, the technique in Japanese Patent Application Kokai No. Hei 10-133105 is for a dioptric system, which is substantially different from the case wherein a catadioptric system lens is used, as in the present invention.

Lens assemblies LA1–LA5 are preferable in that making the lens elements or lens assemblies coincide is efficient for changing the optical path length. The five lens elements or lens assemblies mentioned herein correspond to the five types of third order decentered aberrations as described in the reference by Yoshiya MATSUI, entitled "A Study of Third Order Aberrations in Optical Systems Wherein Decentering Exists," 1990, Japan Optomechatronics Society, p. 5. Namely, these five aberrations include two types of decentered distortion, decentered astigmatism, inclination of the image plane, and decentered coma. By using this optical path changing mechanism and decentered adjustment mechanism, performance the same as the design value can ultimately be realized. These five sets of lens elements or lens assemblies LA1 to LA5 are shown in FIG. 12b. In this manner, the mechanism that tilts the lens elements or lens assemblies is extremely effective, particularly in a catadioptric system.

Figure 14A:
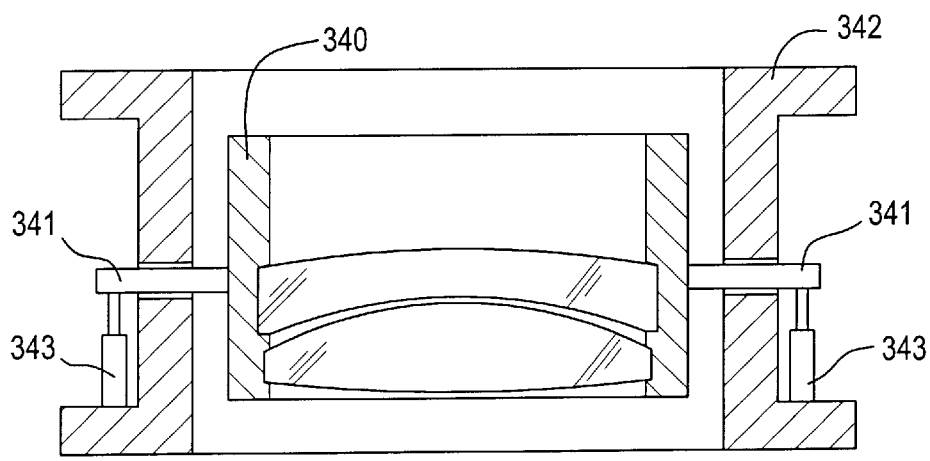
FIG. 14a is a longitudinal cross-sectional view (YZ cross-sectional view) of a translating and tilting mechanism.
Figure 14B:
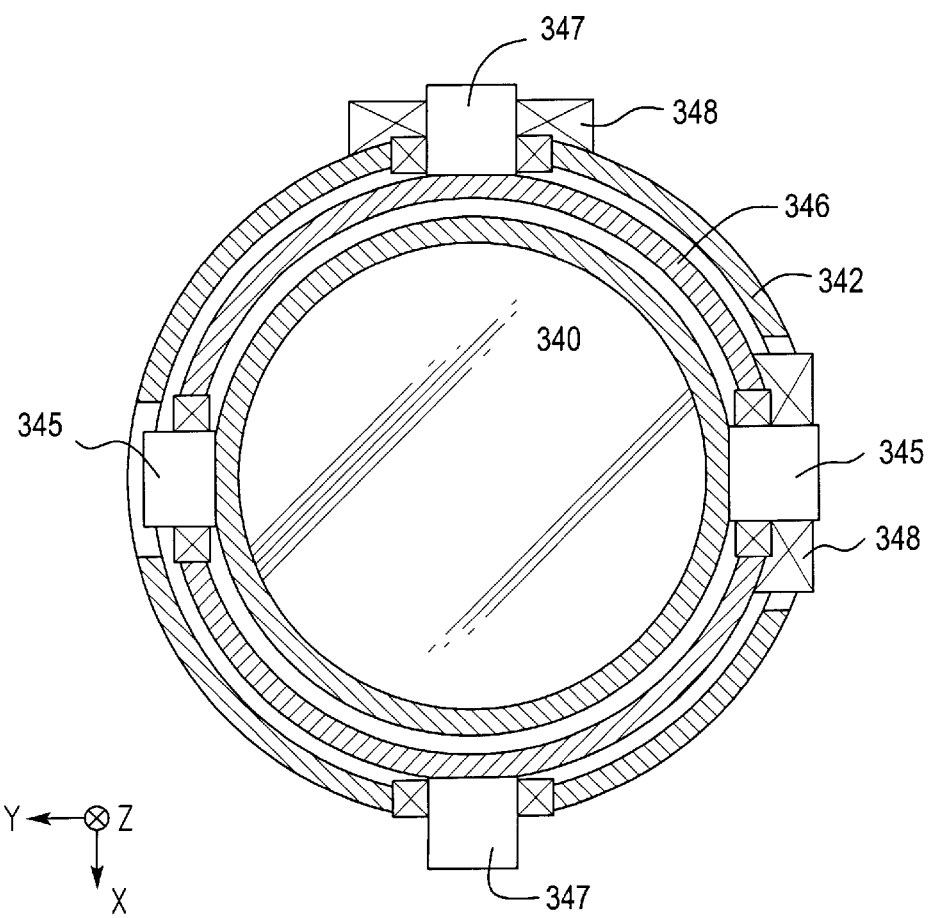
FIG. 14b is a plan cross-sectional view (XY cross-sectional view) that shows another example of a tilting mechanism.

This adjustment mechanism is shown in FIGS. 14a and 14b. A variety of mechanical mechanisms can be considered with regard to this adjustment mechanism. FIG. 14a shows a mechanism that translates and tilts the lens elements and lens assemblies. Three adjustment rods 341 protrude in the direction of 0°, 120°, and 240° from lens holder 340, and a vertical drive mechanism 343 is attached to each of the three adjustment rods 341, which pass through the side wall of lens barrel unit 342. A piezoelectric device or ultrasonic motor can be used as vertical drive mechanism 343.

In addition, FIG. 14b shows a mechanism that tilts the lens elements or lens groups. Lens holder 340 is provided with X shafts 345 that extend in the +X direction and −X direction. X shafts 345 are pivoted by intermediate barrel 346, provided with Y shafts 347 that extend in the +Y direction and −Y direction. Y shafts 347 are pivoted by lens barrel unit 342, and rotational drive mechanisms 348 are attached to X shafts 345 and Y shafts 347.

In this manner, it is essential that the catadioptric exposure apparatus having a plurality of optical axes have, as described above, a process that adjusts by an adjustment apparatus the mutual relationship between optical axes Z1, Z2, Z3 for each of the barrels 301–303, a process that positions each of the lens barrel units 311 to 314, 331 to 333, and a process that positions the simple lenses or lens assemblies LA1 to LA5. Having the above adjustment processes is essential so that performance in accordance with the design values can ultimately be achieved.

By the adjustment mechanism and adjustment process according to the fourth mode for carrying out the present invention as explained above, a catadioptric projection exposure apparatus can be provided ultimately having optical performance substantially equal to the design value.

Next, the fifth mode for carrying out the present invention will be explained, referencing FIGS. 15a and 15b. The fifth mode for carrying out the present invention relates to a support method suitable for, for example, supporting second lens barrel 302 in the third mode for carrying out the present invention.

Figure 15A:
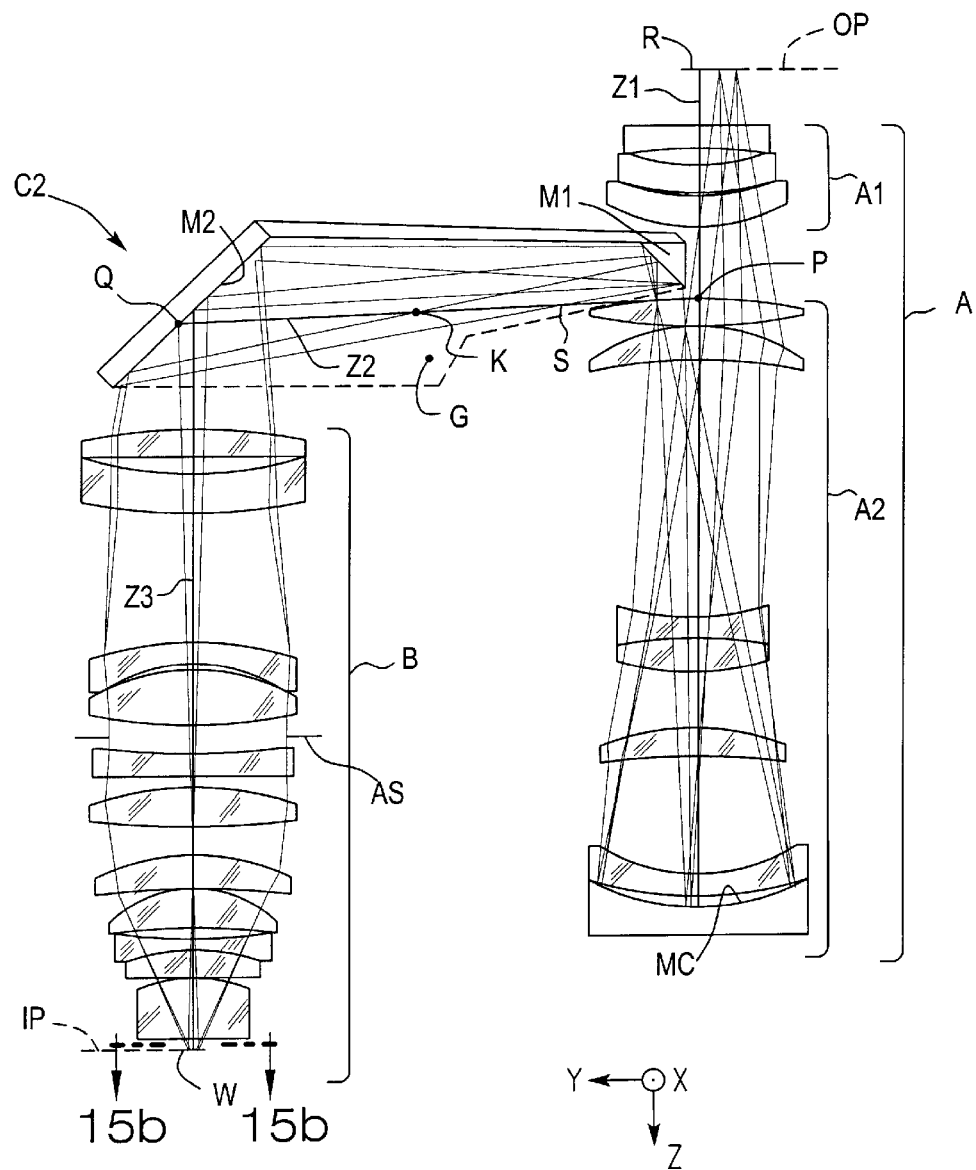
FIG. 15a is an optical path diagram of the projection optical system used in the catadioptric projection exposure apparatus according to the fifth mode for carrying out a present invention.

FIG. 15a is an optical path diagram of a fifth embodiment of a projection optical system C3 for carrying out the present invention. Projection optical system C3 forms an intermediate image S of the pattern on reticle R located in object plane OP by first imaging optical system A. Intermediate image S is then imaged onto the photosensitive surface located in image plane IP of wafer W by second imaging optical system B. Furthermore, first imaging optical system A comprises a front group A1, and a rear group A2 that constitutes a round-trip optical system. The optical specifications for the projection optical system shown in FIG. 15a are those of system C2 and are listed in Table 3 and Table 4 above. Furthermore, exposure region EA on wafer W is an oblong region (slit-shaped region) measuring 25 mm in the X direction and 6 mm in the Y direction, as shown in FIG. 15b. FIG. 15b is an enlarged view taken in the direction of the arrows along the line 15b—15b in FIG. 15a.

Plane mirrors M1, M2 in the present working example are held by second lens barrel 302 as a single holding member. In other words, plane mirrors M1, M2 are held as a single body. Second lens barrel 302 is supported from the front (+X direction) and from the rear (−X direction) by support members 308a, 308b that are provided in a standing condition on frame 305, the same as in the third mode for carrying out the present invention discussed earlier.

In FIG. 15a, if the point of intersection of first optical axis Z1 and second optical axis Z2 is assigned point P, then point P lies in a plane that includes the reflecting surface of first plane mirror M1. If the point of intersection of second optical axis Z2 and third optical axis Z3 is assigned point Q, then point Q lies in a plane that includes the reflecting surface of second plane mirror M2. Line segment PQ constitutes second optical axis Z2.

The midpoint of the positions where support members 308a, 308b, shown in FIG. 10, support second lens barrel 302 is generally at a pivotal point G located 30 mm directly below a midpoint K of second optical axis Z2 (namely, line segment PQ). Although support members 308a, 308b provide support so that no motion whatsoever arises in second lens barrel 302, in actuality, there is a possibility that rotational motion will arise in second lens barrel 302. This rotational motion is about the X axis, Y axis and Z axis through which pivotal point G passes.

In this manner, plane mirrors M1, M2 are held as a single body, and the following describes the effectiveness of configuration wherein midpoint K or that vicinity of second optical axis Z2 (line segment PQ) is set to pivotal point G. For comparative purposes, consider the case wherein plane mirrors M1, M2 are supported separately, and examine the distortion of the image when first plane mirror M1 is rotated, and the distortion in the image when second plane mirror M2 is rotated. Then, examine the distortion of the image when both plane mirrors M1, M2 are rotated as a single body, based on the construction of the present working example.

Figure 15B:
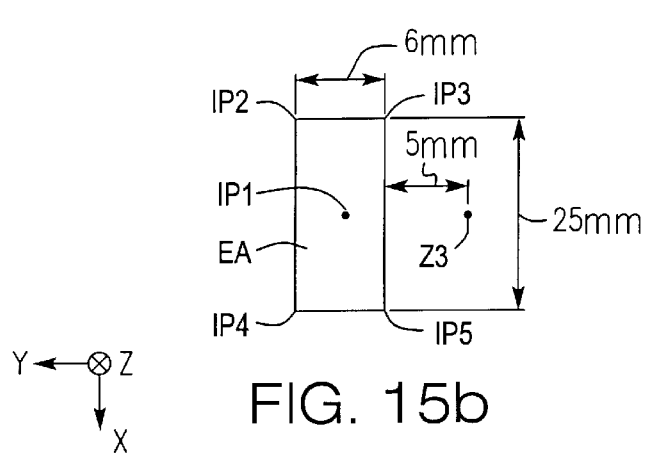

The amount of distortion of the image depends on how much center position IP1 of exposure region EA and positions IP2 to IP5 at the four corners, as shown in FIG. 15b, are moved before and after rotation of plane mirror M1. Accordingly, exposure region EA is an oblong shape measuring 25 mm×6 mm, as mentioned earlier, and center position IP1 of exposure region EA in the image plane is at a position deviated from third optical axis Z3 by 5+3=8 mm in the Y direction.

First, the results of the distortion of the image when first plane mirror M1 is rotated independently will be explained. Let the hypothetical rotational motion be about the X axis, Y axis and Z axis through which pivotal point P passes, with the point of intersection P of first optical axis Z1 and second optical axis Z2 as the pivotal point. The direction of rotation and rotational angle is 3" in the counterclockwise direction viewed from the +X direction, 3" in the counterclockwise direction viewed from the +Y direction, and 3" in the clockwise direction viewed from the +Z direction. Furthermore, pivotal point P is in the plane wherein the reflecting surface of first plane mirror M1 extends. However, it is not the case that pivotal point P lies on the reflecting surface of first plane mirror M1 itself because first imaging optical system A includes a round-trip optical system.

The image is deformed due to this rotational motion. Table 6 shows the amount of displacement of center position IP1 of exposure region EA and four corners IP2 to IP5 of exposure region EA.

Furthermore, if first plane mirror M1 is rotated, the position on the wafer surface of third optical axis Z3 will also displaced. The contents of Table 6 show the remaining amount of displacement of points IP1 to IP5 when the post-displacement position of third optical axis Z3 is drawn back so that it superposes the pre-displacement position of third optical axis Z3.

Likewise, Table 7 shows the distortion of the image when second plane mirror M2 is rotated independently. The pivotal point is the point of intersection Q of second optical axis Z2 and third optical axis Z3, and the other conditions are the same as described above.

Likewise, Table 8 shows the distortion of the image when both plane mirrors M1, M2 are rotated as a single body. The pivotal point is point G, which lies 30 mm directly below midpoint K of second optical axis Z2 (line segment PQ), and the other conditions are the same as described above. The unit of displacement amounts dX, dY shown in Table 6 to Table 8 is nm.

TABLE 6

COMPARATIVE EXAMPLE:
ROTATION ONLY OF FIRST PLANE MIRROR M1

|  | Rotation About X Axis | | Rotation About Y Axis | | Rotation About Z Axis | |
| --- | --- | --- | --- | --- | --- | --- |
|  | dX | dY | dX | dY | dX | dY |
| IP1 | 0 | −14 | −106.7 | 0 | 106.7 | 0 |
| IP2 | 73.2 | 19.2 | −159.7 | −145.3 | 159.7 | 145.2 |
| IP3 | 32.9 | 41.5 | −86.5 | −165.4 | 86.5 | 165.3 |
| IP4 | −73.1 | 19.2 | −159.8 | 145.2 | 159.7 | −145.3 |
| IP5 | −32.9 | 41.5 | −86.5 | 165.3 | 86.5 | −165.4 |

TABLE 7

COMPARATIVE EXAMPLE:
ROTATION ONLY OF SECOND PLANE MIRROR M1

|  | Rotation About X Axis | | Rotation About Y Axis | | Rotation About Z Axis | |
| --- | --- | --- | --- | --- | --- | --- |
|  | dX | dY | dX | dY | dX | dY |
| IP1 | 0 | −7.7 | 124.8 | 0 | −124.8 | 0 |
| IP2 | −19.9 | −56.1 | 185.5 | 191.7 | −185.5 | −191.7 |
| IP3 | −9.1 | −44.3 | 85.5 | 186.3 | −85.4 | −186.3 |
| IP4 | 19.9 | −56.1 | 185.5 | −191.7 | −185.5 | 191.7 |
| IP5 | 9.1 | −44.3 | 85.4 | −186.3 | −85.5 | 186.3 |

TABLE 8

PRESENT WORKING EXAMPLE:
FIRST AND SECOND PLANE MIRRORS M1, M2
ROTATED AS A SINGLE BODY

|  | Rotation About X Axis | | Rotation About Y Axis | | Rotation About Z Axis | |
| --- | --- | --- | --- | --- | --- | --- |
|  | dX | dY | dX | dY | dX | dY |
| IP1 | 0 | −10.9 | 18.1 | 0 | 231.5 | −0.1 |
| IP2 | 26.7 | −18.4 | 25.7 | 46.5 | 345.3 | 336.9 |
| IP3 | 12 | −1.4 | −1.1 | 21 | 172.1 | 351.6 |
| IP4 | −26.7 | −18.4 | 25.8 | −46.4 | 345.1 | −337 |
| IP5 | −12 | −1.4 | −1 | −20.9 | 171.9 | −351.7 |

As shown in Table 6 to Table 8 above, distortion of the image arises when the target member is rotated about the X axis. In addition, rotation of the image arises if the target member is rotated about the Y axis or if rotated about the Z axis. Among these, consider first rotation about the X axis. It can be seen that distortion of the image in the present working example (example of Table 8, Rotation About X Axis) is smaller than independent rotation of first plane mirror M1 (example of Table 6, Rotation About X Axis) and independent rotation of second plane mirror M2 (example of Table 7, Rotation About X Axis). In other words, since image distortion when first plane mirror M1 is independently rotated and image distortion when second plane mirror M2 is independently rotated tend to be in substantially the reverse directions, they are both canceled. Image distortion is thereby reduced in the present working example. This is because nearly no deviation occurs in the ray with respect to the ideal position and the amount of aberration generated is small, since the two optical axes Z1, Z3 do not mutually deviate even if plane mirrors M1, M2 deviate at the same angle.

For the case where plane mirrors M1, M2 are held as a single body, it is preferable to make the pivotal point midpoint K of second optical axis Z2 (line segment PQ). This is because, if the pivotal point is at midpoint K of second optical axis Z2 (line segment PQ), the axial distance from reticle R to wafer W does not change even if the holding member through which the pivotal point passes is rotated about the X axis. Therefore, almost no rotationally symmetric aberrations or magnification deviation occurs.

On that basis, it is preferable that distance KG between midpoint K of second optical axis Z2 (line segment PQ) and pivotal point C be small and, generally, it is preferable that it be within 0.2 times length PQ of second optical axis Z2, or:

$$KG \leq 0.2 \times PQ. \quad (5)$$

Condition (5) is satisfied in the present working example, since KG=30 mm and PQ=530 mm.

With continuing reference to FIG. 15a, pivotal point G is inside a holding member (e.g., barrel 302). The holding member can only provide support at an external surface thereof. Accordingly, a realistic support position for the holding member is in the vicinity of the plane that passes through midpoint K of second optical axis Z2 and is orthogonal to second optical axis Z2.

Now considered is rotation about the Y axis. It can be seen that rotation of the image in the present working example (example of Table 8, Rotation About Y Axis) is smaller than independent rotation of first plane mirror M1 (example of Table 6, Rotation About Y Axis) and independent rotation of second plane mirror M2 (example of Table 7, Rotation About Y Axis). In other words, since rotation of the image when first plane mirror M1 is independently rotated and rotation of the image when second plane mirror M2 is independently rotated tend to be in substantially the reverse directions, both are canceled and rotation of the image is reduced in the present working example.

Now considered is rotation about the Z axis. Rotation of the image is unfortunately generated to a great extent in the present working example (example of Table 8, Rotation About Z Axis) compared with independent rotation of first plane mirror M1 (example of Table 6, Rotation About Z Axis) and independent rotation of second plane mirror M2 (example of Table 7, Rotation About Z Axis).

However, since lens barrel 302 that holds plane mirrors M1, M2 as a single body has its direction of length in the Y direction, the amount of rotation about the Z axis (and amount of rotation about the X axis) can be easily controlled by strengthening support member 300 at the edge of the length direction of holding member H, and the like. Furthermore, since the direction of gravity is in the direction of the Z axis, the gravity balance of holding member H is not disturbed even if rotation about the Z axis occurs. Accordingly, based also on this point, the amount of rotation about the Z axis can be easily controlled.

As can be seen from the present working example, if the folding member is a surface reflecting mirror, holding is comparatively easy. In contrast, if an element like a beam splitter is included, it is unpreferable since the weight of the holding member increases and support of the holding member becomes comparatively difficult.

Furthermore, although second lens barrel 302 as a holding member supports only folding members M1, M2 in the fifth mode for carrying out the present invention, a lens (not shown in FIG. 15a) as a dioptric optical member may also be interposed between folding members M1, M2 held by second lens barrel 302. An example of such a case will be explained, referencing FIG. 16.

Figure 16A:
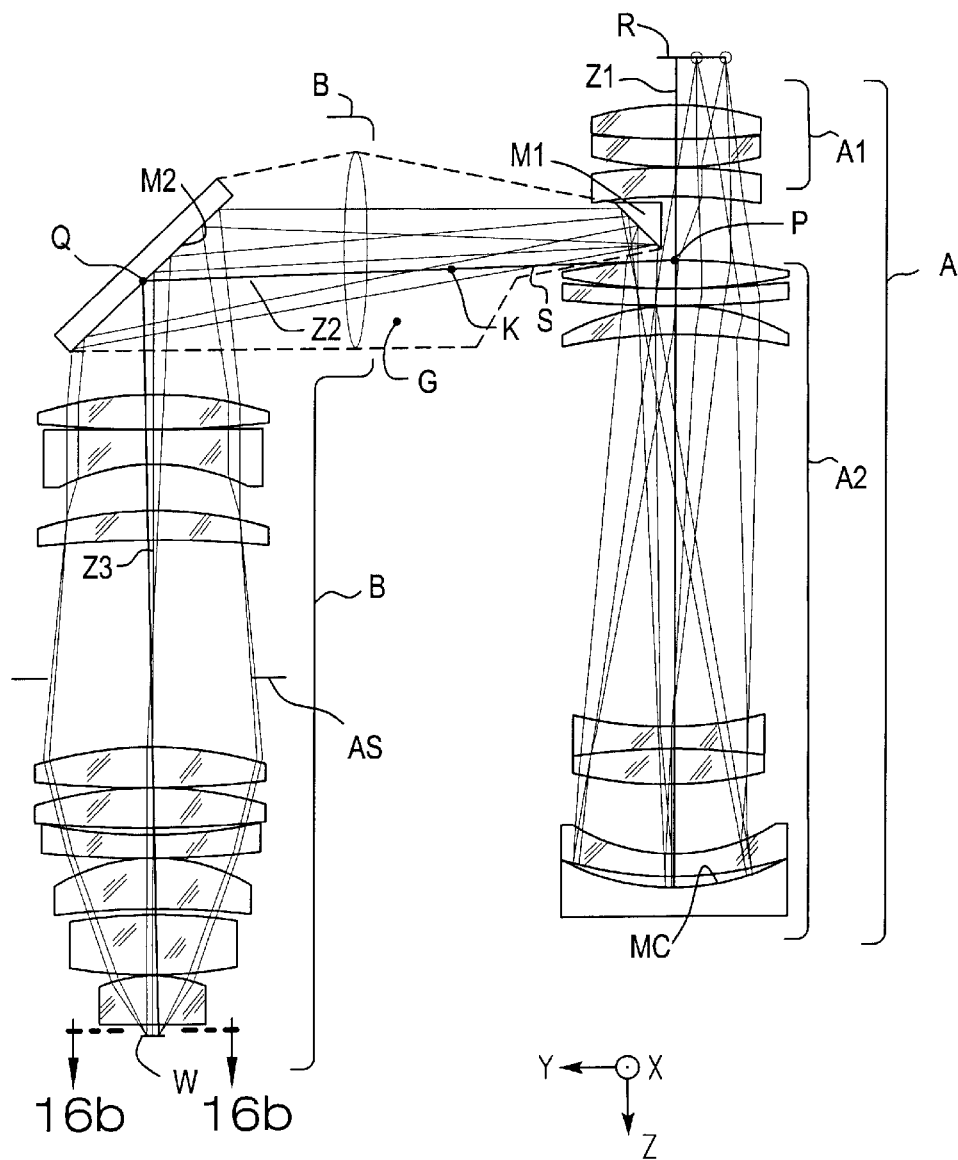
FIG. 16a is an optical path diagram of the projection optical system used in the catadioptric projection exposure apparatus according to a sixth mode for carrying out the present invention.

With reference now to FIG. 16a, which is an optical path diagram of the projection optical system C4 according to the sixth mode for carrying out the present invention, the principal points of difference from the projection optical system C3 of FIG. 15 mentioned earlier are that a lens L is arranged between plane mirrors M1, M2, and that the glass material of all lenses is quartz glass.

The following lists the principal specifications of projection optical system C4 according to the sixth mode for carrying out the present invention.

N.A. on wafer side: 0.65

Magnification: 0.25×

Working wavelength: 193.3 nm (ArF excimer laser)

Figure 16B:
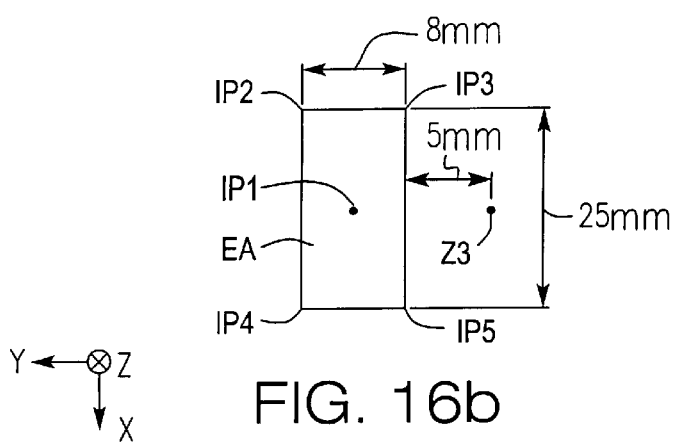

Exposure region EA is an oblong region measuring 25 mm in the longitudinal X direction and 8 mm in the horizontal Y direction, as shown in FIG. 16b.

Table 9 and Table 10 below list the specifications of the optical members projection optical system C4 according to the sixth mode for carrying out the present invention. Since the glass material of all lenses is quartz, such is omitted from Table 9. In addition, an optical surface to which an asterisk (*) is appended to the surface number in Table 9 indicates an aspherical surface, and the radius of curvature for aspherical surfaces in Table 9 indicates the vertex radius of curvature. The aspherical surface shape is represented by condition (a), above. For each aspherical surface, the conical coefficient κ is 0, and E and F among the aspherical coefficients are 0. Consequently, the aspherical surface data for Table 10 is not listed.

TABLE 9

SIXTH MODE FOR CARRYING OUT THE PRESENT INVENTION

| S | R | d | Re | Material | |
|---|---|---|---|---|---|
| 0 | ∞ | 52.5105 | | R | |
| 1 | 567.1430 | 40.1245 | 84.49 | A1 | |
| 2 | 3470.8704 | 2.2743 | 86.20 | | |
| 3 | 12580.6849 | 29.5354 | 86.34 | A1 | |
| 4 | 919.5973 | 2.0000 | 88.19 | | |
| 5 | 355.8404 | 35.8420 | 89.51 | A1 | |
| 6 | 645.8193 | 78.2133 | 89.37 | | |
| 7 | 523.4723 | 23.5558 | 95.17 | A2 | |
| 8 | −1724.9806 | 14.1444 | 94.91 | | |
| 9 | −544.7152 | 22.0000 | 94.37 | A2 | |
| 10 | −996.4488 | 0.5000 | 94.96 | | |
| 11 | 222.1244 | 22.0000 | 94.48 | A2 | |
| 12 | 285.0673 | 270.9667 | 91.66 | | |
| 13 | −448.3590 | 20.0001 | 69.82 | A2 | |
| 14 | 483.2437 | 7.1773 | 69.86 | | |
| 15 | 450.0000 | 27.4588 | 73.46 | A2 | |
| 16 | −581.8071 | 98.1108 | 77.12 | | |
| 17 | −164.5653 | 25.0000 | 97.01 | A2 | |
| 18 | −686.3758 | 18.1361 | 116.87 | | |
| 19 | −274.4169 | −18.1361 | 117.82 | A2 | MC |
| 20 | −686.3758 | −25.0000 | 117.22 | A2 | |
| 21 | −164.5653 | −98.1108 | 102.36 | | |
| 22 | −581.8071 | −27.4588 | 99.27 | A2 | |
| 23 | 450.0000 | −7.1773 | 98.55 | | |
| 24 | 483.2437 | −20.0001 | 96.16 | A2 | |
| 25 | −448.3590 | −270.9667 | 92.30 | | |
| 26 | 285.0673 | −22.0000 | 83.28 | A2 | |
| 27 | 222.1244 | −0.5000 | 84.79 | | |
| 28 | −996.4488 | −22.0000 | 82.76 | A2 | |
| 29 | −544.7152 | −14.1444 | 80.48 | | |
| 30 | −1724.9806 | −23.5558 | 79.87 | A2 | |
| 31 | 523.4723 | −0.5000 | 78.99 | | |
| 32 | ∞ | 255.9374 | | M1 | |
| 33 | 604.6543 | 31.2039 | 116.51 | B | L |
| 34 | −787.6549 | 200.0000 | 116.86 | | |
| 35 | ∞ | −152.7463 | | M2 | |
| 36 | −445.7714 | −30.0000 | 103.97 | B | |
| 37 | −10477.3479 | −0.5000 | 102.01 | | |
| 38* | −704.6939 | −24.4152 | 101.24 | B | |
| 39 | −217.6002 | −46.6658 | 96.30 | | |
| 40 | −262.5805 | −32.4068 | 100.37 | B | |
| 41 | −1345.5908 | −82.6445 | 98.92 | | |
| 42 | — | −47.7302 | 91.14 | AS | |
| 43 | −313.2008 | −39.4658 | 97.58 | B | |
| 44 | 584.6659 | −0.8283 | 97.17 | | |
| 45 | −473.1823 | −27.4850 | 94.61 | B | |
| 46 | 487.4609 | −8.0932 | 93.17 | | |
| 47 | 304.5680 | −25.0000 | 92.05 | B | |
| 48* | 1295.3943 | −0.6535 | 87.95 | | |
| 49 | −210.3586 | −42.6899 | 84.21 | B | |
| 50 | −716.6193 | −4.1246 | 76.28 | | |
| 51 | −240.1793 | −60.0000 | 72.13 | B | |
| 52 | 1038.2875 | −1.1901 | 55.47 | | |
| 53 | −280.1800 | −40.0000 | 50.65 | B | |
| 54 | −2803.1853 | −18.2145 | 34.10 | | |
| 55 | ∞ | | | W | |

TABLE 10

ASPHERICAL DATA OF THE SIXTH MODE FOR CARRYING OUT THE PRESENT INVENTION $38^{th}$ Surface $A = 2.1892 \times 10^{-8}$
$B = 2.7825 \times 10^{-13}$
$C = 1.4089 \times 10^{-18}$
$D = 6.4967 \times 10^{-23}$ $48^{th}$ Surface $A = -1.3381 \times 10^{-8}$
$B = 4.2757 \times 10^{-13}$

TABLE 10-continued

ASPHERICAL DATA OF THE SIXTH MODE FOR CARRYING OUT THE PRESENT INVENTION $$C = 4.5484 \times 10^{-18}$$
$$D = -2.4978 \times 10^{-22}$$

For comparative purposes, as in system C3 of FIGS. 15a and 15b, consider the case wherein plane mirrors M1, M2 are separately supported, and examine the distortion of the image when first plane mirror M1 is rotated and the distortion of the image when second plane mirror M2 is rotated. Subsequently, next examined is the distortion of the image when plane mirrors M1, M2 are rotated as a single body, based on the configuration of the present working example.

Table 11 shows the distortion of the image when first plane mirror M1 is independently rotated. The pivotal point is the point of intersection P of first optical axis Z1 and second optical axis Z2, and other conditions are the same as those in the fifth mode for carrying out the present invention.

Table 12 shows the distortion of the image when second plane mirror M2 is independently rotated. The pivotal point is the point of intersection Q of second optical axis Z2 and third optical axis Z3, and other conditions are the same as those above.

Table 13 shows the distortion of the image when plane mirrors M1, M2 are rotated as a single body. The pivotal point is point G located +50 mm the Z direction and −10 mm in the Y direction from midpoint K of second optical axis Z2 (line segment PQ), and other conditions are the same as those above. Furthermore, $$KG = [50^2 + (-10)^2]^{1/2} = 51$$

and since PQ is 487 mm, condition (5) is satisfied.

TABLE 11

COMPARATIVE EXAMPLE: ROTATION ONLY OF FIRST PLANE MIRROR M1

| | Rotation About X Axis | | Rotation About Y Axis | | Rotation About Z Axis | |
|---|---|---|---|---|---|---|
| | dX | dY | dX | dY | dX | dY |
| IP1 | 0 | −9.8 | −120.1 | 0 | 120.1 | 0 |
| IP2 | 63.4 | 20.4 | −176.2 | −150.2 | 176.3 | 150.1 |
| IP3 | 24.3 | 38.4 | −78.8 | −169.7 | 78.9 | 169.7 |
| IP4 | −63.4 | 20.4 | −176.3 | 150.1 | 176.2 | −150.2 |
| IP5 | −24.3 | 38.4 | −78.9 | 169.7 | 78.8 | −169.7 |

TABLE 12

COMPARATIVE EXAMPLE: ROTATION ONLY OF SECOND PLANE MIRROR M2

| | Rotation About X Axis | | Rotation About Y Axis | | Rotation About Z Axis | |
|---|---|---|---|---|---|---|
| | dX | dY | dX | dY | dX | dY |
| IP1 | 0 | 0.9 | 139.8 | 0 | −139.8 | 0 |
| IP2 | −38.4 | −32.3 | 206.8 | 201 | −206.7 | −210 |
| IP3 | −14.7 | −34.3 | 74.5 | 189.1 | −74.5 | −189.1 |
| IP4 | 38.4 | −32.3 | 206.7 | −201 | −206.8 | 201 |
| IP5 | 14.7 | −34.3 | 74.5 | −189.1 | −74.5 | 189.1 |

TABLE 13

PRESENT WORKING EXAMPLE: FIRST AND SECOND PLANE MIRRORS M1, M2 ROTATED AS A SINGLE BODY

| | Rotation About X Axis | | Rotation About Y Axis | | Rotation About Z Axis | |
|---|---|---|---|---|---|---|
| | dX | dY | dX | dY | dX | dY |
| IP1 | 0 | −31 | 19.7 | 0 | 259.9 | −0.1 |
| IP2 | 49.4 | −44.1 | 30.6 | 50.8 | 390.6 | 343.2 |
| IP3 | 41.8 | −12.6 | −4.2 | 19.4 | 160.9 | 355.8 |
| IP4 | −49.4 | −44.1 | 30.3 | −50.8 | 390.4 | −343.4 |
| IP5 | −41.8 | −12.6 | −4.5 | −19.4 | 160.7 | −355.9 |

As shown in Table 11 to Table 13 above, distortion of the image arises when the target member is rotated about the X axis. Rotation of the image arises if the target member is rotated about the Y axis or if rotated about the Z axis. Among these, first considered is rotation about the X axis. Substantially the same amount of image distortion is generated in the present working example (example of Table 13, Rotation About X Axis) as with independent rotation of first plane mirror M1 (example of Table 11, Rotation About X Axis) and with independent rotation of second plane mirror M2 (example of Table 12, Rotation About X Axis). This is because, since lens L is interposed between plane mirrors M1, M2, rays reflected by first plane mirror M1 are deviated by passing through lens L and subsequently impinge on second plane mirror M2. Consequently, aberrations are generated since the effect wherein the optical axis is undeviated is unfortunately lost.

The length direction of second lens barrel 302 is the Y direction, as mentioned previously. Hence, the amount of rotation about the X axis can be easily controlled by reinforcing the support member at the edge of the length direction of second lens barrel 302, and the like. Nevertheless, if holding plane mirrors M1, M2, which form a right angle as a single body, it is preferable that lens L not be provided therebetween. Even in the case where lens L is arranged, it is preferable to limit such to two members.

Next, consider rotation about the Y axis. It can be seen that rotation of the image in the present working example (example of Table 13, Rotation About Y Axis) is smaller than independent rotation of first plane mirror M1 (example of Table 11, Rotation About Y Axis) and independent rotation of second plane mirror M2 (example of Table 12, Rotation About Y Axis). In other words, since rotation of the image when first plane mirror M1 is independently rotated and rotation of the image when second plane mirror M2 is independently rotated tend to be in substantially the reverse directions, they are both canceled, and rotation of the image is thereby reduced in the present working example.

Next, consider rotation about the Z axis. A large rotation of image is generated in the present working example (example of Table 13, Rotation About Z Axis) compared with independent rotation of first plane mirror M1 (example of Table 11, Rotation About Z Axis) and independent rotation of second plane mirror M2 (example of Table 12, Rotation About Z Axis). However, as discussed above, the amount of rotation about the Z axis can be controlled easily.

As explained above, the fifth and sixth modes for carrying out the present invention reduce the amount of image distortion generated by rotation of the folding member and, accordingly, can obtain a stabilized high resolution.

Next, the seventh mode for carrying out the present invention will be explained, referencing FIG. 17 to FIG. 19a and 19b.

Figure 17:
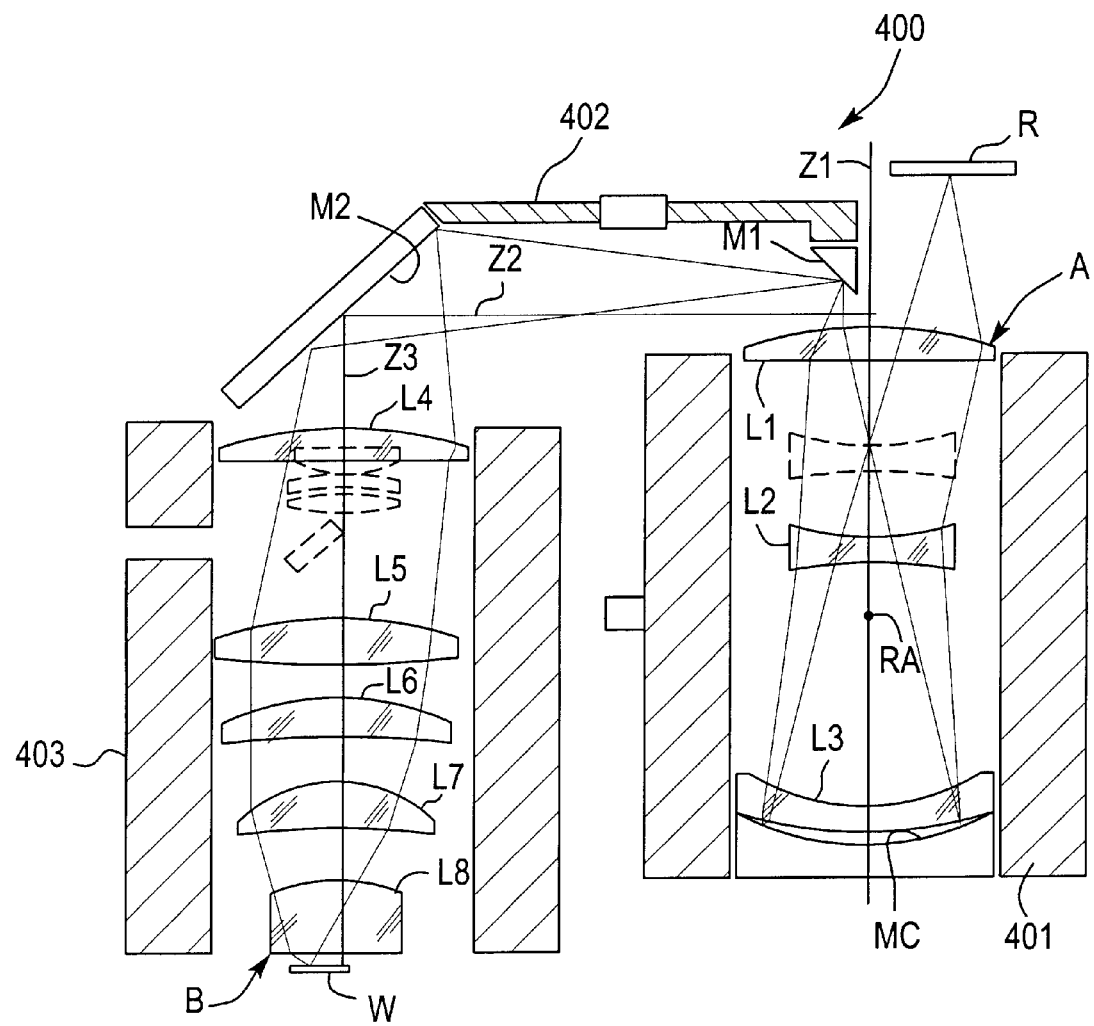
FIG. 17 is a schematic diagram of the configuration of the optical system according to the seventh mode for carrying out the present invention.

FIG. 17 shows a schematic of the configuration of a projection optical system 400 for implementing the alignment method and manufacturing method according to the seventh mode for carrying out the present invention. The seventh mode for carrying out the present invention is related to a relative alignment method-between a plurality of lens barrel axes and folding members in a catadioptric-type projection optical system having two folding members, and a manufacturing method for a projection optical system (optical system having folding members) that uses this alignment method.

In FIG. 17, the Z axis is set parallel to optical axis Z1 of first imaging optical system A, the Y axis is set parallel to the paper surface of FIG. 17 in a plane perpendicular to the Z axis, and the X axis is set perpendicular to the paper surface of FIG. 17 in a plane perpendicular to the Z axis. Furthermore, the YZ plane, which is the paper surface of FIG. 17, is a plane that includes optical axis Z 1 of first imaging optical system A and optical axis Z3 of second imaging optical system B.

Projection optical system 400 in FIG. 17 is provided with first imaging optical system A to form the intermediate image of the pattern based on the light from mask R, whereon a fine circuit pattern, for example, is formed. Second imaging optical system B to form a reduced image of the pattern onto wafer W, which is a photosensitive substrate, based on the light from the intermediate image. First folding mirror M1 arranged in the vicinity of the position where the intermediate image is formed, and to fold in the +Y direction the light that passes through first imaging optical system A. Second folding mirror M2 is provided to fold the light from first folding mirror M1 in the +Z direction toward second imaging optical system B.

First imaging optical system A comprises, in order from reticle R, three lens components L1 to L3 and concave reflecting mirror MC, shown by solid lines in the drawing. Furthermore, each of lens components L1 to L3 and concave reflecting mirror MC is arrayed inside cylindrical first lens barrel 401 along one optical axis Z1 parallel to the Z axis. Namely, optical axis Z1 of first imaging optical system A and the axis of first lens barrel 401 coincide.

On the other hand, second imaging optical system B comprises, in order from reticle R (namely, the second folding mirror side), five lens components L4 to L8, as shown by solid lines in the drawing. Furthermore, each of the lens components L4 to L8 is arrayed inside cylindrical second lens barrel 403 along one optical axis Z3 parallel to the Z axis. In other words, optical axis Z3 of second imaging optical system B and the axis of second lens barrel 403 coincide. In addition, optical axis Z3 of second imaging optical system B and optical axis Z1 of first imaging optical system A are mutually parallel.

Furthermore, first folding mirror M1 and second folding mirror M2 arranged in the optical path between first imaging optical system A and second imaging optical system B have reflecting surfaces inclined by just 45° with respect to optical axis Z1 and optical axis Z3 so that they are mutually opposing and so that they are orthogonal to the YZ plane (paper surface of FIG. 17) that includes optical axis Z1 of first imaging optical system A and optical axis Z3 of second imaging optical system B. In other words, the reflecting surface of first folding mirror M1 and the reflecting surface of second folding mirror M2 are mutually orthogonal, and the line of intersection formed extending along the two reflecting surfaces is parallel to the X axis. First folding mirror M1 and second folding mirror M2 are attached to a support body 402.

Thus, projection optical system 400 is a catadioptric-type optical system having two folding mirrors M1, M2, and has two lens barrels 401, 403 having different axes. According to another viewpoint, projection optical system 400 has three different optical axes, namely optical axis Z1 of first imaging optical system A, optical axis Z3 of second imaging optical system B, and third optical axis Z2 parallel to the Y axis. In the present mode for carrying out the present invention, optical axis Z2 is defined as the tracing of a ray entering along optical axis Z1 to the reflecting surface of first folding mirror M1 (strictly speaking, the extended surface of the effective reflecting region) aligned at a predetermined position. In addition, optical axis Z2 is likewise defined as the tracing of a ray entering along optical axis Z3 to the reflecting surface of second folding mirror M2 aligned at a predetermined position.

In projection optical system 400, the light from the pattern region decentered from optical axis Z1 in the −Y direction on reticle R positioned parallel to the XY plane is reflected by concave reflecting mirror MC via each of the lens components L1 to L3 that constitute first imaging optical system A. The latter then forms an intermediate image via each of the lens components L3 to L1. The light from the intermediate image is reflected in the +Y direction by the reflecting surface of first folding mirror M1, is then reflected in the +Z direction by the reflecting surface of second folding mirror M2 and is then guided to second imaging optical system B. The light guided to second imaging optical system B passes through each of the lens components L4 to L8, and then forms a reduced image of the mask pattern in the exposure region, decentered from optical axis Z3 in the +Y direction, on wafer W positioned parallel to the XY plane.

In projection optical system 400, as well as in the above mode for carrying out the present invention, first lens barrel 401 and second lens barrel 403 can be positioned with high precision so that the axis of first lens barrel 401 and the axis of second lens barrel 403 are mutually parallel and spaced apart by a predetermined spacing. In addition, first and second folding mirrors M1, M2 can be positioned with high precision with respect to support member 402 so that their reflecting surfaces are mutually orthogonal. Furthermore, the positioning of first and second folding mirrors M1, M2 is discussed later.

As discussed earlier, when positioning each of the optical members L1 to L3, MC with respect to first lens barrel 401, the axis of first lens barrel 401 and the optical axes of each of the optical members L1 to L3, MC of first imaging optical system A can be made to coincide with an accuracy in units of microns. Likewise, when positioning each of the optical members L4 to L8 with respect to second lens barrel 403, the axis of second lens barrel 403 and the optical axes of each of the optical members L4 to L8 of second imaging optical system B can be made to coincide with an accuracy in units of microns.

Accordingly, to position each of the optical members L1 to L8, MC, M1, M2 with high precision when manufacturing projection optical system 400, it is necessary to align the relative positions of folding mirrors M1, M2 and the two optical axes Z1, Z3 with high precision. In other words, the relative positions of first lens barrel 401 having an axis coincident with optical axis Z1, second lens barrel 403 having an axis coincident with optical axis Z3, and folding mirrors M1, M2 must be aligned with high precision. Specifically, folding mirrors M1, M2 must be aligned with high precision with respect to the two lens barrels 401, 403 so that, for example, the distance along optical axes Z I, Z2, Z3 from reference point RA, which is the center of first lens barrel 401, to reference point RB, which is the center of second lens barrel 403, is a predetermined length.

Figure 18A:
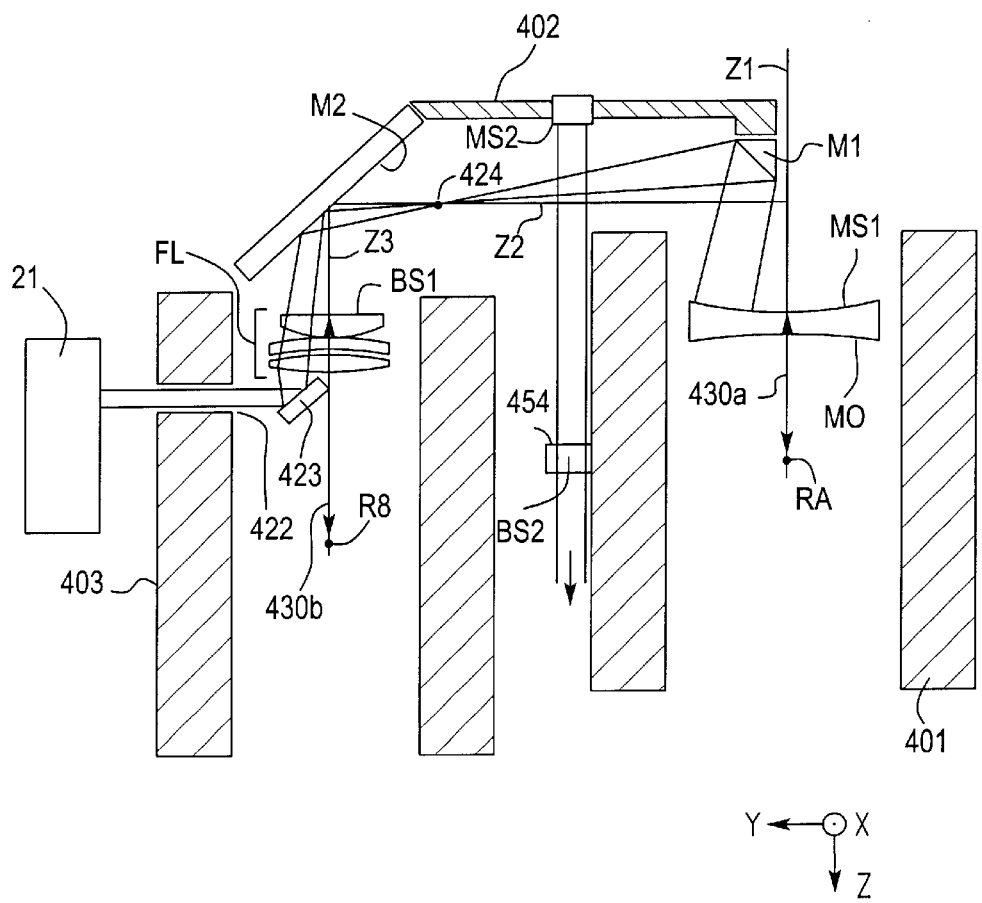
FIG. 18a is a schematic diagram illustrating the alignment method according to a seventh mode for carrying out the present invention.

FIG. 18a is a view that corresponds to FIG. 17, and is a drawing for explaining the alignment method of the seventh mode for carrying out the present invention.

FIG. 18a shows first lens barrel 401 and second lens barrel 403 already positioned with high precision. In the present mode for carrying out the present invention, folding mirrors M1, M2 are aligned with high precision with respect to first lens barrel 401 and second lens barrel 403 when manufacturing the projection optical system. Subsequently, the other optical members are positioned with respect to first lens barrel 401 and second lens barrel 403. Furthermore, the X axis, Y axis and Z axis in FIG. 18a are set in the same manner as in FIG. 17.

In the alignment method of the present working example, a concave reflecting mirror MO having a reflecting surface MS1 is attached at a predetermined position inside first lens barrel 401 so that the optical axis thereof coincides with the axis of first lens barrel 401 (and in turn, optical axis Z1), as shown in FIG. 18a. Accordingly, reflecting surface MS1 is formed as an aspherical surface and, in a state wherein concave reflecting mirror MO is attached to first lens barrel 401, faces the first folding mirror side.

As shown in FIG. 18a, a lens group FL as the optical element for adjustment is attached at a predetermined position inside second lens barrel 403 so that the optical axis thereof coincides with the axis of second lens barrel 403 (and in turn, optical axis Z3). The lens surface most on the second folding mirror side of lens group FL in a state wherein it is attached to second lens barrel 403 constitutes a reference surface BS1 as the Fizeau reference surface.

Techniques to make the optical axis of concave reflecting mirror MO and the axis of first lens barrel 401, as well as the optical axis of lens group FL and the axis of second lens barrel 403 coincide with an accuracy in units of microns, are widely known. In addition, radius of curvature R of reflecting surface MS1, and distance F along the optical axis from the focal point on the reference surface BS1 side of lens group FL to reference surface BS1 can be accurately pre-measured in accordance with the prior art. Furthermore, distance 403a along the optical axis from reference point RA to reflecting surface MS1, and distance 430b along the optical axis from reference point RB to reference surface BS1 can also be accurately measured based on prior art using, for example, a digital micrometer and the like.

In the present working example, concave reflecting mirror MO and lens group FL are respectively positioned with respect to first lens barrel 401 and second lens barrel 403 so that the relationship shown in condition (h) below holds.

$$LD=430a+430b+R+F. \tag{h}$$

Therein, LD is the design distance (distance specified based on the design) along the optical axis from reference point RA to reference point RB.

Accordingly, in the state wherein folding mirrors M1, M2 are accurately aligned with respect to first lens barrel 401 and second lens barrel 403, the focal point of concave reflecting mirror MO (namely, the point removed by just radius of curvature R along the optical axis from reflecting surface MS 1) and the focal point of lens group FL (namely, the point removed by just distance F along the optical axis from reference surface BS1) coincide. In other words, if a parallel light beam parallel to optical axis Z3 on the wafer side of lens group FL is guided to lens group FL in this state, the light beam that passes through lens group FL and second folding mirror M2 converges at point 424 on optical axis Z2 (namely, the focal point of lens group FL and the focal point of concave reflecting mirror MO). The divergent light beam from convergent point 424 passes through first folding mirror M1 and perpendicularly impinges upon concave reflecting mirror MO. The light beam reflected by reflecting surface MS1 of concave reflecting mirror MO reconverges at point 424 via first folding mirror M1 along an optical path completely the same as the going path, and then changes to a parallel light beam parallel to optical axis Z3 via second folding mirror M2 and lens group FL.

In other words, in the state wherein folding mirrors M1, M2 are accurately aligned with respect to first lens barrel 401 and second lens barrel 403, a predetermined interference fringe is obtained between the first light beam that returns after being reflected by reference surface BS1 without transmitting through reference surface BS1 of lens group FL and the second light beam that returns after transmitting through reference surface BS1 of lens group FL and being reflected by concave reflecting mirror MO. Accordingly, in the present working example, folding mirrors M1, M2 are aligned with respect to first lens barrel 401 and second lens barrel 403 based on the interference between the first light beam and the second light beam mentioned above. The following explains the detection of the interference between the first light beam and the second light beam, and the alignment of folding mirrors M1, M2.

First, the detection of the interference between the first light beam and the second light beam will be explained.

With continuing reference to FIG. 18a, parallel light supplied from interferometer 421 passes through opening 422 formed in second lens barrel 403, and is guided to the inside of second lens barrel 403. The parallel light beam guided to the inside of second lens barrel 403 is folded in the −Z direction by reflecting mirror 423 attached to the inside of second lens barrel 403, and enters lens group FL unchanged as parallel light. To make the convergent point of the parallel light beam that entered lens group FL coincident with the focal point of lens group FL (point on optical axis Z2), the parallel light beam parallel to optical axis Z3 must enter lens group FL. Accordingly, in addition to providing interferometer 421 with a function to detect the interference between the first light beam and the second light beam, it is provided with an adjustment function that injects into lens group FL the parallel light beam parallel to optical axis Z3.

Figure 18B:
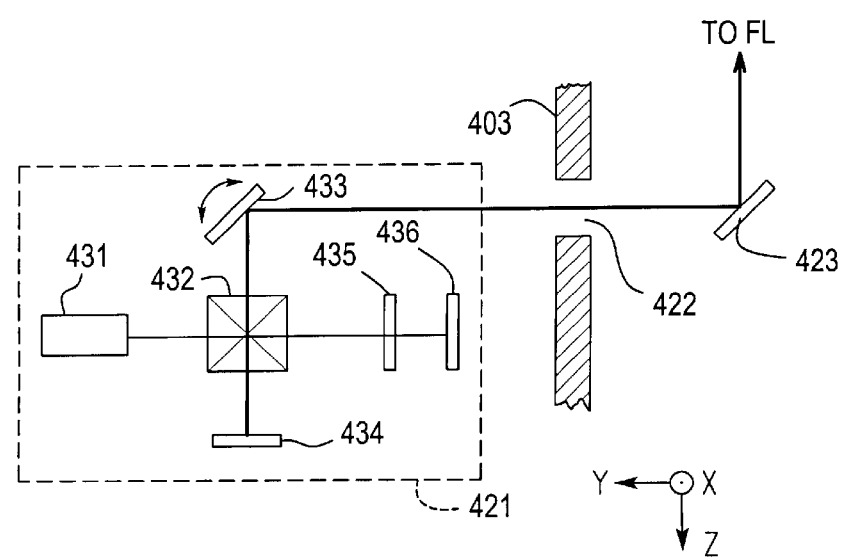

FIG. 18b shows the internal construction of interferometer 421 shown in FIG. 18a. As shown in FIG. 18b, interferometer 421 is provided with laser light source 431 that supplies coherent parallel light. First, when performing the incident adjustment of the parallel light beam, the light supplied from laser light source 431 is reflected in the −Z direction by beam splitter 432, and then impinges on adjustment reflecting mirror 433 rotatable about two axes. The light reflected in the −Y direction by adjustment reflecting mirror 433 enters lens group FL (not shown in FIG. 18b) via opening 422 formed in second lens barrel 403 and via reflecting mirror 423. The light reflected by reference surface BS1 of lens group FL impinges on beam splitter 432 via reflecting mirror 423 and adjustment reflecting mirror 433. The reflected light from reference surface BS1 that impinges on beam splitter 432 is transmitted through beam splitter 432, and then impinges on detector 434. Furthermore, the light that transmitted through reference surface BS1 of lens group FL is shaded by a shutter (not shown) installed in the optical path between, for example, lens group FL and second folding mirror M2.

Of the light supplied from laser light source 431, the light transmitted through beam splitter 432 passes through shutter 435 and then perpendicularly impinges on reflecting mirror 136. The light reflected by reflecting mirror 436 impinges on beam splitter 432 via shutter 435. The reflected light from reflecting mirror 436 that impinged on beam splitter 432 is reflected by beam splitter 432 and then impinges on detector 434. Thus, the interference fringe between the reflected light from reference surface BS1 and the reflected light from reflecting mirror 436 that functions as a Twyman mirror is detected at detector 434.

If the parallel light beam parallel to optical axis Z3 enters lens group FL, the parallel light beam perpendicularly impinges on reference surface BS1 of lens group FL. As a result, a predetermined interference fringe is detected in detector 434 between the reflected light from reference surface BS1 and the reflected light from reflecting mirror 436. By rotationally jogging adjustment reflecting mirror 433 based on the interference fringe detected in detector 434, the parallel light beam parallel to optical axis Z3 can be injected into lens group FL. In this manner, after performing the incident adjustment of the parallel light beam with respect to lens group FL, the interference between the first light beam and the second light beam is detected in a state wherein shutter 435 is closed.

In other words, when detecting the interference between the first light beam and the second light beam, the light supplied from laser light source 131 is reflected in the +Z direction by beam splitter 432 and then enters lens group FL via adjustment reflecting mirror 433 and reflecting mirror 123. The first light beam reflected by reference surface BS1 of lens group FL impinges on beam splitter 432 via reflecting mirror 123 and adjustment reflecting mirror 433. The first light beam, which is the reflected light from reference surface BS1 that impinged on beam splitter 432, is transmitted through beam splitter 432 and then impinges on detector 434.

Referring once again to FIG. 18A, the second light beam transmitted through reference surface BS1 of lens group FL is reflected by second folding mirror M2, converges once and impinges on concave reflecting mirror MO via first folding mirror M1. The second light beam reflected by reflecting surface MS1 of concave reflecting mirror MO converges once via first folding mirror M1, and then enters lens group FL via second folding mirror M2. The second light beam that enters lens group FL impinges on beam splitter 432 via reflecting mirror 123 and adjustment reflecting mirror 433. The second light beam, which is the reflected light from reflecting surface MS1 of concave reflecting mirror MO that impinged on beam splitter 432, is transmitted through beam splitter 432, and then impinges on detector 434. Thus, the interference fringe between the first light beam, which is the reflected light from reference surface BS1 as the Fizeau reference surface, and the second light beam, which is the reflected light from reflecting surface MS1, is detected at detector 434.

As discussed earlier, the focal point of concave reflecting mirror MO and the focal point of lens group FL coincide, in the state wherein folding mirrors M1, M2 are accurately aligned with respect to first lens barrel 401 and second lens barrel 403. Thus, the parallel light beam perpendicularly impinges reflecting surface MS1 of concave reflecting mirror MO. As a result, a predetermined interference fringe between the reflected light from reference surface BS1 and the reflected light from concave reflecting mirror MO is detected in detector 434. In other words, by jogging folding mirrors M1, M2 with respect to first lens barrel 401 and second lens barrel 403 based on the interference fringe detected in detector 434, folding mirrors M1, M2 can be accurately aligned with respect to first lens barrel 401 and second lens barrel 403.

Next, the alignment of folding mirrors M1, M2 with respect to first lens barrel 401 and second lens barrel 403 is explained.

In the present working example, folding mirrors M1, M2 are accurately positioned with respect to support body 402 so that the reflecting surface of first folding mirror M1 and the reflecting surface of second folding mirror M2 are orthogonal. In addition, reflecting surface MS2, which is parallel to the line of intersection between the reflecting surface of first folding mirror M1 and the reflecting surface of second folding mirror M2 accurately positioned so that they are orthogonal, is set with respect to support body 402. Positioning of folding mirrors M1, M2 and reflecting surface MS2 with respect to support body 402 is achieved easily with prior art that uses, for example, an autocollimator (apparatus that detects angular displacement of a reflecting mirror by collimated light). The following briefly explains the positioning of reflecting surface MS2 and folding mirrors M1, M2 with respect to support body 402, referencing FIG. 19a.

Figure 19A:
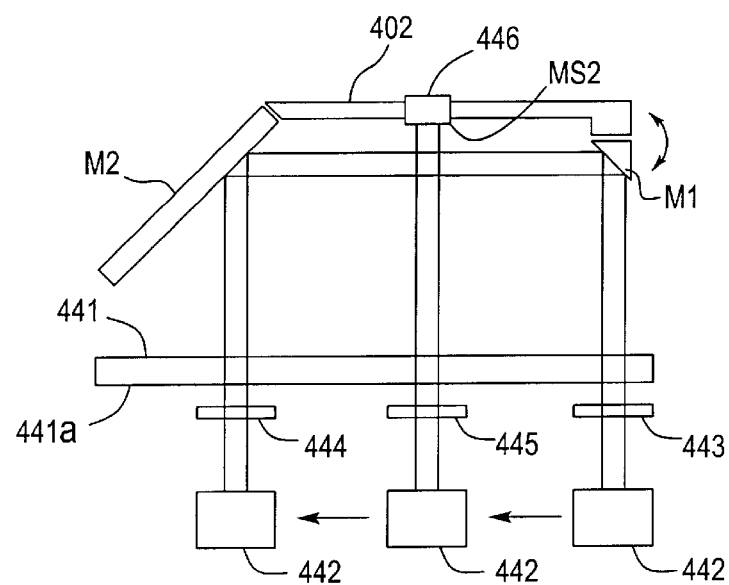
FIG. 19a is a diagram illustrating the positioning of the folding mirrors and reflecting surface with respect to the support body of the optical system of FIG. 17.

First, in FIG. 19a, folding mirrors M1, M2 are positioned with respect to support body 402 so that the reflecting surface of first folding mirror M1 and the reflecting surface of second folding mirror M2 are substantially orthogonal to a certain degree of accuracy. In this state, reflecting surface 441a of reflecting member 441 is positioned so that it is substantially parallel to a certain degree of accuracy to the line of intersection between the reflecting surface of first folding mirror M1 and the reflecting surface of second folding mirror M2. Then, autocollimator 442 is installed at a position to collimate the reflecting surface of first folding mirror M1, and first plane parallel plate 443 is set using autocollimator 442 so that it is parallel to reflecting surface 441a. Next, autocollimator 442 is moved to a position to collimate reflecting surface MS2 of reflecting member 446 attached to support body 402, and third plane parallel plate 445 is set using autocollimator 442 so that it is parallel to reflecting surface 441a. Last, autocollimator 442 is moved to a position to collimate the reflecting surface of second folding mirror M2, and second plane parallel plate 444 is set using autocollimator 442 so that it is parallel to reflecting surface 441a In this manner, first plane parallel plate 443, second plane parallel plate 444 and third plane parallel plate 445 are set mutually parallel at the required accuracy.

In this state, reflecting member 441 is removed from the optical path, and the light from autocollimator 442 impinges on second folding mirror M2 via second plane parallel plate 444. The light reflected by second folding mirror M2 is reflected by first folding mirror M1, and impinges on first plane parallel plate 443. The light reflected by first plane parallel plate 443 returns to autocollimator 442 via first folding mirror M1, second folding mirror M2 and second plane parallel plate 444. In this case, since plane parallel plates 443, 444 are arranged geometrically parallel, the reflecting surface of first folding mirror M1 and the reflecting surface of second folding mirror W can be made orthogonal with high precision if the plane parallel plates 443, 444 are set optically parallel by jogging first folding mirror M1. In addition, by moving autocollimator 442 again to the position to collimate reflecting surface MS2 of reflecting member 446, and by using autocollimator 442 to adjust reflecting surface MS2 of reflecting member 446 so that it is parallel to third plane parallel plate 445, reflecting surface MS2, which is parallel to the line of intersection between the reflecting surface of first folding mirror M1 and the reflecting surface of second folding mirror M2, can be set with high precision with respect to support body 402.

Generally, when performing alignment of first folding mirror M1 and second folding mirror M2 with respect to first lens barrel 401 and second lens barrel 403 by moving or rotating as a single body first folding mirror M1 and second folding mirror M2, which are set so that their reflecting surfaces are mutually orthogonal, first folding mirror M1 and second folding mirror M2 have five degrees of freedom for adjustment. Namely, these are movement (shift) in the Y direction, movement in the Z direction, rotation (tilt) about the X axis, rotation about the Y axis and rotation about the Z axis. In contrast, the focal point position deviation information obtained by interferometer 421, namely the relative positional deviation information of the focal point of lens group FL and the focal point of concave reflecting mirror MO, is of three types: positional deviation information in the x direction, positional deviation information in the y direction and positional deviation information in the z direction. Accordingly, z is the local coordinate along optical axes Z1 to Z2, and x and y are the local axes parallel to the paper surface of each drawing in a plane perpendicular to the z axis, and are perpendicular local coordinates. In the present mode for carrying out the present invention, by setting reflecting surface MS2, which is parallel to the line of intersection between the reflecting surface of first folding mirror M1 and the reflecting surface of second folding mirror M2, perpendicular to the axis of first lens barrel 801 along the Z axis, the number of degrees of freedom for adjustment needed with respect to first folding mirror M1 and second folding mirror M2 is reduced to three, comprising movement in the Y direction, movement in the Z direction, and rotation about the Z axis.

Setting reflecting surface MS2 perpendicular to the axis of first lens barrel 401 is easily achieved by the use of, for example, an autocollimator and the like. The following briefly explains the positioning of reflecting surface MS2 with respect to the axis of first lens barrel 401, referencing FIG. 17 and FIGS. 19a and 19b. In the present mode for carrying out the present invention, a plane parallel plate perpendicular to the axis of first lens barrel 401 is installed at the peripheral part of first lens barrel 401, and reflecting surface MS2 is positioned perpendicular to the axis of first lens barrel 401 by setting this plane parallel plate and reflecting surface MS2 parallel. Furthermore, since the two lens barrels 401, 403 are positioned so that the axis of first lens barrel 401 and the axis of second lens barrel 403 are mutually parallel, as discussed earlier, the only way to set reflecting surface MS2 perpendicular to the axis of second lens barrel 403 is by positioning reflecting surface MS2 with respect to the axis of first lens barrel 401. Accordingly, it is understood that a plane parallel plate perpendicular to the axis of second lens barrel 403 may be installed at the peripheral part of second lens barrel 403, and that this plane parallel plate and reflecting surface MS2 may be set parallel.

Figure 19B:
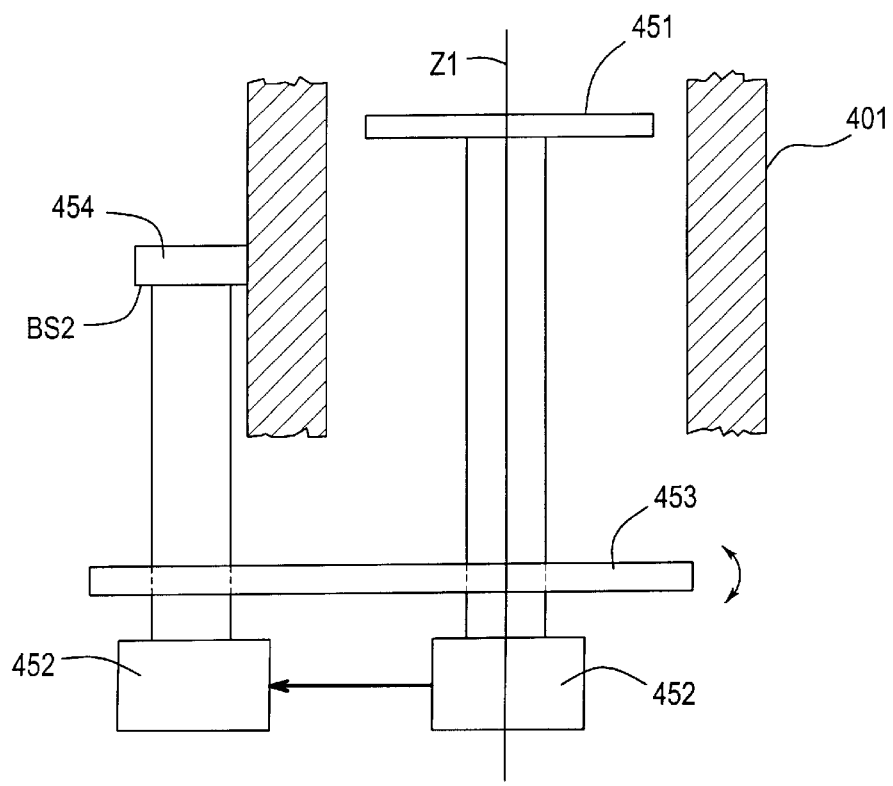
FIG. 19b is a diagram illustrating the positioning of the reflecting surface with respect to the axis of first lens barrel of the optical system of FIG. 17.

First, plane parallel plate 451 is positioned inside first lens barrel 401 along the axis thereof, as shown in FIG. 19B. Furthermore, the explanation related to the setting of plane parallel plate 451 perpendicular to the axis (optical axis Z1) of first lens barrel 401 is omitted. Then, autocollimator 452 is installed at a position to collimate plane parallel plate 451, and autocollimator 452 is used to set plane parallel plate 453 parallel to plane parallel plate 451.

Next, autocollimator 452 is moved to a position to collimate reflecting surface MS2 and, using autocollimator 452, plane parallel plate 154 is installed at the peripheral part of first lens barrel 401 so that it is parallel to plane parallel plate 453. In this state, plane parallel plate 453 is removed from the optical path, and support body 402 is positioned and adjusted (see FIG. 18A) using autocollimator 452 so that reflecting surface MS2 is parallel to reference surface BS2 of plane parallel plate 454.

In this manner, reflecting surface MS2 of support body 402 can be set perpendicular to the axis of first lens barrel 401 and the axis of second lens barrel 403 along the Z axis. Namely, reflecting surface MS2 of support body 402 can be set parallel to the XY plane. In other words, it can be set so that the light impinging on first folding mirror M1 along optical axis Z1 is reflected in the Y direction. As a result, the five degrees of freedom for adjustment, mentioned earlier, for first folding mirror M1 and second folding mirror M2 can be reduced to two degrees of freedom for adjustment, comprising rotation about the X axis and rotation about the Y axis. In other words, the three degrees of freedom comprising movement in the Y direction, movement in the Z direction and rotation about the Z axis, which correspond to the three types of positional deviation information comprising positional deviation information in the x direction, positional deviation information in the y direction and positional deviation information in the z direction, should each be independently adjusted.

Generally, the relationship shown in condition (i) below holds between change in wavefront aberration ΔW and wavefront deviations $\epsilon x$, $\epsilon y$, $\epsilon z$ between the first light beam, which is the reflected light from reference surface BS1, and the second light beam, which is the reflected light from reflecting surface MS1 of concave reflecting mirror MO, (as described in the reference by Kazumi Murata, entitled "*Optics*" Science Co., Section 1151):

$$\Delta W = [\epsilon_z/(8 \cdot (F_{FL})^2)] - [(\epsilon_x + \epsilon_y)/(2 \cdot F_{FL})] \qquad (i)$$

Therein, $F_{FL}$ is the F number of lens group FL as the Fizeau lens. In addition, $\epsilon x$, $\epsilon y$ and $\epsilon z$ are the positional deviations between the center of curvature of the wavefront of the first light beam and the center of curvature of the wavefront of the second light beam in the local coordinate system x, y, z; namely, the wavefront deviations.

Referring to condition (i), the smaller (brighter) the F number $F_{FL}$ of lens group FL, the greater is the detection sensitivity of wavefront deviations $\epsilon x$, $\epsilon y$, $\epsilon z$. For example, if the change in wavefront aberration ΔW that is detectable in the interferometer is 0.1 $\mu$m, by setting the value of F number $F_{FL}$ of lens group FL to less than 4, the wavefront deviations can be adjusted with an accuracy in units of microns and, in turn, folding mirrors M1, M2 can be aligned with respect to lens barrels 401, 403 with an accuracy in units of microns. If F number $F_{FL}$ of lens group FL exceeds 4, the alignment accuracy becomes larger than 10 microns, which is unsuitable as the alignment accuracy in a projection optical system of a projection exposure apparatus. By further preferably setting the value of F number $F_{FL}$ of lens group FL to less than 3, alignment of higher accuracy can be realized.

As described above, first and second folding mirrors M1, M2 in the present working example can be aligned with high precision with respect to first lens barrel 401 and second lens barrel 403 by jogging first folding mirror M1 and second folding mirror M2 as a single body so that the focal length of the concave reflecting mirror MO installed inside first lens barrel 401 and the focal length of lens group FL installed inside second lens barrel 403 coincide. In other words, third optical axis Z2, specified by the arrangement of first and second folding mirrors M1, M2, can be aligned with high precision with respect to optical axis Z1 of first lens barrel 401 and optical axis Z3 of second lens barrel 403.

After first and second folding mirrors M1, M2 have been aligned with high precision with respect to first lens barrel 401 and second lens barrel 403 in the present mode for carrying out the present invention, manufacture of the optical system is completed by positioning each optical member in first lens barrel 401 and second lens barrel 403. Namely, as shown in FIG. 17, after concave reflecting mirror MO has been removed from first lens barrel 401 and lens group FL has been removed from second lens barrel 403, each of the optical members L1 to L3, MO is positioned inside and along the axis (namely, Z1) of first lens barrel 401 based on reference point A, and each of the optical members L3 to L8 is positioned inside and along the axis (namely, Z3) of second lens barrel 403 based on reference point B.

The assembly with high precision of each of the optical members inside each of the lens barrels while making the optical axis of each of the optical members coincide with an accuracy in units of microns with respect to the axis of first lens barrel 401 and the axis of second lens barrel 403 is well known in the prior art, and redundant explanation is herein omitted.

Thus, in an optical system having a folding member according to the present mode for carrying out the present invention, the relative position of a plurality of lens barrels and a folding member having different axes, namely the relative position between each optical axis and the folding member, can be aligned with high precision and, as a result, an optical system having a folding member can be manufactured with high precision.

In the mode for carrying out the present invention discussed above, the present invention is applied to an alignment method and manufacturing method of a catadioptric-type projection optical system. Nevertheless, the need to perform with high precision the alignment of the relative position between a folding member and a plurality of lens barrels (in turn, a plurality of optical axes) is not limited to a catadioptric-type projection optical system, and is generally common to an optical system having a folding member. In other words, the present invention can be applied in the same manner as the working example described above even if a plurality of catoptric optical systems comprising only catoptric optical members like concave reflecting mirrors are optically connected via one or a plurality of folding members, or if a plurality of dioptric optical systems comprising only dioptric optical members are optically connected via one or a plurality of folding members.

In addition, in the mode for carrying out the present invention discussed above, the present invention is applied to an optical system wherein two lens barrels are arranged via two folding members. However, it will be understood that the present invention could also be applied to an optical system wherein a plurality of lens barrels are arranged via one or three or more folding members.

In the working example discussed above, concave reflecting mirror MO is installed inside first lens barrel 401 and lens group FL is installed inside second lens barrel 403. However, lens group FL may be installed in first lens barrel 401 and concave reflecting mirror MO may be installed inside second lens barrel 403.

The present mode for carrying out the present invention discussed above takes into consideration ease of adjustment, ease of ensuring the required accuracy and the like, makes the axis of first lens barrel 401 and the optical axis of concave reflecting mirror MO coincide and makes the axis of second lens barrel 403 and the optical axis of lens group FL coincide. In addition, reference point RA and the center of first lens barrel 401 are made to coincide, and reference point RB and the center of second lens barrel 403 are made to coincide. Nevertheless, reference points RA, RB are not necessarily set on the axis of first lens barrel 401 and the axis of second lens barrel 403, and can be set to an arbitrary positional relationship with respect to first lens barrel 401 and second lens barrel 403. In addition, the optical axis of concave reflecting mirror MO and the optical axis of lens group FL are not necessarily made to coincide with the axis of first lens barrel 401 and the axis of second lens barrel 403.

In the working example discussed above, the positional deviation between the focal point of lens group FL and the focal point of concave reflecting mirror MO is adjusted based on the interference between the first light beam and the second light beam detected by the interferometer. Nevertheless, the positional deviation between the focal point of lens group FL and the focal point of concave reflecting mirror MO can be detected based on the positional deviation between the convergent point of the first light beam and the convergent point of the second light beam, without the use of an interferometer, and mirrors M1, M2 can subsequently be aligned with respect to lens barrels 401, 403.

Furthermore, when detecting the interference between the first light beam and the second light beam in the working example discussed above, lens group FL that functions as a Fizeau lens is installed inside second lens barrel 403. Nevertheless, a zone plate having a known focal length can be used in place of lens group FL. In this case, the pattern surface of the zone plate comprises reference surface BS1.

According to the seventh mode for carrying out the present invention as discussed above, in an optical system having a folding member, the relative position between a plurality of lens barrels and the folding member having different axes, namely the relative position between each optical axis and the folding member, can be aligned with high precision. Furthermore, an optical system having a folding member can be manufactured with high precision using this alignment method.

Figure 20:
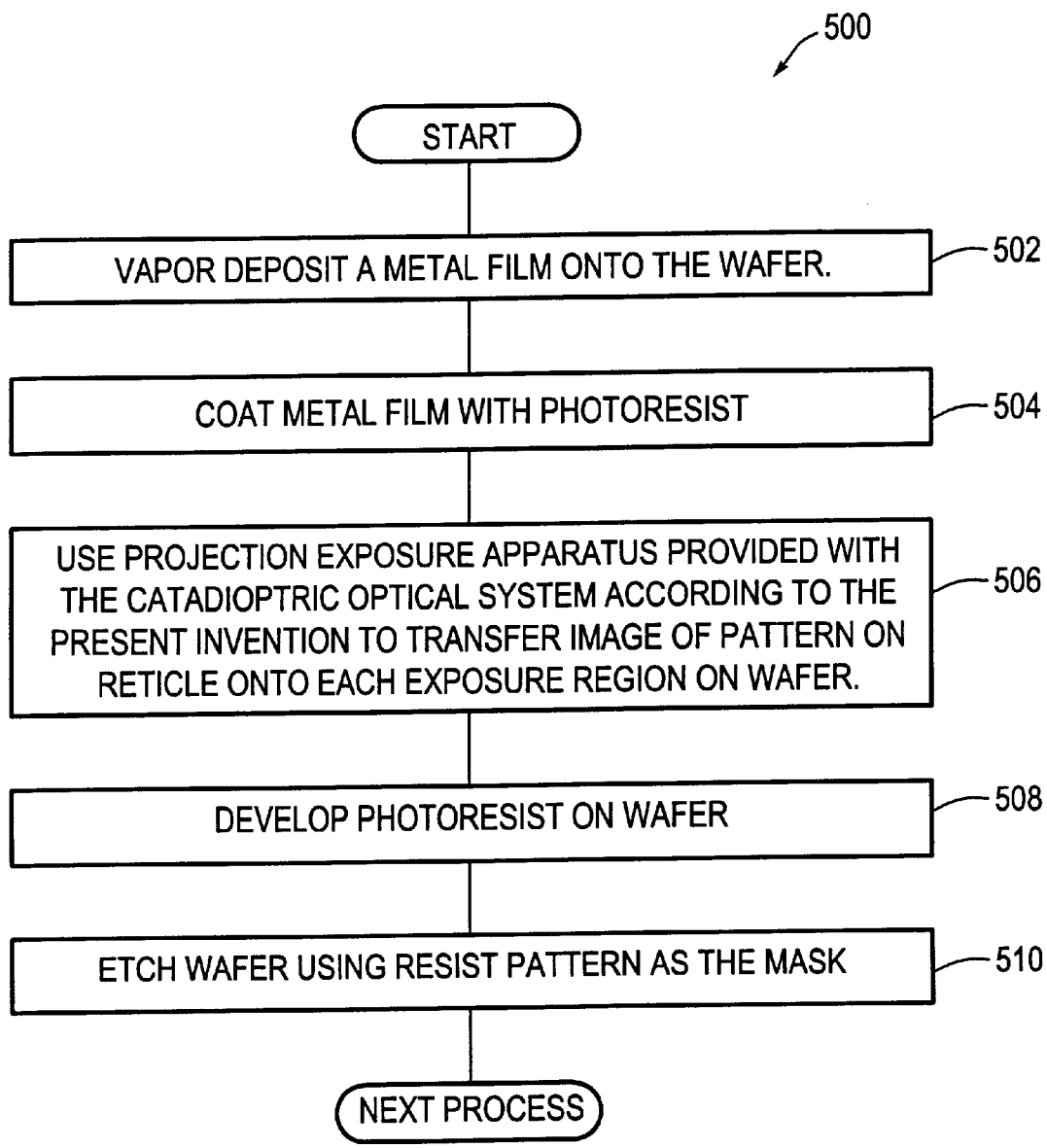
FIG. 20 is a flowchart setting forth the steps for carrying out a device manufacturing method according to one mode of the present invention.

Next, a method of forming a predetermined circuit pattern on a wafer using the projection exposure apparatus according to the present invention is explained, referencing flowchart 500 in FIG. 20.

First, in Step 502, a metal film is vapor deposited onto one lot of wafers. Next, in Step 504, photoresist is coated onto the metal film on the wafers of the first lot. Subsequently, in Step 503, using a projection exposure apparatus according to one of the configurations of the above modes for carrying out the present invention, the image of the pattern on reticle R is successively exposed and transferred onto each exposure region on the wafers of that one lot. Afterwards, in Step 508, the photoresist on the wafers of that one lot is developed and then, in Step 510, the circuit pattern corresponding to the pattern on reticle R is formed in each exposure region on each wafer by etching with the resist pattern on the wafers of that one lot as the masks. Subsequently, devices like semiconductor devices having extremely fine circuits are manufactured by further forming circuit patterns of upper layers, and the like.

Ultraviolet light having a wavelength of 100 nm or greater, for example, far ultraviolet (DUV) light like the g-line, the i-line or a KrF excimer laser, or vacuum ultraviolet (VUV) light like an ArF excimer laser or an $F_2$ laser (wavelength of 157 nm) can be used as the exposure illumination light in the above modes for carrying out the present invention. In a scaning-type exposure apparatus that uses an $F_2$ laser as the light source, a catadioptric optical system is employed as the projection optical system, as in the above modes for carrying out the present invention, the dioptric optical members (lens elements) used in the illumination optical system or projection optical system are all made of fluorite ($CaF_2$), the air inside the $F_2$ laser light source, the illumination optical system and the projection optical system is replaced with helium gas, and the space between the illumination optical system and the projection optical system and the space between the projection optical system and the wafer are also filled with helium gas. In addition, in an exposure apparatus that uses an $F_2$ laser, a reticle is used that is made of at least one of fluorite, synthetic quartz doped with fluorine, magnesium fluoride or crystalline quartz. Furthermore, as the dioptric optical member used in the projection optical system, at least one type among the following materials can be used: fluorine crystal materials like fluorite (calcium fluoride), barium fluoride (BaF), lithium fluoride (LiF), magnesium fluoride ($MgF_2$), lithium calcium aluminum fluoride ($LiCaAlF_6$), lithium strontium aluminum fluoride ($LiSrAlF_6$) and crystalline quartz; synthetic quartz doped with fluorine and quartz doped with germanium, and the like.

The higher harmonics of a solid state laser like a YAG laser having an oscillation spectrum in, for example, one of the wavelengths of 248 nm, 193 nm or 157 nm, may be used in place of an excimer laser.

In addition, higher harmonics may also be used wherein a laser of a single wavelength in the visible region or infrared region oscillated from a DFB semiconductor laser or a fiber laser is amplified by a fiber amplifier doped with, for example, erbium (or, both erbium and indium), and the wavelength is then transformed to ultraviolet light using a non-linear optical crystal.

For example, if the oscillation wavelength of a single wavelength laser is in the range of 1.51 to 1.59 μm, then the eighth harmonic, that generates wavelengths in the range of 189 to 199 nm, or the tenth harmonic, that generates wavelengths in the range of 451 to 159 nm, is output. In particular, if the oscillated wavelength is set within the range of 1.544 to 1.553 μm, then the eighth harmonic in the range of 193 to 194 nm, namely ultraviolet light of substantially the same wavelength as an ArF excimer laser, is obtained. If the oscillation wavelength is set in the range of 1.57 to 1.58 μm, then the tenth harmonic in the range of 157 to 158 nm, namely ultraviolet light of substantially the same wavelength as an $F_2$ laser, is obtained.

If the oscillation wavelength is set in the range of 1.03 to 1.12 μm, then the seventh harmonic, that generates wavelengths in the range of 147 to 160 nm, is output. In particular, if the oscillation wavelength is set in the range of 1.099 to 1.106 μm, then the seventh harmonic, that generates wavelengths in the range of 157 to 158 nm, namely ultraviolet light of substantially the same wavelength as an $F_2$ laser, is obtained. An yttrium doped fiber laser may be used as the single wavelength oscillation laser.

The wavelength of the exposure illumination light in the above modes for carrying out the present invention is naturally not limited to 100 nm or greater. For example, to expose a pattern with less than 70 nm wavelength light, EUV (extreme ultraviolet) light in the soft X-ray region (for example, the 5 to 15 nm wavelength region) is generated using an SOR or a plasma laser as the light source, an EUV exposure apparatus is being developed that uses a -catoptric-type reduction optical system and a catoptric-type mask designed based on such an exposure wavelength (for example, 13.5 nm). Since a construction wherein a folding member is applied to a catoptric-type reduction optical system is also conceivable in this apparatus, this apparatus is also included in the range of application of the present invention. The projection optical system may use not only a reduction system, but also a unity magnification system or an enlargement system (for example, an exposure apparatus and the like for manufacturing liquid crystal displays).

The present invention can be applied not only to exposure apparatuses used in the manufacture of semiconductor devices, but also to exposure apparatuses used in the manufacture of displays that include liquid crystal displays and the like, those used in the manufacture of thin film magnetic heads and exposure apparatuses that transfer a display pattern onto a glass plate, and those used in the manufacture of image pickup devices (CCDs and the like) and exposure apparatuses that transfer a device pattern onto a ceramic wafer. In addition, the present invention can be applied to exposure apparatuses that transfer a circuit pattern onto a glass substrate or silicon wafer and the like in order to manufacture a reticle or a mask.

As described above, the present invention is not limited to the abovementioned modes for carrying out the present invention, and it is understood that various configurations can be obtained in a range that does not depart from the purport of the present invention.

What is claimed is:

1. A projection exposure apparatus for exposing a mask having a patterned surface onto a substrate having a photosensitive surface, comprising along an optical axis:

a) an illumination optical system;

b) a reticle stage adjacent said illumination optical system and capable of holding the reticle so that the normal line of the patterned surface is substantially in the direction of gravity;

c) a substrate stage capable of holding the substrate so that the normal line of said photosensitive surface is substantially in said direction of gravity;

d) a projection optical system arranged between said reticle stage and said substrate stage and comprising:
  (i) a first imaging optical system comprising a concave reflecting mirror and a refractive optical member arranged along a first optical axis, designed so as to form an intermediate image of the patterned surface;
  (ii) a second imaging optical system having a second optical axis that forms a reduced image of said intermediate image onto the photosensitive surface;
  (iii) a first folding member arranged in the optical path from said first imaging optical system to said second imaging optical system, and provided with a reflecting surface having a reflective region that is substantially planar;
  (iv) a second folding member arranged between said first folding member and said second imaging optical system, and provided with a reflecting surface having a reflecting region that is substantially planar; and e) wherein said first and second imaging optical systems and said first and second folding members are positioned so that said reduced image is formed in a plane parallel to the patterned surface of the reticle, said first and second optical axes are positioned so that they are substantially parallel to the direction of gravity, and an optical path between said first and second folding members having no lenses.

2. A projection exposure apparatus according to claim 1, wherein:

a) said second imaging optical system includes a 2-1th lens group having a positive refractive power, an aperture stop arranged between said 2-1th lens group and said reduced image, and a 2-2th lens group arranged between said aperture stop and said reduced image; and b) said 2-1th lens group and said 2-2th lens group each have at least one aspherical surface.

3. A projection exposure apparatus according to claim 2, wherein:

a) said at least one aspherical surface of said second imaging optical system has a cross-sectional shape that includes the optical axis of a rotationally symmetric aspherical surface having a paraxially negative refractive power and includes a first and second inflection point facing from the optical axis to a lens periphery with respect to an approximate spherical surface, wherein said first inflection point is on the optical axis, said cross-sectional shape from said optical axis to said second inflection point has a curvature less than the curvature of said approximate spherical surface, and said cross-sectional shape from said second inflection point to said lens periphery has a curvature greater than said approximate spherical surface curvature.

4. A projection exposure apparatus according to claim 2, wherein:

a) said first imaging optical system forms said intermediate image in the optical path between said first folding member and said first imaging optical system; and b) the following condition is satisfied:

$$LF1/S1>0.002,$$

wherein LF1 is the distance between the intermediate image plane and the effective region of the first folding member, and S1 is the area of the first effective region.

5. The projection exposure apparatus according to claim 4, satisfying the following condition:

$$LO2/(c1+c2)>0.7$$

wherein c1 is a maximum effective diameter among effective diameters of optical members constituting said first imaging optical system, c2 is a maximum effective diameter among effective diameters of optical members constituting said second imaging optical system, and LO2 is the distance between said first optical axis and said second optical axis.

6. The projection exposure apparatus according to claim 5, wherein said cross-sectional shape of said at least one aspherical surface includes the optical axis of the rotationally symmetric aspherical surface having a paraxially negative refractive power has a first and second inflection point facing from the optical axis to said lens periphery with respect to an approximate spherical surface, wherein said first inflection point is on the optical axis, and said cross-sectional shape from said optical axis to said second inflection point has a curvature less than the curvature of said approximate spherical surface, and said cross-sectional shape from said second inflection point to said lens periphery has a curvature greater than said approximate spherical surface curvature.

7. A projection exposure apparatus according to claim 6, further comprising:

a) an exposure region having one of an arcuate shape and a rectangular shape, wherein said exposure region does not include the optical axis of said second imaging optical system.

8. A projection exposure apparatus according to claim 1, wherein:

a) said first imaging optical system forms said intermediate image in the optical path between said first folding member and said first imaging optical system; and b) the following condition is satisfied:

$$LF1/S1>0.002$$

wherein LF1 is the distance between the intermediate image plane and said effective region of said first folding member, and S is the area of said first effective region.

9. A projection exposure apparatus according to claim 1, wherein said first and second imaging optical systems each comprise a plurality of optical members each having an effective diameter, and wherein the apparatus satisfies the following condition:

$$LO2/(c1+c2)>0.7$$

wherein C1 is a maximum effective diameter among said effective diameters of said plurality of optical members comprising said first imaging optical system, wherein c2 is a maximum effective diameter among said effective diameters of said plurality of optical members comprising said first imaging optical system, and LO2 is the distance between said first optical axis and said second optical axis.

10. A projection exposure apparatus according to claim 1, further comprising:

a) an exposure region having one of an arcuate shape and a rectangular shape, wherein said exposure region does not include the optical axis of said second imaging optical system.

11. A method for exposing a pattern on a reticle onto a substrate, comprising the steps of:

a) illuminating the reticle;

b) projecting an image of the reticle with the projection exposure apparatus of claim 1, and exposing the substrate over an exposure region having one of a slit-shape and arcuate shape, wherein said exposure region does not include the optical axis of said second imaging optical system; and c) simultaneously scanning said reticle stage and said substrate stage.

12. A projection exposure apparatus capable of transferring a pattern on a reticle onto a workpiece, comprising:

a) a catadioptric projection optical system having an optical member that includes a refracting optical member, a reflecting mirror having curvature, and at least two folding members, b) wherein said catadioptric projection optical system includes at least three optical axes and at least three lens barrels;

c) said at least three lens barrels each hold at least one optical member among said optical members; and d) wherein at least one lens barrel among said at least three lens barrels holds two folding members among said at least two folding members so that the optical axes before and after being folded by said two folding members are mutually parallel.

13. The projection exposure apparatus according to claim 12, wherein a lens barrel separate from said at least one lens barrel among said at least three lens barrels holds an optical member different from said folding member.

14. The projection exposure apparatus according to claim 13, further including a frame that independently supports each of said at least three lens barrels.

15. The projection exposure apparatus according to claim 14, wherein said separate lens barrel is supported by said frame in a predetermined plane, wherein said predetermined plane is substantially the plane wherein the spacing from an object plane to an image plane of the entire said optical member is internally divided by a ratio of 1:(−β), wherein β is the imaging magnification of the entire said optical member held by said separate lens barrel.

16. The projection exposure apparatus according to claim 13, wherein said separate lens barrel is supported by said frame in a predetermined plane, wherein said predetermined plane is substantially the plane wherein the spacing from the object plane to the image plane of the entire said optical member is internally divided by a ratio of 1:(−β), wherein β is the imaging magnification of the entire said optical member held by said separate lens barrel.

17. The projection exposure apparatus according to claim 12, wherein said at least one lens barrel holds only said folding member.

18. The projection exposure apparatus according to claim 12, wherein said at least three optical axes are each arranged one of either parallel or perpendicular to the direction of gravity.

19. A projection exposure apparatus that forms an image of a first surface onto a second surface, comprising:
  a) a projection optical system having one or more folding members, two or more optical axes, and a plurality of optical members,
  b) wherein said optical members are arranged on each of said optical axes and are held by a plurality of barrels provided corresponding to each of said two or more optical axes,
  c) wherein at least one of said barrels is provided with at least one of adjustment apparatus capable of inclining said optical axis corresponding to said barrel, and an adjustment apparatus capable of translating said barrel in the direction of said optical axis corresponding to said barrel.

20. A projection exposure apparatus according to claim 19, further including a frame that holds each of said barrels, wherein at least one of said barrels is removable with respect to said frame.

21. A projection exposure apparatus according to claim 20, wherein said barrel provided with said adjustment apparatus does not hold an optical member arranged immediately after said first surface, does not hold an optical member arranged immediately before said second surface, and holds one or more of said folding members.

22. A projection exposure apparatus according to claim 21, wherein the one of said lens barrels has the least weight, including the weight of optical elements held therein, and is provided with said adjustment apparatus.

23. The projection exposure apparatus according to claim 19, wherein said lens barrel provided with said adjustment apparatus does not hold an optical member arranged immediately after said first surface, does not hold an optical member arranged immediately before said second surface, and holds one or more of said folding members.

24. A projection exposure apparatus according to claim 19, wherein the one of said lens barrels has the least weight, including the weight of optical elements held therein, and is provided with said adjustment apparatus.

25. A projection exposure apparatus that forms an image of a first surface onto a second surface , comprising:
  a) a projection optical system having lenses and a concave mirror, for forming the image of the first surface onto the second surface;
  b) wherein at least five lens assemblies among said lenses are arranged so as to be inclinable with respect to an optical axis.

26. A projection exposure apparatus that forms an image of a first surface onto a second surface, comprising:
  a) a projection optical system having lenses and a concave mirror, for forming the image of the first surface onto the second surface;
  b) wherein at least five lens elements among said lenses are arranged so as to be inclinable with respect to an optical axis.

27. The projection exposure apparatus according to claim 25, wherein said projection optical system has two or more optical axes, said lenses arranged on each optical axis and held by one or more barrels provided one along each optical axis, each barrel comprising one or more lens barrel units, and wherein said each of said five lens assemblies are arranged in a separate one of said lens barrel units.

28. The projection exposure apparatus according to claim 26, wherein said projection optical system has two or more optical axes, said lenses arranged on each optical axis and held by one or more barrels provided one along each optical axis, each barrel comprising one or more lens barrel units, and wherein said each of said five lens elements are arranged in a separate one of said lens barrel units.

29. The projection exposure apparatus according to claim 27, wherein each of said five lens assemblies are movable along the optical axis direction.

30. The projection exposure apparatus according to claim 28, wherein each of said five lens elements are movable along the optical axis direction.

31. The projection exposure apparatus according to claim 25, wherein each of said five lens assemblies are movable along the optical axis direction.

32. The projection exposure apparatus according to claim 26, wherein each of said five lens elements are movable along the optical axis direction.

33. A projection exposure apparatus for forming an image of a first surface onto a second surface, comprising:
  a) a projection optical system having a lens, a concave mirror, a folding member and two or more optical axes;
  b) two or more optical members, with a single one of said optical members arranged along each of said two or more optical axes, each said single optical member held by a barrel provided along each of said two or more optical axes;
  c) wherein each of said barrels includes one or more lens barrel units each having one or more lens assemblies designed so as to be inclinable and translatable with respect to the optical axis; and
  d) wherein at least one of said barrels is provided with at least one adjustment apparatus capable of inclining and translating said at least one barrel with respect to the optical axis passing therethrough.

34. A method of adjusting a projection exposure apparatus for forming an image of a first surface onto a second surface, where the apparatus comprises a projection optical system having a lens, a concave mirror, a folding member and two or more optical axes, an optical member arranged along each of said two or more optical axes, each said optical member held by a barrel provided along each of said two or more optical axes, wherein each of said barrels includes one or more lens barrel units each having one or more lens assemblies designed so as to be inclinable and translatable with respect to the optical axis, wherein at least one of said barrels is provided with at least one adjustment apparatus capable of inclining and translating said at least one barrel with respect to the optical axis passing therethrough, the method comprising the steps of:
 a) adjusting the relationship between the optical axis of each barrel via said adjustment apparatus;
 b) adjusting the positions of each of said barrels with respect the optical axis passing therethrough;
 c) positioning each said lens barrel unit relative to the optical axis passing therethrough; and
 d) positioning said lens assemblies relative to the optical axis passing therethrough.

35. A projection exposure apparatus according to claim 33, said projection optical system further including:
 a) a first imaging optical system that forms an intermediate image of said first surface;
 b) a second imaging optical system that reimages said intermediate image onto said second surface; and
 c) a first folding member arranged in the vicinity of said intermediate image, and a second folding member arranged inside second imaging optical system.

36. A projection exposure apparatus for transferring a pattern on a mask onto a workpiece, comprising:
 a) a catadioptric projection optical system having a refractive optical member, a reflective mirror with curvature, and at least two folding members,
 b) wherein two folding members among said at least two folding members are held by one holding member such that reflecting surfaces of the two folding members are mutually orthogonal.

37. The projection exposure apparatus according to claim 36, wherein said holding member further includes a support member that provides support at a predetermined plane passing through the midpoint of the optical axis between said two folding members held by said holding member, said plane being orthogonal to said optical axis.

38. The projection exposure apparatus according to claim 36, wherein no refractive optical member is arranged in an optical path between said two folding members held by said one holding member.

39. A method for exposing a pattern on a reticle onto a workpiece, comprising the steps of:
 a) illuminating the reticle;
 b) projecting an image of the reticle with the projection exposure apparatus of claim 32, and exposing over an exposure region having one of a slit-shape and arcuate shape, wherein said exposure region does not include the optical axis of said second imaging optical system; and 40. A projection exposure apparatus for transferring a pattern on a mask onto a workpiece, comprising:
 a) a projection optical system having at least one folding member that forms an image of the pattern onto the workpiece; and
 b) a barrel that holds said at least one folding member,
 c) wherein said barrel includes a reflecting member attached at a position outside the optical path from the mask toward the workpiece.

41. A method for assembling a projection exposure apparatus that forms the image of a pattern onto a workpiece and having at least one folding member, a barrel capable of holding the folding member, and a reflecting member, the method comprising the steps of:
 a) attaching the reflecting member to the barrel; and
 b) positioning the folding member with respect to said reflecting member.

42. The projection exposure method according to claim 12, wherein said two folding members among said at least two folding members are spatially separated.

* * * * *